(12) United States Patent
Lamkin et al.

(10) Patent No.: US 10,998,386 B2
(45) Date of Patent: May 4, 2021

(54) DISPLAY-INTEGRATED INFRARED EMITTER AND SENSOR STRUCTURES

(71) Applicant: Lockheed Martin Corporation, Bethesda, MD (US)

(72) Inventors: Mark A. Lamkin, Fort Worth, TX (US); Kyle M. Ringgenberg, Fort Worth, TX (US); Jordan D. Lamkin, Fort Worth, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 9 days.

(21) Appl. No.: 16/666,707

(22) Filed: Oct. 29, 2019

(65) Prior Publication Data
US 2020/0066810 A1 Feb. 27, 2020

Related U.S. Application Data

(62) Division of application No. 15/808,368, filed on Nov. 9, 2017, now Pat. No. 10,510,812.

(51) Int. Cl.
*H01L 27/32* (2006.01)
*H01L 51/56* (2006.01)
(Continued)

(52) U.S. Cl.
CPC .... *H01L 27/3227* (2013.01); *H01L 27/14603* (2013.01); *H01L 27/14649* (2013.01);
(Continued)

(58) Field of Classification Search
CPC .......... H01L 27/3227; H01L 27/14649; H01L 27/3234; H01L 51/0018; H01L 31/12;
(Continued)

(56) References Cited

U.S. PATENT DOCUMENTS 5,731,899 A 3/1998 Meyers
6,317,175 B1 11/2001 Salerno et al.
(Continued)

FOREIGN PATENT DOCUMENTS

CN 105093532 11/2015
CN 106309089 1/2017
(Continued)

OTHER PUBLICATIONS

U.S. Appl. No. 15/890,711, filed Feb. 7, 2018, Mark A. Lamkin.
(Continued)

*Primary Examiner* — Yasser A Abdelaziez
(74) *Attorney, Agent, or Firm* — Baker Botts L.L.P.

(57) ABSTRACT

In one embodiment, an electronic display includes a first plurality of hexagon-shaped pixels and a second plurality of hexagon-shaped pixels that are coplanar with the first plurality of hexagon-shaped pixels. The first plurality of hexagon-shaped pixels each include an infrared (IR) emitter subpixel that is operable to emit IR light. The second plurality of hexagon-shaped pixels each include an IR detector subpixel that is operable to detect IR light. Each IR emitter subpixel and each IR detector subpixel includes an anode layer and a cathode layer. Each particular IR emitter subpixel includes an IR emissive layer located between the anode layer and the cathode layer of the particular IR emitter subpixel. Each particular IR detector subpixel includes an IR detector layer located between the anode layer and the cathode layer of the particular IR detector subpixel.

15 Claims, 40 Drawing Sheets

(51) Int. Cl.
*H01L 51/52* (2006.01)
*H01L 51/00* (2006.01)
*H01L 51/50* (2006.01)
*H01L 27/146* (2006.01)
*H01L 27/15* (2006.01)
*H01L 31/12* (2006.01)
*H01L 31/0352* (2006.01)
*H01L 33/06* (2010.01)

(52) U.S. Cl.
CPC .. *H01L 27/14667* (2013.01); *H01L 27/14669* (2013.01); *H01L 27/156* (2013.01); *H01L 27/3209* (2013.01); *H01L 27/3211* (2013.01); *H01L 27/3234* (2013.01); *H01L 31/035218* (2013.01); *H01L 31/12* (2013.01); *H01L 51/0018* (2013.01); *H01L 51/0023* (2013.01); *H01L 51/502* (2013.01); *H01L 51/5209* (2013.01); *H01L 51/5225* (2013.01); *H01L 51/56* (2013.01); *H01L 27/14621* (2013.01); *H01L 27/14627* (2013.01); *H01L 27/14636* (2013.01); *H01L 27/14683* (2013.01); *H01L 33/06* (2013.01)

(58) Field of Classification Search
CPC ....... H01L 31/035218; H01L 27/14667; H01L 27/14603; H01L 27/14669; H01L 27/156; H01L 27/3211; H01L 27/3209; H01L 51/56; H01L 51/502; H01L 27/14683; H01L 27/14621; H01L 33/06; H01L 27/14636; H01L 51/5209; H01L 51/5225; H01L 51/0023

See application file for complete search history.

(56) References Cited

U.S. PATENT DOCUMENTS

| | | |
|---|---|---|
| 6,724,012 B2 | 4/2004 | Kimura |
| 6,909,233 B2 | 6/2005 | Cok et al. |
| 7,015,639 B2 | 3/2006 | Stagamat et al. |
| 7,075,501 B1 | 7/2006 | Spitzer et al. |
| 7,387,913 B2 | 6/2008 | Yoshimura et al. |
| 7,453,129 B2 * | 11/2008 | King ................ H01L 27/14634 257/414 |
| 7,468,312 B2 | 12/2008 | Tanaka |
| 7,476,904 B2 | 1/2009 | Fukunaga |
| 7,542,270 B2 | 6/2009 | Chirieleison, Sr. |
| 7,697,053 B2 | 4/2010 | Kurtz et al. |
| 7,714,923 B2 | 5/2010 | Cok et al. |
| 7,808,540 B2 | 10/2010 | Cok |
| 7,952,059 B2 | 5/2011 | Vitale et al. |
| 8,482,859 B2 | 7/2013 | Border et al. |
| 8,508,830 B1 | 8/2013 | Wang |
| 8,576,276 B2 | 11/2013 | Bar-Zeev et al. |
| 8,605,082 B2 | 12/2013 | Buchheit |
| 8,610,650 B2 | 12/2013 | Somerville |
| 8,749,620 B1 | 6/2014 | Knight |
| 8,823,742 B2 | 9/2014 | Kweon |
| 8,884,845 B2 | 11/2014 | Yamazaki et al. |
| 8,933,862 B2 | 1/2015 | Lapstun |
| 8,964,298 B2 | 2/2015 | Haddick et al. |
| 9,001,427 B2 | 4/2015 | Jacobs et al. |
| 9,049,411 B2 | 6/2015 | Venkataraman et al. |
| 9,135,873 B2 | 9/2015 | Miyatake et al. |
| 9,155,984 B2 | 10/2015 | Fleck et al. |
| 9,158,115 B1 | 10/2015 | Worley et al. |
| 9,177,355 B1 | 11/2015 | Buchheit |
| 9,179,134 B2 | 11/2015 | Ranieri et al. |
| 9,204,397 B2 | 12/2015 | Raffle et al. |
| 9,229,227 B2 | 1/2016 | Border et al. |
| 9,237,263 B2 | 1/2016 | Rime et al. |
| 9,355,314 B2 | 5/2016 | Yang |
| 9,368,546 B2 | 6/2016 | Fleck et al. |
| 9,377,624 B2 | 6/2016 | D'Amico et al. |
| 9,419,031 B1 | 8/2016 | Or-Bach et al. |
| 9,454,008 B2 | 9/2016 | Ziarati et al. |
| 9,465,991 B2 | 10/2016 | Mei et al. |
| 9,497,380 B1 | 11/2016 | Jannard et al. |
| 9,519,144 B2 | 12/2016 | Lanman et al. |
| 9,564,078 B2 | 2/2017 | Ninan |
| 9,581,821 B2 | 2/2017 | McDowall et al. |
| 9,596,456 B2 | 3/2017 | Yang et al. |
| 9,626,936 B2 | 4/2017 | Bell |
| 9,632,315 B2 | 4/2017 | Smith et al. |
| 9,651,784 B2 | 5/2017 | Osterhout |
| 9,671,613 B2 | 6/2017 | Border |
| 9,679,511 B2 | 6/2017 | Gu |
| 9,684,174 B2 | 6/2017 | Fleck et al. |
| 9,706,132 B2 | 7/2017 | Nisenzon et al. |
| 9,734,554 B2 | 8/2017 | Ballard |
| 9,841,537 B2 | 12/2017 | Luebke et al. |
| 9,852,496 B2 | 12/2017 | Marchand et al. |
| 10,129,984 B1 | 11/2018 | Lamkin |
| 10,249,800 B1 | 4/2019 | Lamkin |
| 2001/0000005 A1 | 3/2001 | Forrest et al. |
| 2005/0205958 A1 | 9/2005 | Taniguchi et al. |
| 2005/0206755 A1 | 9/2005 | Yokoyama et al. |
| 2005/0242712 A1 | 11/2005 | Sung |
| 2007/0029941 A1 | 2/2007 | Ito et al. |
| 2007/0109438 A1 | 5/2007 | Duparre et al. |
| 2007/0123133 A1 | 5/2007 | Winters |
| 2007/0286944 A1 | 12/2007 | Yokoyama et al. |
| 2008/0030597 A1 | 2/2008 | Olsen |
| 2008/0218331 A1 | 9/2008 | Baillot |
| 2009/0078872 A1 * | 3/2009 | Korsah ............ H01L 27/14689 250/338.4 |
| 2009/0152530 A1 | 6/2009 | Ahn et al. |
| 2010/0020092 A1 | 1/2010 | Canu et al. |
| 2010/0065862 A1 | 3/2010 | Ray et al. |
| 2011/0018903 A1 | 1/2011 | Lapstun et al. |
| 2011/0080487 A1 | 4/2011 | Venkataraman |
| 2012/0133807 A1 | 5/2012 | Wu |
| 2012/0154920 A1 | 6/2012 | Harrison et al. |
| 2012/0242855 A1 | 9/2012 | Nagasaka et al. |
| 2012/0249797 A1 | 10/2012 | Haddick et al. |
| 2013/0063550 A1 | 3/2013 | Ritchey et al. |
| 2013/0175557 A1 | 7/2013 | Ray |
| 2013/0242262 A1 | 9/2013 | Lewis |
| 2013/0286053 A1 | 10/2013 | Fleck et al. |
| 2013/0341491 A1 | 12/2013 | Hirose et al. |
| 2014/0002675 A1 | 1/2014 | Duparre |
| 2014/0140654 A1 | 5/2014 | Brown et al. |
| 2015/0015467 A1 | 1/2015 | Kaplan et al. |
| 2015/0022643 A1 | 1/2015 | Stetson |
| 2015/0034911 A1 * | 2/2015 | Liu .................. H01L 31/0392 257/40 |
| 2015/0054734 A1 | 2/2015 | Raghoebardajal et al. |
| 2015/0077312 A1 | 3/2015 | Wang |
| 2015/0178939 A1 | 6/2015 | Bradski et al. |
| 2015/0212320 A1 | 7/2015 | Hervy et al. |
| 2015/0235583 A1 | 8/2015 | Schowengerdt et al. |
| 2015/0243092 A1 | 8/2015 | Schowengerdt |
| 2015/0243712 A1 * | 8/2015 | Wang ................ H01L 31/09 257/40 |
| 2015/0277100 A1 | 10/2015 | Novoselov |
| 2015/0301781 A1 | 10/2015 | Ekkaia et al. |
| 2015/0312549 A1 | 10/2015 | Georgiev et al. |
| 2015/0364527 A1 | 12/2015 | Wang et al. |
| 2016/0012643 A1 | 1/2016 | Kezele et al. |
| 2016/0041663 A1 | 2/2016 | Chen et al. |
| 2016/0044263 A1 | 2/2016 | Hashimoto et al. |
| 2016/0064682 A1 | 3/2016 | Yamae et al. |
| 2016/0091737 A1 | 3/2016 | Kim et al. |
| 2016/0103318 A1 | 4/2016 | Du et al. |
| 2016/0189429 A1 | 6/2016 | Mallinson |
| 2016/0196777 A1 | 7/2016 | Liu |
| 2016/0203646 A1 | 7/2016 | Nadler et al. |
| 2016/0203745 A1 | 7/2016 | Park et al. |
| 2016/0252727 A1 | 9/2016 | Mack et al. |
| 2016/0267713 A1 | 9/2016 | Patel |
| 2016/0267851 A1 | 9/2016 | Pirtskhlava et al. |
| 2016/0269720 A1 | 9/2016 | Patel |

(56) References Cited

U.S. PATENT DOCUMENTS

| | | |
|---|---|---|
| 2016/0292850 A1 | 10/2016 | Perez et al. |
| 2016/0307372 A1 | 10/2016 | Pitts et al. |
| 2016/0313558 A1 | 10/2016 | Gutierrez |
| 2016/0315115 A1 | 10/2016 | Izuha et al. |
| 2016/0320620 A1 | 11/2016 | Maimone |
| 2016/0327798 A1 | 11/2016 | Xiao |
| 2016/0337607 A1 | 11/2016 | Okamoto et al. |
| 2016/0359143 A1 | 12/2016 | Osawa |
| 2016/0379573 A1 | 12/2016 | de Greef |
| 2017/0003507 A1 | 1/2017 | Raval et al. |
| 2017/0026622 A1 | 1/2017 | Yoon et al. |
| 2017/0038593 A1 | 2/2017 | Travers |
| 2017/0038607 A1 | 2/2017 | Camara |
| 2017/0039904 A1 | 2/2017 | Jepsen |
| 2017/0039960 A1 | 2/2017 | Jepsen |
| 2017/0052393 A1 | 2/2017 | Kweon |
| 2017/0055825 A1 | 3/2017 | Umlinson |
| 2017/0061696 A1 | 3/2017 | Li et al. |
| 2017/0061698 A1 | 3/2017 | Luebke et al. |
| 2017/0070729 A1 | 3/2017 | Li et al. |
| 2017/0076425 A1 | 3/2017 | Folse |
| 2017/0078652 A1 | 3/2017 | Hua et al. |
| 2017/0084867 A1 | 3/2017 | Lim et al. |
| 2017/0090194 A1 | 3/2017 | Hayes |
| 2017/0090562 A1 | 3/2017 | Gustafsson et al. |
| 2017/0091549 A1 | 3/2017 | Gustafsson et al. |
| 2017/0092232 A1 | 3/2017 | Mullins et al. |
| 2017/0097701 A1 | 4/2017 | Hong |
| 2017/0099479 A1 | 4/2017 | Browd et al. |
| 2017/0104035 A1 | 4/2017 | Lee |
| 2017/0108697 A1 | 4/2017 | El-Ghoroury et al. |
| 2017/0123488 A1 | 5/2017 | Guenter et al. |
| 2017/0123489 A1 | 5/2017 | Guenter |
| 2017/0125506 A1 | 5/2017 | Kim |
| 2017/0132976 A1 | 5/2017 | Yang et al. |
| 2017/0134691 A1 | 5/2017 | Unno |
| 2017/0141169 A1 | 5/2017 | Sim |
| 2017/0153454 A1 | 6/2017 | Callier et al. |
| 2017/0154464 A1 | 6/2017 | Lanier et al. |
| 2017/0154678 A1 | 6/2017 | Nakagawa et al. |
| 2017/0161951 A1 | 6/2017 | Fix et al. |
| 2017/0163977 A1 | 6/2017 | Fleck et al. |
| 2017/0168296 A1 | 6/2017 | Giwnewer et al. |
| 2017/0168302 A1 | 6/2017 | McDowall et al. |
| 2017/0168306 A1 | 6/2017 | Dreyer et al. |
| 2017/0169612 A1 | 6/2017 | Cashen et al. |
| 2017/0170239 A1 | 6/2017 | Lee et al. |
| 2017/0176748 A1 | 6/2017 | Kim |
| 2017/0184839 A1 | 6/2017 | Tigelaar |
| 2017/0184854 A1 | 6/2017 | Takagi et al. |
| 2017/0186370 A1 | 6/2017 | Lee et al. |
| 2017/0186804 A1 | 6/2017 | Takeuchi et al. |
| 2017/0186818 A1* | 6/2017 | Yen ...................... H01L 27/307 |
| 2017/0188006 A1 | 6/2017 | Park et al. |
| 2017/0193687 A1 | 6/2017 | Lo et al. |
| 2017/0192235 A1 | 7/2017 | Petrov |
| 2017/0195658 A1 | 7/2017 | Jung |
| 2017/0200296 A1 | 7/2017 | Jones et al. |
| 2017/0220863 A1 | 8/2017 | Lection et al. |
| 2017/0302913 A1 | 10/2017 | Tonar et al. |
| 2017/0316544 A1 | 11/2017 | Cerny |
| 2017/0340200 A1 | 11/2017 | Bhaha et al. |
| 2018/0067237 A1 | 3/2018 | Vandame et al. |
| 2018/0104106 A1 | 4/2018 | Lee et al. |
| 2018/0125716 A1 | 5/2018 | Cho et al. |
| 2018/0269260 A1 | 9/2018 | Ghosh et al. |
| 2018/0294305 A1 | 10/2018 | Janssens et al. |
| 2018/0295300 A1 | 10/2018 | McCorkle |
| 2018/0295310 A1 | 10/2018 | Zapor |
| 2019/0103444 A1 | 4/2019 | Lamkin |
| 2019/0103518 A1 | 4/2019 | Lamkin |

FOREIGN PATENT DOCUMENTS

| | | |
|---|---|---|
| CN | 107049721 | 8/2017 |
| EP | 0933753 | 8/1999 |
| EP | 2172973 | 4/2010 |
| EP | 2975909 | 2/2016 |
| EP | 2993963 | 3/2016 |
| FR | 2852147 | 9/2004 |
| GB | 2420537 | 2/2005 |
| JP | 2014/0235268 | 12/2014 |
| KR | R 2009 0065182 | 6/2009 |
| KR | 1020 140140861 | 12/2014 |
| WO | WO 2015/100714 | 7/2015 |
| WO | WO 2015/193875 | 12/2015 |
| WO | WO 2016/162606 | 10/2016 |
| WO | WO 2017/005614 | 1/2017 |
| WO | WO 2017/133564 | 8/2017 |
| WO | WO 2018/022523 | 2/2018 |

OTHER PUBLICATIONS

U.S. Appl. No. 15/890,816, filed Feb. 7, 2018, Mark A. Lamkin.
U.S. Appl. No. 15/890,853, filed Feb. 7, 2018, Mark A. Lamkin.
U.S. Appl. No. 15/890,892, filed Feb. 7, 2018, Mark A. Lamkin.
U.S. Appl. No. 15/890,945, filed Feb. 7, 2018, Mark A. Lamkin.
U.S. Appl. No. 15/890,976, filed Feb. 7, 2018, Mark A. Lamkin.
U.S. Appl. No. 16/208,060, filed Dec. 3, 2018, Mark A. Lamkin.
U.S. Appl. No. 16/188,361, filed Nov. 13, 2018, Mark A. Lamkin.
U.S. Appl. No. 16/373,087, filed Apr. 2, 2019, Mark A. Lamkin.
*Near-Eye Light Field Displays*; http://research.nvidia.com/publication/near-eye-light-field-displays-0, Downloaded Feb. 5, 2018.
Fu-Chung Huang et al., *Eyeglasses-free display: towards correcting visual aberrations with computational light field displays*, ACM Transactions on Graphics (TOG), Jul. 2014.
V. F. Pamplona, et al., "Tailored displays to compensate for visual aberrations.", Jul. 2012.
B. Salahieh et al., "Light Field Retargeting from Plenoptic Camera to Integral Display," *Imaging and Applied Optics* 2017 (3D, AIO, COSi, IS, MATH, pcAOP) © OSA 2016.
S-W. Min et al., "3-D Electro-Floating Display System Using an Integral Imaging Method," revised May 12, 2005; accepted May 17, 2005, Jun. 13, 2005/vol. 13, No. 12, *Optics Express* 4358, © 2005 OSA.
X. Xiao et al., Advances in 3-D Integral Imaging: Sensing, Display, and Applications [Invited], XP-001580772, *Applied Optics*, vol. 52, No. 4, Feb. 1, 2013, © 2013 Optical Society of America.
PCT Notification of Transmittal of the Intl. Search Report and the Written Opinion of the Intl. Searching Authority, or the Declaration re PCT/US2018/053388, dated Jan. 18, 2019.
PCT Invitation to Pay Additional Fees and, where Applicable, Protest Fee, PCT Article 17(w)(a) and Rule 40.1 and 40.2e, re PCT/US2018/056826 filed Oct. 22, 2018, dated Feb. 5, 2019.
PCT Notification of Transmittal of the Intl. Search Report and the Written Opinion of the Intl. Searching Authority, or the Declaration re PCT/US2018/053374, dated Jan. 18, 2019.
PCT Invitation to Pay Additional Fees and, where Applicable, Protest Fee re PCT/US2019/014674, dated Apr. 5, 2019.
PCT Notification of Transmittal of the Intl. Search Report and the Written Opinion of the Intl. Searching Authority, or the Declaration re PCT/US2019/014676, dated Apr. 10, 2019.
PCT Notification of Transmittal of the Intl. Search Report and the Written Opinion of the Intl. Searching Authority, or the Declaration re PCT/US2019/014655, dated Apr. 10, 2019.
PCT Notification of Transmittal of the Intl. Search Report and the Written Opinion of the Intl. Searching Authority, or the Declaration re PCT/US2019/014657, dated Apr. 11, 2019.
PCT Notification of Transmittal of the Intl. Search Report and the Written Opinion of the Intl. Searching Authority, or the Declaration re PCT/US2018/056826, dated Apr. 16, 2019.
PCT Notification of Transmittal of the Intl. Search Report and the Written Opinion of the Intl. Searching Authority, or the Declaration re PCT/US2019/015759, dated Apr. 18, 2019.

(56) References Cited

OTHER PUBLICATIONS

PCT Notification of Transmittal of the Intl. Search Report and the Written Opinion of the Intl. Searching Authority, or the Declaration re PCT/US2019/014668, dated May 14, 2019.
Lamkin, U.S. Appl. No. 15/890,945, Non-final Office Action, dated Apr. 2, 2019.
Lamkin, U.S. Appl. No. 15/890,945, Response to Non-final Office Action, dated Jul. 16, 2019.
Lamkin, U.S. Appl. No. 15/724,004, Non-final Office Action, dated Apr. 25, 2018.
Lamkin, U.S. Appl. No. 15/724,004, Response to Non-final Office Action, dated Sep. 24, 2018.
Lamkin, U.S. Appl. No. 15/724,027, Non-final Office Action, dated Dec. 21, 2018.
Lamkin, U.S. Appl. No. 15/724,027, Response to Non-final Office Action, dated Mar. 20, 2019.
Lamkin, U.S. Appl. No. 15/724,027, Non-final Office Action, dated Jun. 26, 2019.

\* cited by examiner

DISPLAY-INTEGRATED INFRARED EMITTER AND SENSOR STRUCTURES

RELATED APPLICATION

This application is a divisional application under 35 U.S.C. § 120 of U.S. application Ser. No. 15/808,368, filed Nov. 9, 2017 and entitled Display Integrated Infrared Emitter and Sensor Structures, the contents of which are incorporated herein by reference in their entirety.

TECHNICAL FIELD

This disclosure relates generally to electronic displays, and more particularly to display-integrated infrared emitter and sensor structures.

BACKGROUND

Pixels are utilized in a variety of electronic displays and sensors. For example, displays used in smartphones, laptop computers, and televisions utilize arrays of pixels to display images. As another example, sensors used in cameras utilize arrays of pixels to capture images. Pixels typically include subpixels of various colors such as red, green, and blue.

SUMMARY OF PARTICULAR EMBODIMENTS

In one embodiment, an electronic display includes a first plurality of hexagon-shaped pixels and a second plurality of hexagon-shaped pixels that are coplanar with the first plurality of hexagon-shaped pixels. The first plurality of hexagon-shaped pixels each include an infrared (IR) emitter subpixel that is operable to emit IR light. The second plurality of hexagon-shaped pixels each include an IR detector subpixel that is operable to detect IR light. Each IR emitter subpixel and each IR detector subpixel includes an anode layer and a cathode layer. Each particular IR emitter subpixel includes an IR emissive layer located between the anode layer and the cathode layer of the particular IR emitter subpixel. Each particular IR detector subpixel includes an IR detector layer located between the anode layer and the cathode layer of the particular IR detector subpixel. At least one of the anode layer and the cathode layer of each particular IR emitter subpixel and each particular IR detector subpixel is transparent to IR light.

In another embodiment, an electronic display includes a plurality of coplanar polygon-shaped pixels that each include an IR subpixel. Each IR subpixel includes an anode layer, a cathode layer, and an IR layer located between the anode layer and the cathode layer of the particular IR subpixel. The IR layer may be an IR detector layer or an IR emissive layer.

In another embodiment, a method of manufacturing an IR subpixel for an electronic display includes creating a insulating layer by depositing a layer of insulating material and then patterning the layer of insulating material using lithography. The method further includes creating a cathode layer of the IR subpixel by depositing a layer of conductive material on the patterned insulating layer and then patterning the cathode layer using lithography, wherein patterning the cathode layer comprises forming a portion of the cathode layer into a polygon shape. The method further includes creating an IR layer of the IR subpixel by depositing a layer of IR emissive or IR detecting material on the patterned cathode layer and then patterning the IR layer using lithography, wherein patterning the IR layer comprises forming a portion of the IR layer into the polygon shape. The method further includes creating an anode layer of the IR subpixel by depositing a layer of anode material on the patterned IR layer and then patterning the anode layer using lithography, wherein patterning the anode layer comprises forming a portion of the anode layer into the polygon shape.

The present disclosure presents several technical advantages. In some embodiments, subpixels (e.g., red, green, blue, IR, etc.) are vertically stacked on top of one another to create either display or sensor pixels. By vertically stacking the subpixel components, certain embodiments remove the need for color filters and polarizers which are typically required in pixel technologies such as liquid crystal displays (LCD) and organic light-emitting diode (OLED). This results in smaller pixel areas and greater pixel densities for higher resolutions than typical displays. Some embodiments utilize electroluminescent quantum dot technology that provides more efficient use of power and significantly higher contrast ratios than technologies such as LCD can offer. Additionally, because each subpixel may be made emissive directly by voltage, faster response times are possible than with technologies such as LCD. Embodiments that utilize quantum dots that are finely tuned to emit a very narrow band of color provide purer hues and improved color gamut over existing technologies such as OLED and LCD. Thin film design of certain embodiments results in substantial weight and bulk reduction. These and other advantages result in a low-cost, power efficient electronic display/sensor solution capable of high dynamic range output with a small enough pixel pitch to meet the needs of extremely high-resolution applications. Furthermore, embodiments that include IR subpixels provide the capability for electronic displays to emit and detect IR light, which may enable the displays to provide functionality such as eye-tracking and eye gaze analysis.

Other technical advantages will be readily apparent to one skilled in the art from FIGS. 1 through 42B, their descriptions, and the claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION OF EXAMPLE EMBODIMENTS

Pixels are utilized in a variety of electronic displays and sensors. For example, displays used in smartphones, laptop computers, and televisions utilize arrays of pixels to display images. As another example, sensors used in cameras utilize arrays of pixels to capture images. Pixels may in some instances include subpixels of various colors. For example, some pixels may include red, blue, and green subpixels. Subpixels are typically co-planar and adjacent to each other within a pixel. Having co-planar subpixels may be problematic in some applications, however, due to physical size requirements. For example, some electronic displays require an extremely small pixel pitch (i.e., the distance between each pixel) to provide enough resolution for visual acuity. Doing so while emitting a high dynamic range of light is problematic given the lower light output due to physical size reduction of the pixels themselves and the circuitry normally surrounding them.

To address these and other problems with existing pixel designs, embodiments of the disclosure provide pixels with vertically stacked subpixels that reduce the physical space required for each pixel. For example, some embodiments include three transparent overlapping red, green, and blue subpixels that are vertically stacked on top of one another. The pixels of some embodiments may additionally or alternatively include an infrared (IR) subpixel that either detects or emits IR light. For example, some embodiments of electronic displays may include IR detecting and IR emitting subpixels in various patterns throughout an array of pixels in order to emit and detect IR light. By vertically stacking the subpixels instead of locating them within the same plane, a higher number of pixels can be fit into a display or sensor area, thus providing the high pixel densities required by certain applications.

Figure 1:
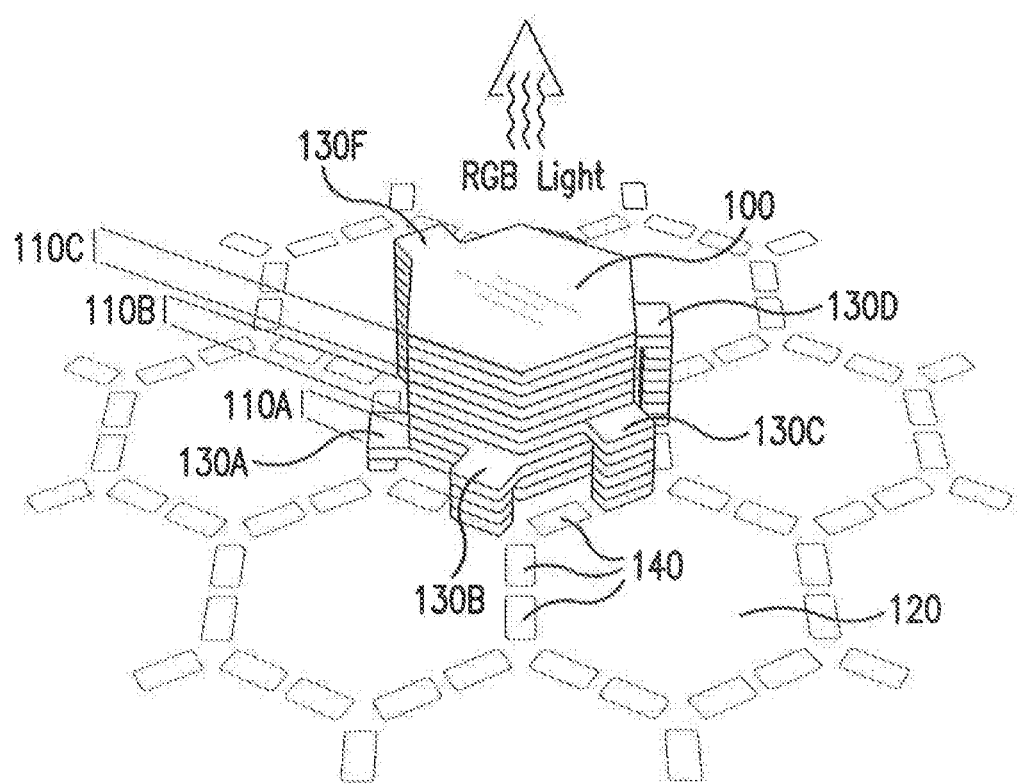
FIG. 1 illustrates a single display pixel with vertically stacked subpixels, according to certain embodiments.
Figure 2:
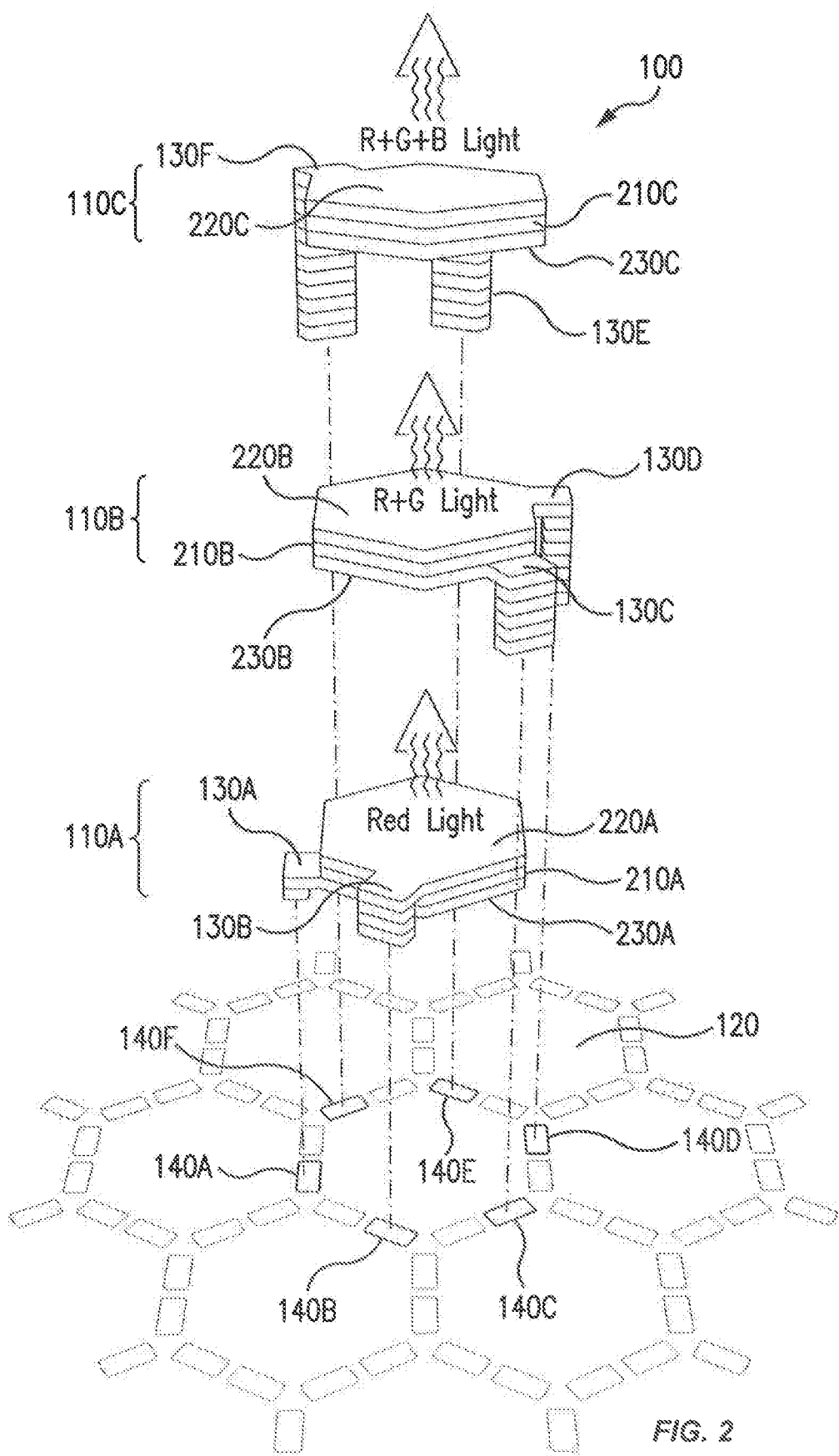
FIGS. 2-3 illustrate exploded views of the display pixel of FIG. 1, according to certain embodiments.
Figure 3:
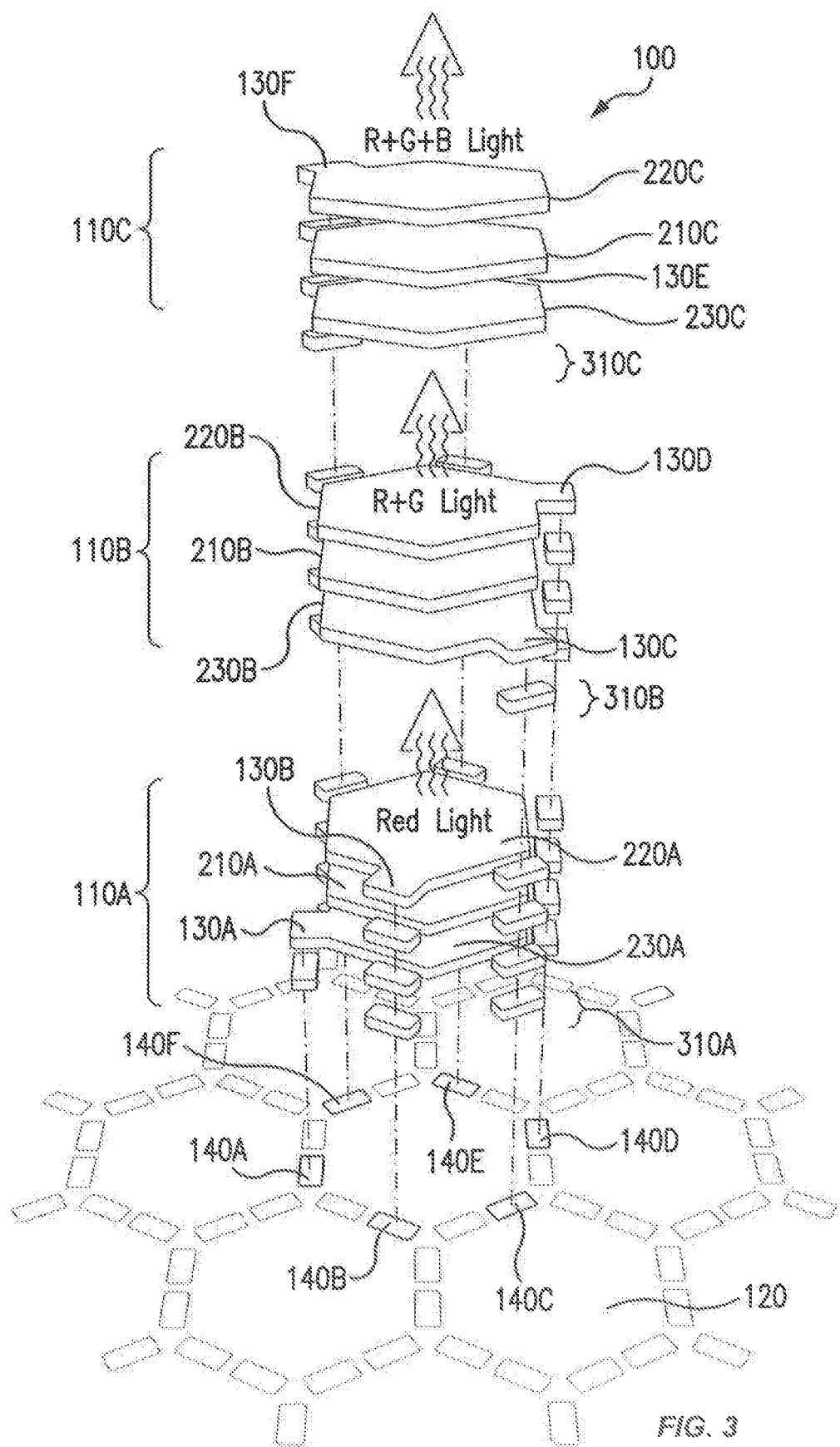
Figure 5:
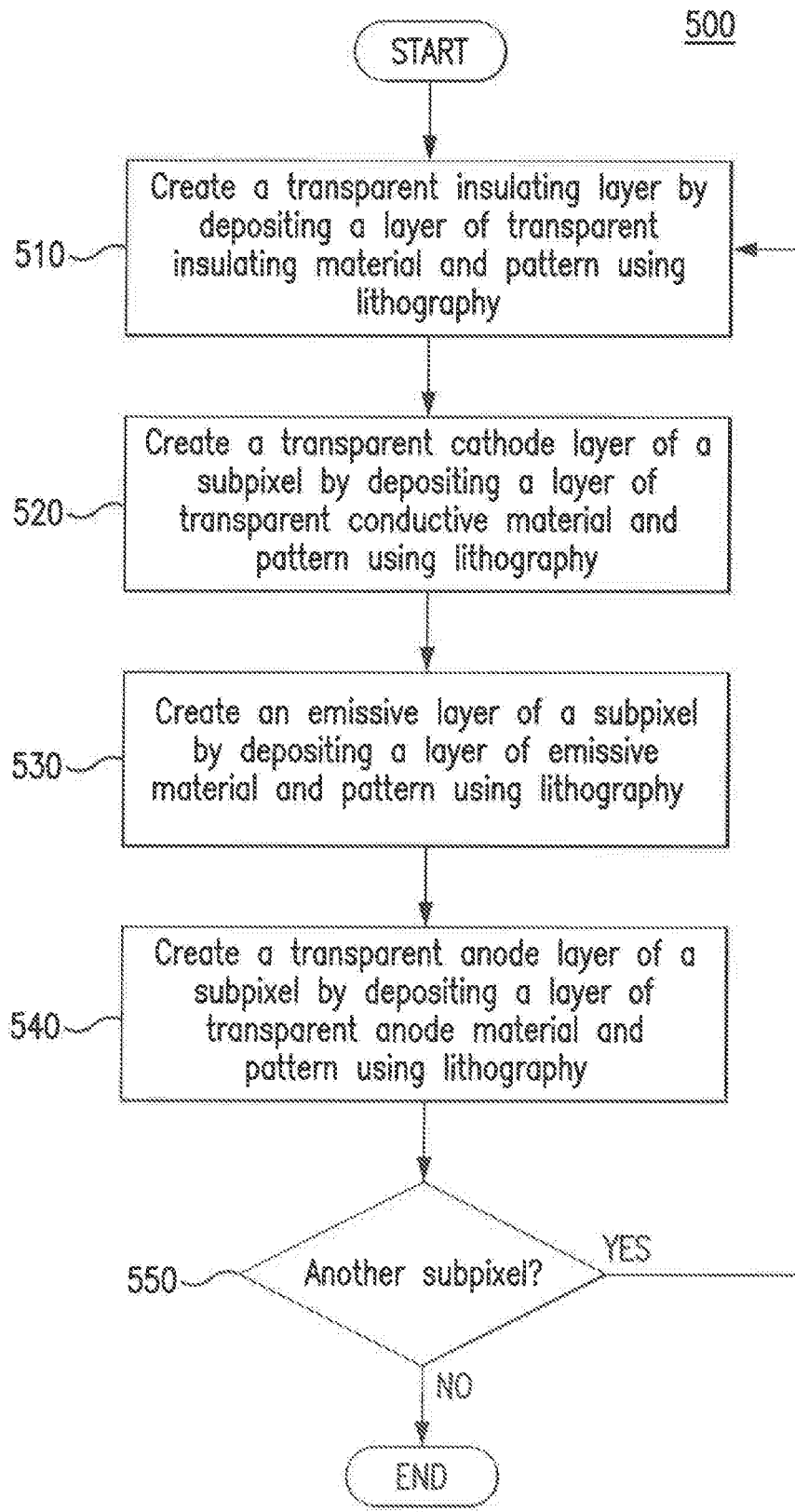
FIG. 5 is a method of manufacturing a display pixel with stacked subpixels, according to certain embodiments.

In embodiments that emit light (e.g., pixels for electronic displays), light emitted from the vertically stacked subpixels is additively combined to create the full color representation. This is in contrast to existing technologies that utilize subtraction with filters and polarization to create various colors of light. In some embodiments, each individual subpixel structure includes a transparent front emissive plane and a transparent back circuitry plane. The front plane may include transparent conductive film electrodes, charge injection layers, and a tuned color-specific electroluminescent quantum dot layer. Driving circuitry for each subpixel is accomplished by a back plane of layered transparent transistor/capacitor arrays to handle voltage switching and storage for each subpixel. Example embodiments of display pixels are illustrated in FIGS. 1-3, and a method of manufacturing display pixels is illustrated in FIG. 5.

Figure 18:
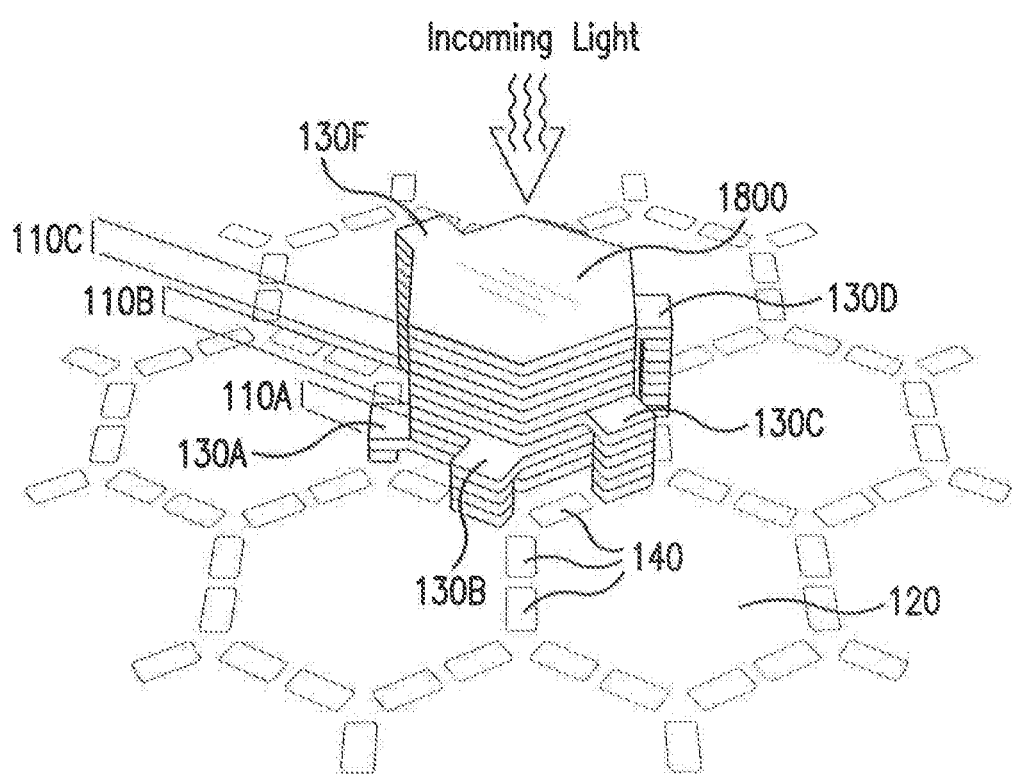
FIG. 18 illustrates a single sensor pixel with vertically stacked subpixels, according to certain embodiments.
Figure 19:
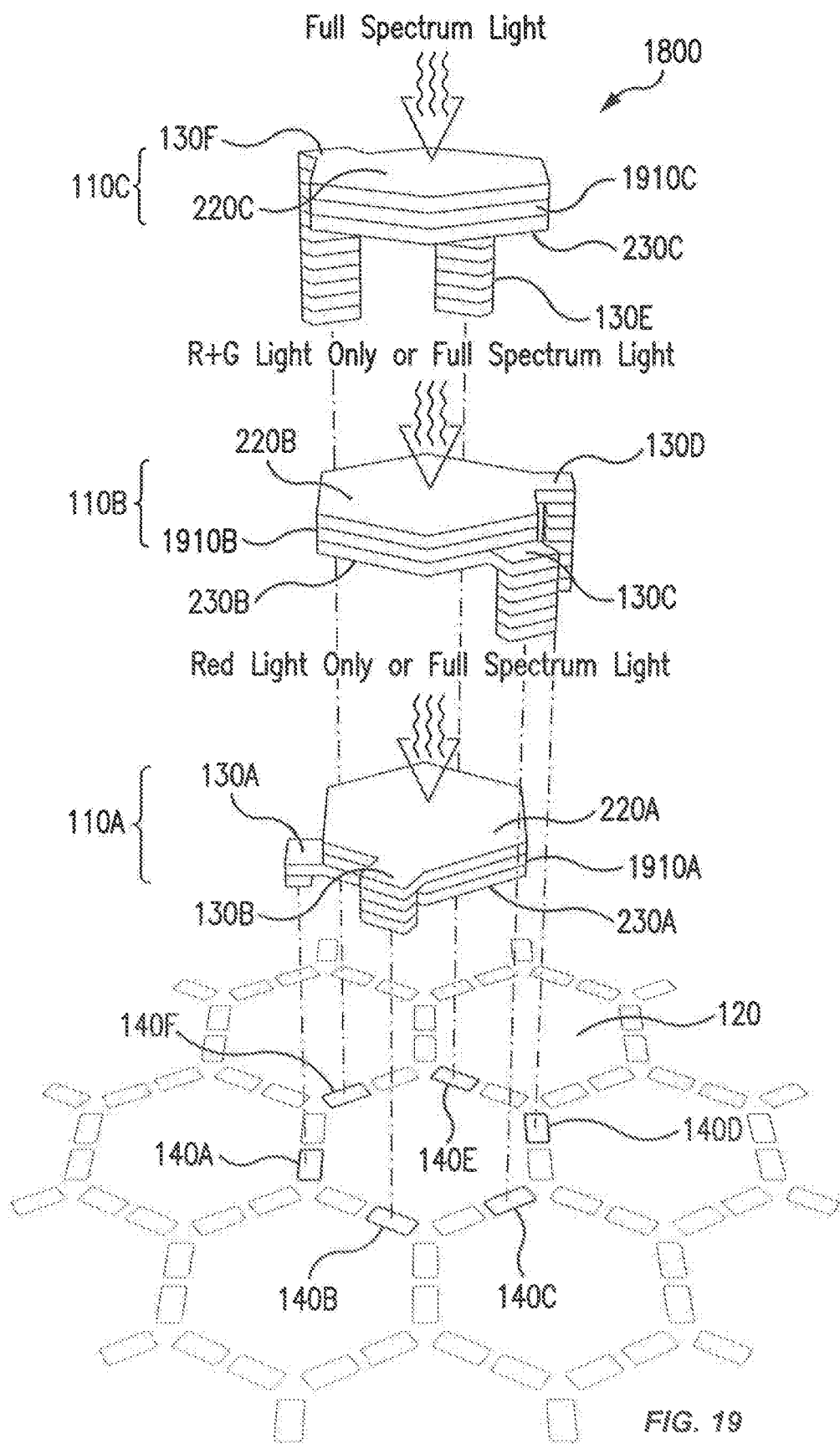
FIGS. 19-20 illustrate exploded views of the sensor pixel of FIG. 18, according to certain embodiments.
Figure 20:
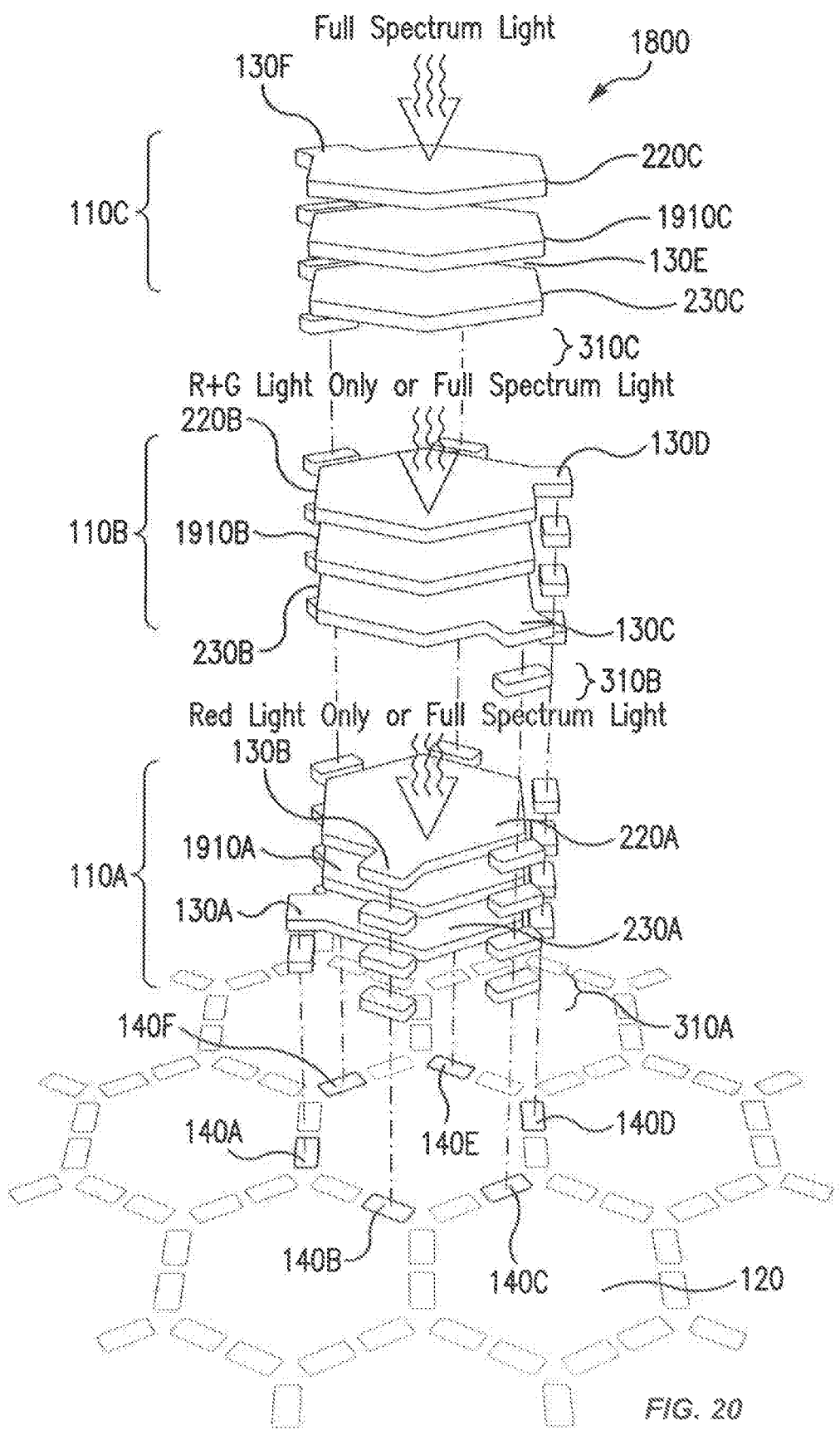
Figure 21:
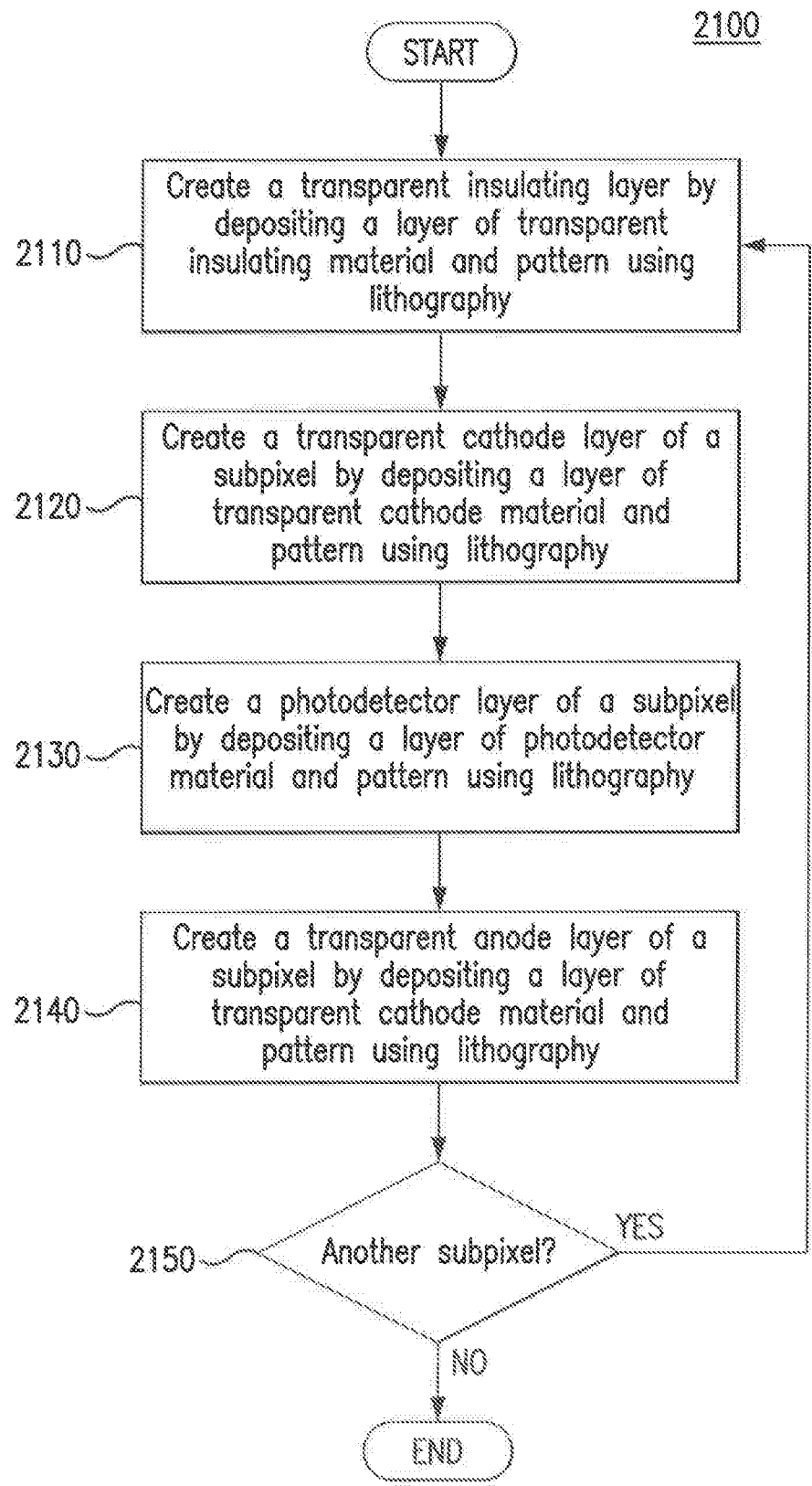
FIG. 21 is a method of manufacturing a sensor pixel with stacked subpixels, according to certain embodiments.

In embodiments that sense light (e.g., pixels for sensor arrays), light entering the vertically stacked subpixels passes through to subsequent layers, with narrow bands of light captured by each subpixel layer for accurate color imaging. In some embodiments, each individual subpixel structure is an assembly of transparent layers of tuned color-specific photoelectric quantum dot films, conductive films, and semiconductor films that are patterned to create a phototransistor array. Readout from this array carries voltage from specific pixels only in response to the amount of color present in the light entering a given subpixel layer. Since each layer is tuned to detect only a particular band of light, photoelectric voltage is produced according to the percentage of that band contained within the wavelength of the incoming light. Example embodiments of sensor pixels are illustrated in FIGS. 18-20, and a method of manufacturing sensor pixels is illustrated in FIG. 21.

Figure 34:
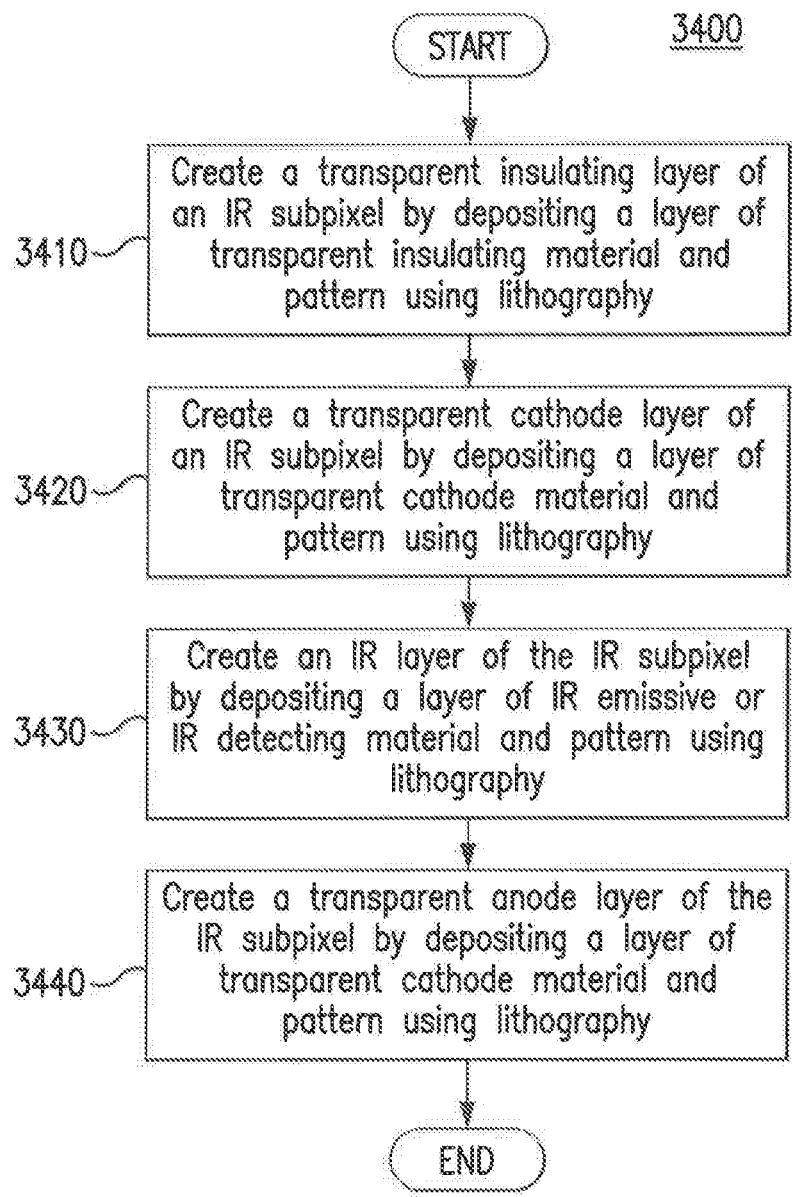
FIG. 34 is a method of manufacturing an IR subpixel, according to certain embodiments.

In some embodiments, IR subpixels are included in some or all pixel stacks of an array of pixels of an electronic display in order to emit and detect IR light. In one example, an electronic display may include a repeating pattern of IR detector and emitter subpixels that includes an IR emitter subpixel at a center pixel location and IR detector subpixels at all surrounding pixel locations around the IR emitter subpixel. As another example, an electronic display may include a repeating pattern of IR detector and emitter subpixels that includes an IR detector subpixel at a center pixel location and IR emitter subpixels at all surrounding pixel locations around the IR emitter subpixel. In some embodiments, IR subpixels may be included above or below other visible-color subpixels (e.g., above or below the RGB display pixels illustrated in FIGS. 1-3), or may be inserted in place of another subpixel (e.g., in place of one of the RBG subpixels of the display pixels illustrated in FIGS. 1-3). Example embodiments of IR subpixels are illustrated in FIGS. 22-33, and methods of manufacturing IR subpixels are illustrated in FIG. 34.

To facilitate a better understanding of the present disclosure, the following examples of certain embodiments are given. The following examples are not to be read to limit or define the scope of the disclosure. Embodiments of the present disclosure and its advantages are best understood by referring to FIGS. 1-42B, where like numbers are used to indicate like and corresponding parts.

Figure 4:
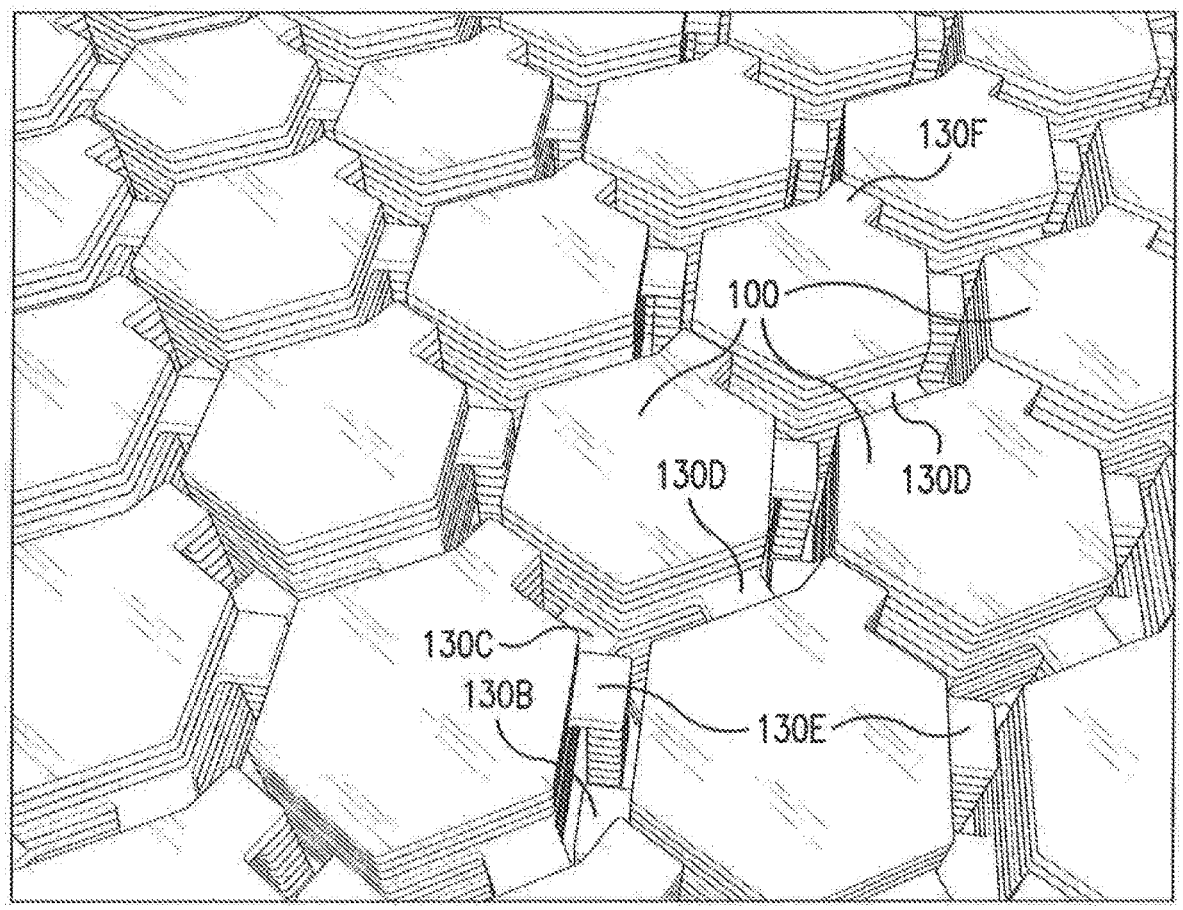
FIG. 4 illustrates an array of pixels with stacked subpixels, according to certain embodiments.

FIGS. 1-4 illustrate various views of a single display pixel 100 with vertically stacked subpixels 110. FIG. 1 illustrates an assembled pixel 100, FIGS. 2-3 illustrate different exploded views of pixel 100, and FIG. 4 illustrates an array of pixels 100. In general, these figures depict the conductive portions of the illustrated layers. Other insulating areas (e.g., outside and between the subpixel stacks) have been removed for sake of visual clarity.

Display pixel 100 may be utilized in any electronic display such as a display of a smartphone, laptop computer, television, a near-eye display (e.g., a head-mounted display), a heads-up display (HUD), and the like. In general, pixel 100 includes multiple subpixels 110 that are vertically stacked on one another. For example, some embodiments of pixel 100 may include three subpixels 110: first subpixel 110A formed on a substrate (e.g., backplane driving circuitry), second subpixel 110B that is stacked on top of first subpixel 110A, and third subpixel 110C that is stacked on top of second subpixel 110B. In a particular embodiment, first subpixel 110A is a red subpixel (i.e., first subpixel 110A emits red light), second subpixel 110B is a green subpixel (i.e., second subpixel 110B emits green light), and third subpixel 110C is a blue subpixel (i.e., third subpixel 110C emits blue light). However, other embodiments may include any other order of red, green, and blue subpixels 110 (e.g., RBG, GRB, GBR, BRG, or BGR). Furthermore, some embodiments may include more or fewer numbers of subpixels 110 than what is illustrated in FIGS. 1-4 and may include any other appropriate colors of subpixels (e.g., yellow, amber, violet, etc.) or non-visible wavelengths (e.g., IR emitter subpixel 2210 or IR detector subpixel 2610).

In some embodiments, pixel 100 is coupled to backplane circuitry 120 which may be formed on a substrate or backplane. In some embodiments, circuitry 120 includes layered transparent transistor/capacitor arrays to handle voltage switching and storage for each subpixel 110. Various layers of each subpixel 110 (e.g., anode layers 220 and cathode layers 230 as described below) may be electrically coupled to circuitry 120 via connector columns 130 and connection pads 140. For example, first subpixel 110A may be coupled to circuitry 120 via connector columns 130A and 130B and connection pads 140A and 140B, second subpixel 110B may be coupled to circuitry 120 via connector columns 130C and 130D and connection pads 140C and 140D, and third subpixel 110C may be coupled to circuitry 120 via connector columns 130E and 130F and connection pads 140E and 140F, as illustrated. As a result, each subpixel 110 may be individually addressed and controlled by circuitry 120.

As illustrated in detail in FIGS. 2-3, each subpixel 110 may include at least three layers: an emissive layer 210, an anode layer 220, and a cathode layer 230. For example, subpixel 110A may include at least a cathode layer 230A, an emissive layer 210A on top of cathode layer 230A, and an anode layer 220A on top of emissive layer 210A. Likewise, subpixel 110B may include at least a cathode layer 230B, an emissive layer 210B on top of cathode layer 230B, and an anode layer 220B on top of emissive layer 210B. Similarly, subpixel 110C may include at least a cathode layer 230C, an emissive layer 210C on top of cathode layer 230C, and an anode layer 220C on top of emissive layer 210C. In other embodiments, subpixels 110 may include additional layers that are not illustrated in FIGS. 2-3. For example, some embodiments of subpixels 110 may include additional insulating layers 310 that are not specifically illustrated. As a specific example, some embodiments of emissive layers 210 may include multiple sub-layers of OLED emission architectures or electroluminescent quantum dot architectures.

Anode layers 220 and cathode layers 230 are formed, respectively, from any appropriate anode or cathode material. For example, anode layers 220 and cathode layers 230 may include simple conductive polymers (or similar materials) used as transparent electrodes. In general, anode layers 220 and cathode layers 230 are transparent so that light may pass from emissive layers 210 and combine with light from subsequent subpixels 110.

Emissive layers 210 generally are formed from any appropriate material capable of emitting light while supporting transparency. In some embodiments, emissive layers 210 may include both electroluminescent capabilities (e.g., a diode converting electric current into light) and photoluminescent capabilities (for down-converting incoming higher-energy light to lower-energy wavelengths). For example, emissive layers 210 may be tuned color-specific electroluminescent quantum dot (QD) layers such as quantum-dot-based light-emitting diode (QLED) layers. In some embodiments, emissive layers 210 may be organic light-emitting diode (OLED) layers. In general, emissive layers 210 may be precisely tuned for narrow band emission of specific wavelengths of light (e.g., red, green, and blue). By using electroluminescent QD emissive layers 210, certain embodiments provide 1) more efficient use of power than other methods such as liquid crystal displays (LCD), and 2) significantly higher contrast ratios than other technologies such as LCD can offer. And because each subpixel 110 is made emissive directly by voltage, faster response times are possible than with technologies such as LCD. Furthermore, implementing quantum dots which are finely tuned to emit a very narrow band of color provides purer hues and improved color gamut over both OLED and LCD technologies.

In some embodiments, pixels 100 and subpixels 110 have an overall shape of a polygon when viewed from above. For example, pixels 100 and subpixels 110 may be hexagon-shaped, octagon-shaped, or the shape of any other polygon such as a triangle or quadrangle. To achieve the desired shape, each layer of subpixel 110 may be formed in the desired shape. For example, each of anode layer 220, emissive layer 210, and cathode layer 230 may be formed in the shape of the desired polygon. As a result, each side of pixel 100 may be adjacent to a side of another pixel 100 as illustrated in FIG. 4. For example, if pixel 100 is in the shape of a hexagon, each pixel 100 in an array of pixels such as array 400 is adjacent to six other pixels 100. Furthermore, each side of each individual pixel 100 is adjacent to a side of a respective one of the six other hexagon-shaped pixels 100. In this way, the emissive area of the overall display surface is maximized since only very narrow non-conductive boundaries are patterned between each pixel. This diminishes the percentage of non-emissive "dark" areas within array 400.

Embodiments of pixels 100 include multiple connector columns 130 that electrically connect the various layers of subpixels 110 to circuitry 120 via connection pads 140. For example, in some embodiments, pixel 100 includes six connector columns 130: connector column 130A that couples cathode layer 230A of subpixel 110A to circuitry 120, connector column 130B that couples anode layer 220A of subpixel 110A to circuitry 120, connector column 130C that couples cathode layer 230B of subpixel 110B to circuitry 120, connector column 130D that couples anode layer 220B of subpixel 110B to circuitry 120, connector column 130E that couples cathode layer 230C of subpixel 110C to circuitry 120, and connector column 130F that couples anode layer 220C of subpixel 110C to circuitry 120.

In general, connector columns 130 are connected only to a single layer of pixel 100 (i.e., a single anode layer 220 or cathode layer 230), thereby permitting circuitry 120 to uniquely address each anode layer 220 and cathode layer 230 of pixel 100. For example, connector column 130F is coupled only to anode layer 220C of subpixel 110C, as illustrated. Connector columns 130 are built up with one or more connector column portions 135, as illustrated in FIGS. 6A-16B. Each connector column portion 135 is an island of material that is electrically isolated from the layer on which it is formed, but permits an electrical connection between the various layers of connector column 130. Connector column portions 135 are formed from any appropriate conductive material, and are not necessarily formed from the same material of the layer on which it is located (e.g., if it is on an emissive layer, it is not formed from emissive material). Connector columns 130 are generally adjacent to a single side of pixel 100 and may occupy less than half of the length of a single side of pixel 100 in order to allow enough space for a connector column 130 of an adjacent pixel 100. For example, as illustrated in FIG. 4, connector column 130E of pixel 100A occupies one side of pixel 100 but leaves enough space for connector column 130B of pixel 100B. In addition, the connector columns 130 of a particular pixel 100 all have unique heights, in some embodiments. In the illustrated embodiment, for example, connector column 130F is the full height of pixel 100, while connector column 130B is only as tall as subpixel 110A. That is, the height of a particular connector column 130 may depend on the path of the particular connector column 130 to its connection pad 140. Connector columns 130 may be any appropriate size or shape. For example, connector columns 130 may be in the shape of a square, rectangle, circle, triangle, trapezoid, or any other appropriate shape.

Embodiments of pixel 100 may have one or more insulating layers 310, as illustrated in FIGS. 2-3. For example, some embodiments of pixel 100 may include a first insulating layer 310A between cathode layer 230A of subpixel 110A and circuitry 120, a second insulating layer 310B between cathode layer 230B of subpixel 110B and anode layer 220A of subpixel 110A, and a third insulating layer 310C between cathode layer 230C of subpixel 110C and anode layer 220B of subpixel 110B. Insulating layers 310 may be any appropriate material that electrically isolates adjacent layers of pixel 100.

FIG. 5 illustrates a method 500 of manufacturing a display pixel with stacked subpixels. For example, method 500 may be used to manufacture pixel 100 having stacked subpixels 110, as described above. Method 500, in general, utilizes steps 510-540 to create layers of a subpixel using lithography. The various layers created by these steps and the photomasks that may be utilized to create the various layers are illustrated in FIGS. 6A-17B, wherein the insulating material has been removed from the layers to allow a better view of the structure of conductive elements. As described in more detail below, steps 510-540 may be repeated one or more times to create stacked subpixels such as subpixels 110 of pixel 100. For example, steps 510-540 may be performed a total of three times to create stacked subpixels 110A-110C, as described above.

Figure 6A:
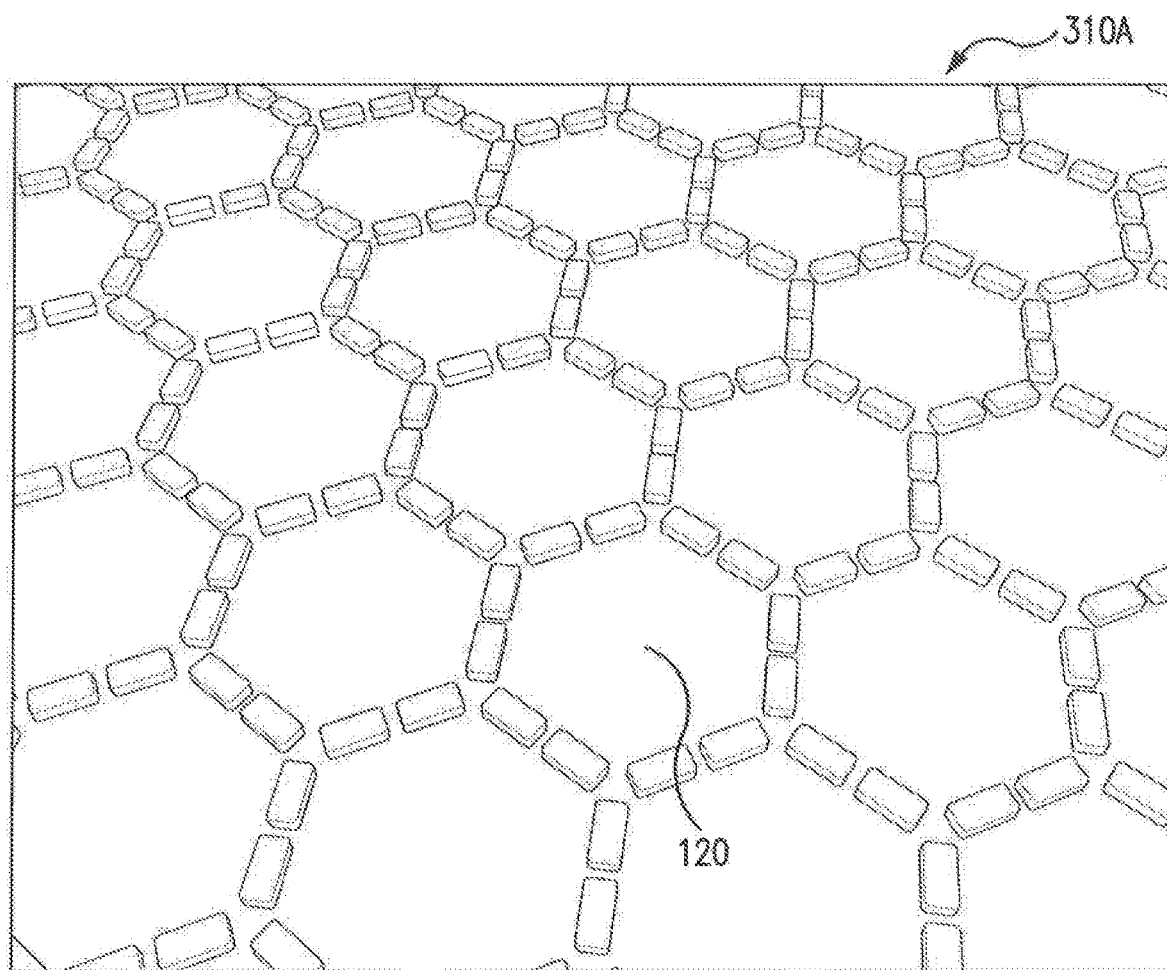
FIG. 6A illustrates a first insulating layer of the pixel of FIG. 1, according to certain embodiments.
Figure 6B:
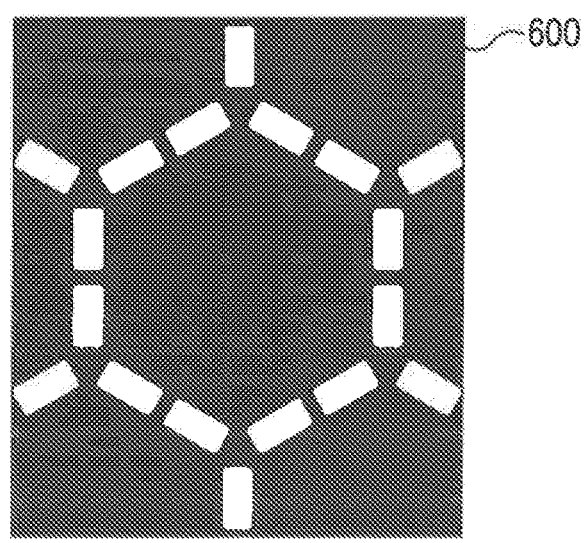
FIG. 6B illustrates a portion of a photomask used to manufacture the first insulating layer of FIG. 6A, according to certain embodiments.

Method 500 may begin in step 510 where a transparent insulating layer is created by depositing a layer of transparent insulating material and then patterning the layer of transparent insulating material using lithography. In some embodiments, the transparent insulating layer is insulating layer 310A, which is illustrated in FIG. 6A. In some embodiments, the layer of transparent insulating material is deposited on a substrate or backplane that includes circuitry 120, as described above. In some embodiments, the layer of transparent insulating material is patterned into the transparent insulating layer using photolithography. A portion of a photomask 600 that may be utilized by this step to pattern the layer of transparent insulating material into the transparent insulating layer is illustrated in FIG. 6B.

Figure 7A:
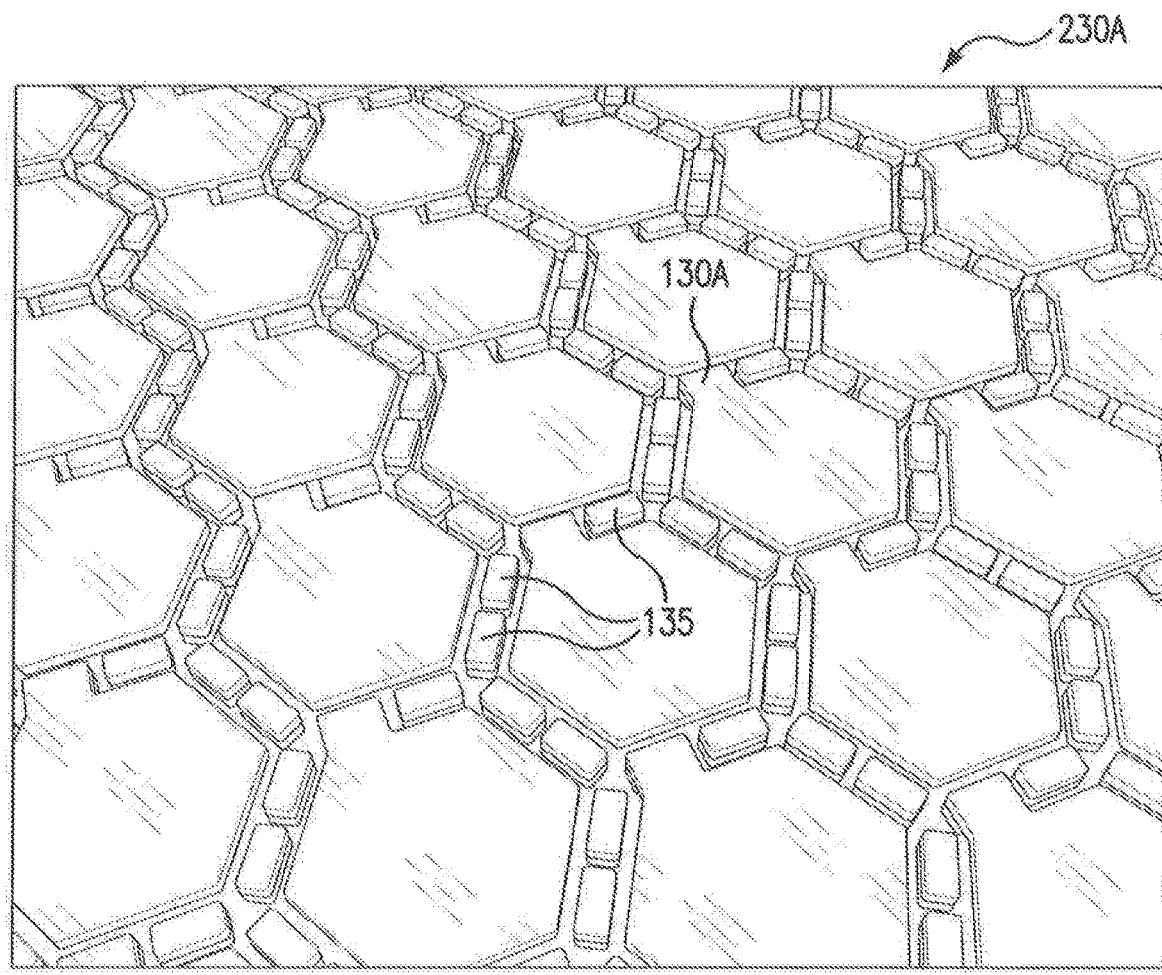
FIG. 7A illustrates a cathode layer of the first subpixel of FIG. 1, according to certain embodiments.
Figure 7B:
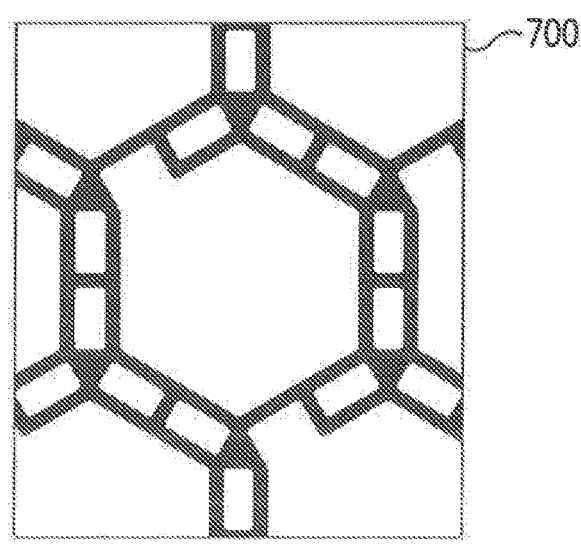
FIG. 7B illustrates a portion of a photomask used to manufacture the cathode layer of FIG. 7A, according to certain embodiments.

At step 520, a transparent cathode layer of a subpixel is created by depositing a layer of transparent conductive material on the patterned transparent insulating layer of step 510 and then patterning the transparent cathode layer using lithography such as photolithography. In some embodiments, the transparent cathode layer is cathode layer 230A, which is illustrated in FIG. 7A. A portion of a photomask 700 that may be utilized by this step to pattern the layer of transparent conductive material into the transparent cathode layer is illustrated in FIG. 7B. In some embodiments, patterning the transparent cathode layer includes forming a portion of the transparent cathode layer into a polygon shape, such as a hexagon or an octagon. For example, as illustrated in FIG. 7B, the transparent cathode layer of a single subpixel may have an overall shape of a hexagon when viewed from above and may include a portion of a connector column 130 (e.g., in the shape of a rectangle or a square) coupled to one side of the hexagon shape.

Figure 8A:
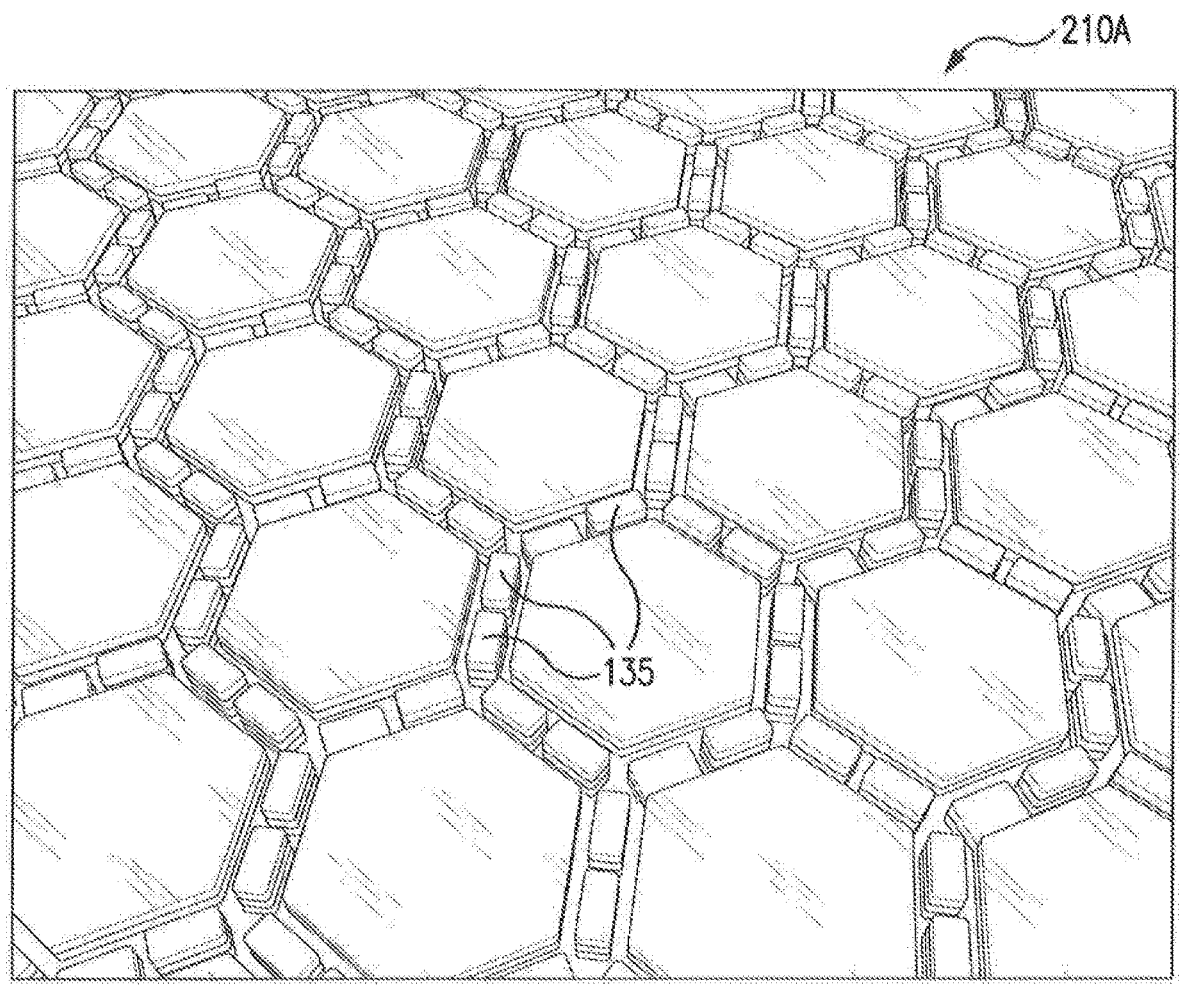
FIG. 8A illustrates an emissive layer of the first subpixel of FIG. 1, according to certain embodiments.
Figure 8B:
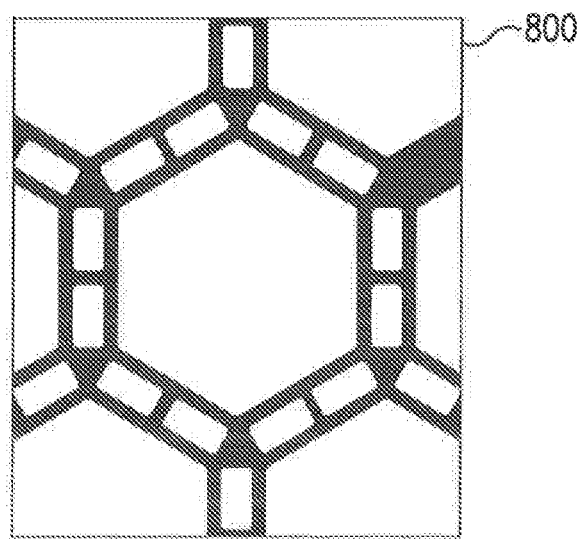
FIG. 8B illustrates a portion of a photomask used to manufacture the emissive layer of FIG. 8A, according to certain embodiments.

At step 530, an emissive layer of a subpixel is created by depositing a layer of emissive material on the patterned transparent cathode layer of step 520 and then patterning the emissive layer using lithography such as photolithography. In some embodiments, the emissive layer is emissive layer 210A, which is illustrated in FIG. 8A. A portion of a photomask 800 that may be utilized by this step to pattern the layer of emissive material into the emissive layer is illustrated in FIG. 8B. In some embodiments, patterning the emissive layer includes forming a portion of the emissive layer into a polygon shape, such as a hexagon or an octagon. For example, as illustrated in FIG. 8B, the emissive layer of a single subpixel may have an overall shape of a hexagon when viewed from above. Unlike the transparent cathode layer of step 520, the sides of the hexagon shape of the emissive layer of this step may be devoid of any portions of connector columns 130.

In some embodiments, the color output of the emissive layers of step 530 are precisely tuned for narrow band emission, resulting in extremely accurate color representation. In some embodiments, high contrast ratios are achievable due to the lack of additional polarizers or filtering necessary to govern the light output of each subpixel. This results in high dynamic range image reproduction with minimal required driving voltage.

Figure 9A:
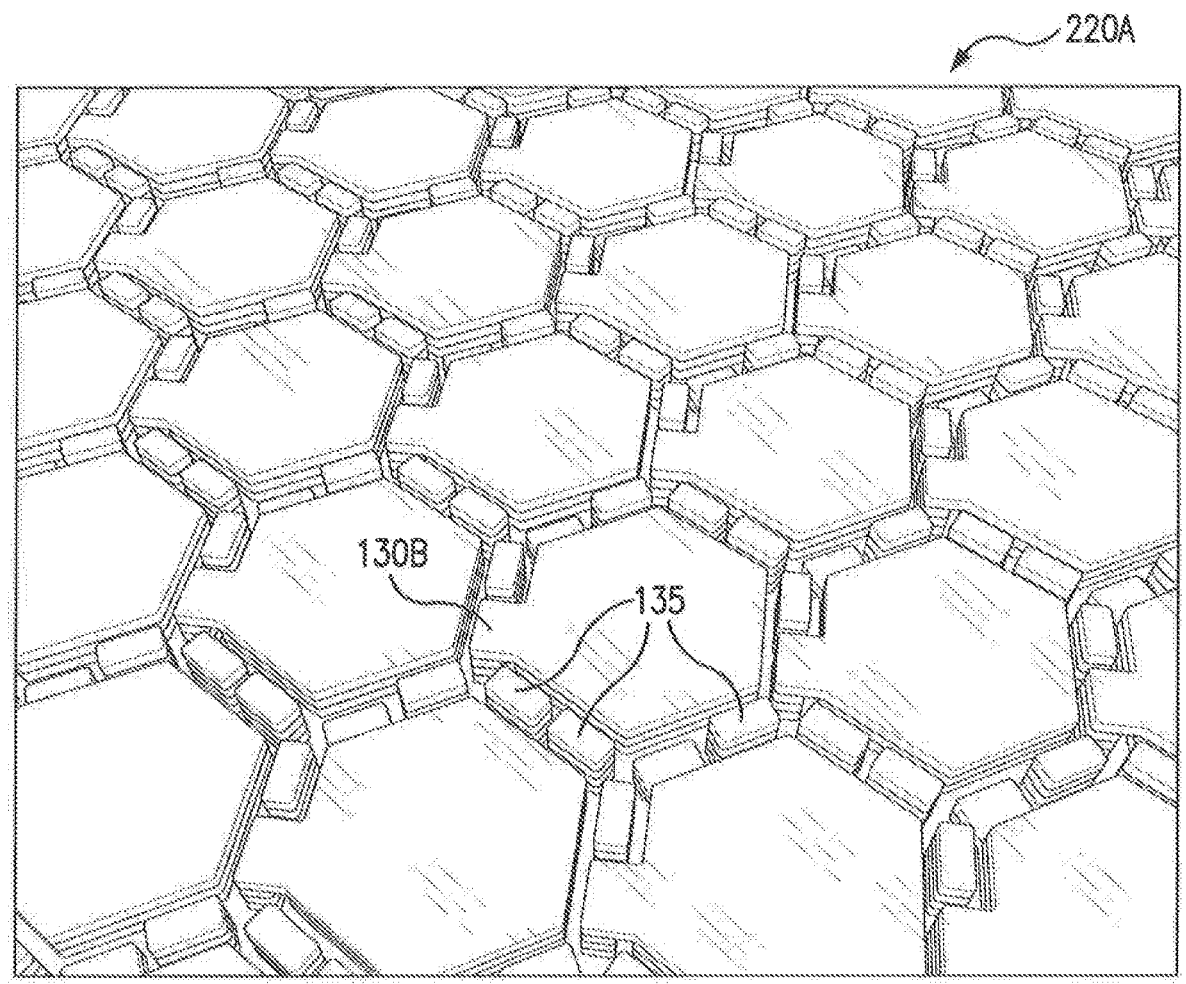
FIG. 9A illustrates an anode layer of the first subpixel of FIG. 1, according to certain embodiments.
Figure 9B:
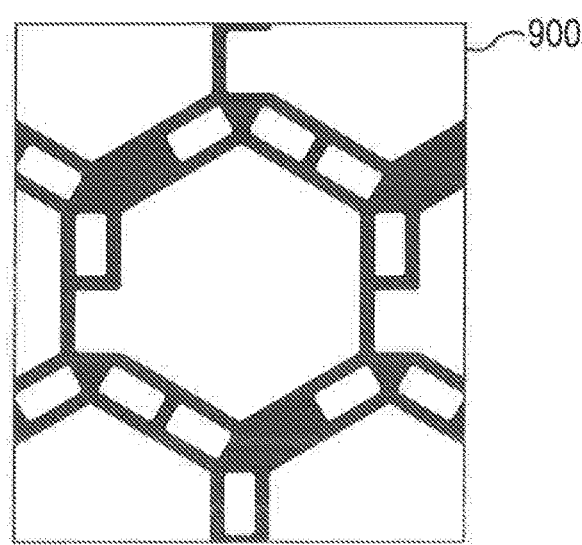
FIG. 9B illustrates a portion of a photomask used to manufacture the anode layer of FIG. 9A, according to certain embodiments.

At step 540, a transparent anode layer of a subpixel is created by depositing a layer of transparent anode material on the patterned emissive layer of step 530 and then patterning the transparent anode layer using lithography such as photolithography. In some embodiments, the transparent anode layer is anode layer 220A, which is illustrated in FIG. 9A. A portion of a photomask 900 that may be utilized by this step to pattern the layer of transparent anode material into the transparent anode layer is illustrated in FIG. 9B. In some embodiments, patterning the transparent anode layer includes forming a portion of the transparent anode layer into a polygon shape, such as a hexagon or an octagon. For example, as illustrated in FIG. 9B, the transparent anode layer of a single subpixel may have an overall shape of a hexagon when viewed from above and may include a portion of a connector column 130 (e.g., in the shape of a rectangle or a square) coupled to one side of the hexagon shape.

Figure 10A:
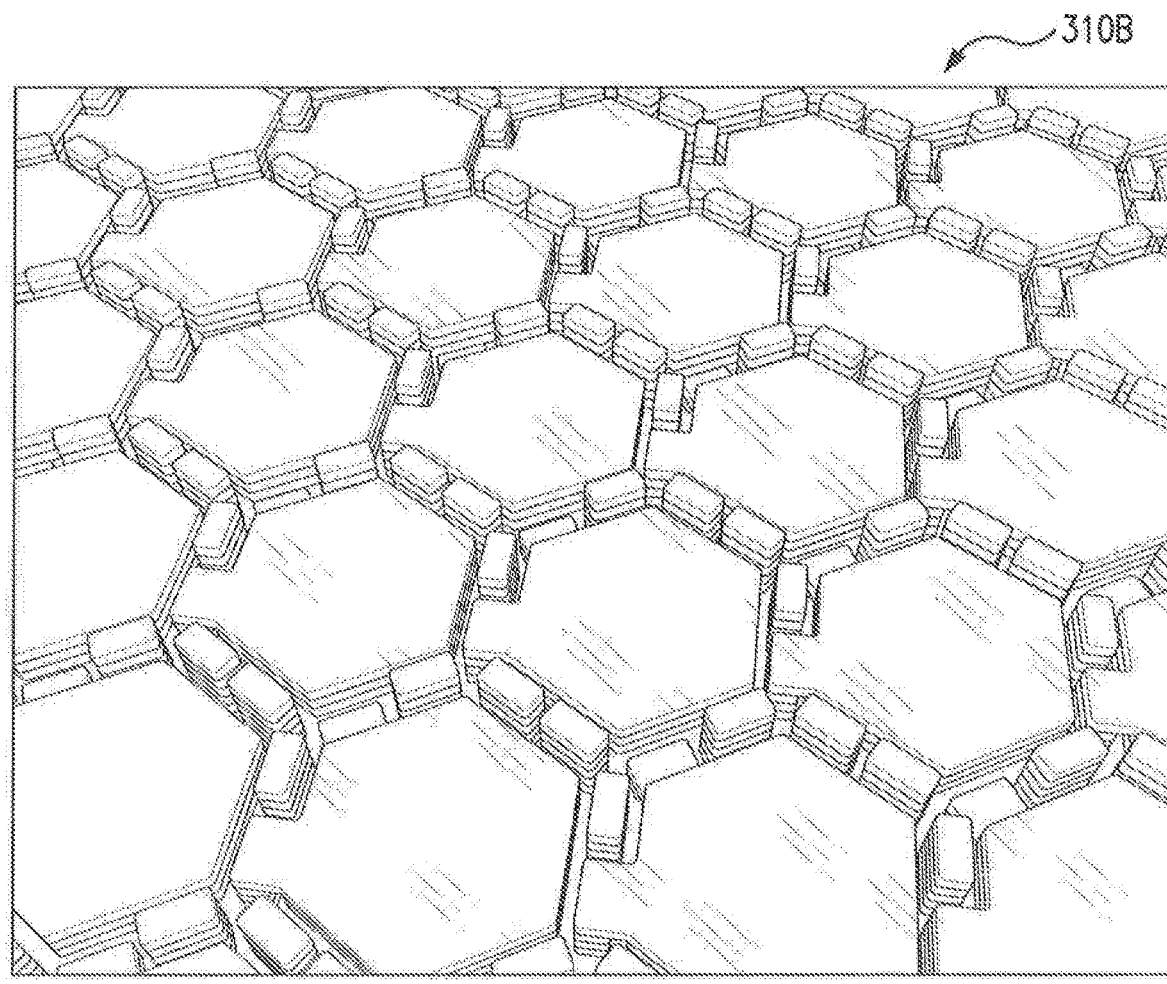
FIG. 10A illustrates a second insulating layer of the pixel of FIG. 1, according to certain embodiments.
Figure 10B:
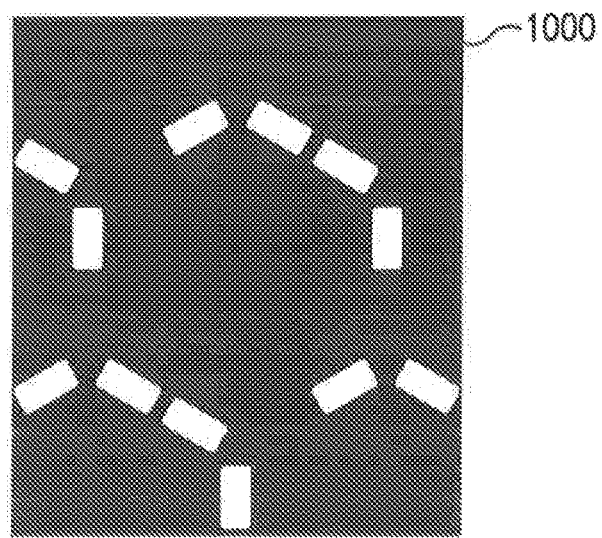
FIG. 10B illustrates a portion of a photomask used to manufacture the second insulating layer of FIG. 10A, according to certain embodiments.
Figure 11A:
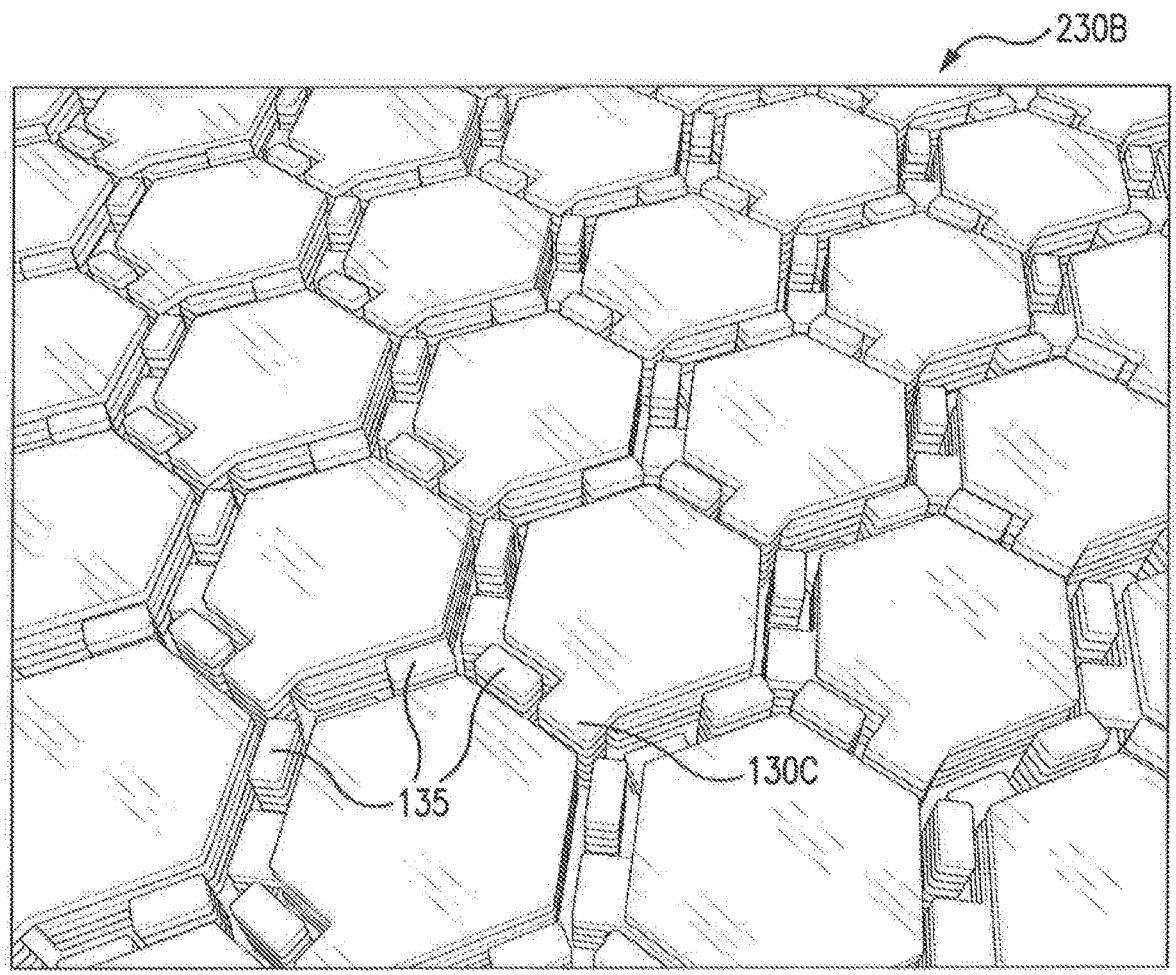
FIG. 11A illustrates a cathode layer of the second subpixel of FIG. 1, according to certain embodiments.
Figure 11B:
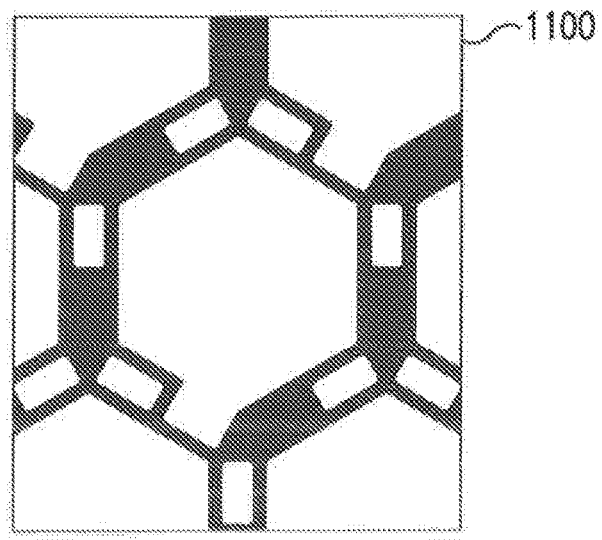
FIG. 11B illustrates a portion of a photomask used to manufacture the cathode layer of FIG. 11A, according to certain embodiments.
Figure 12A:
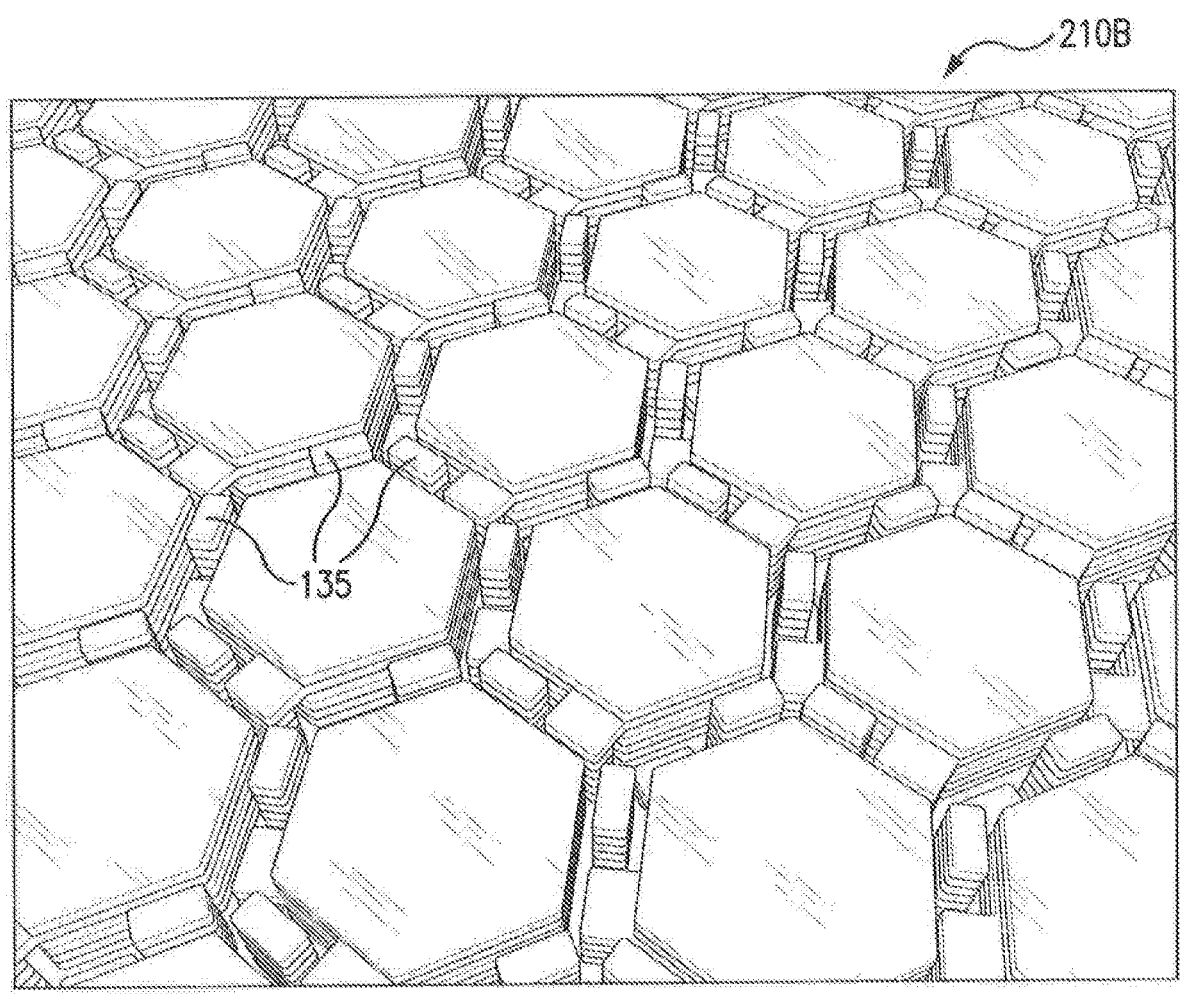
FIG. 12A illustrates an emissive layer of the second subpixel of FIG. 1, according to certain embodiments.
Figure 12B:
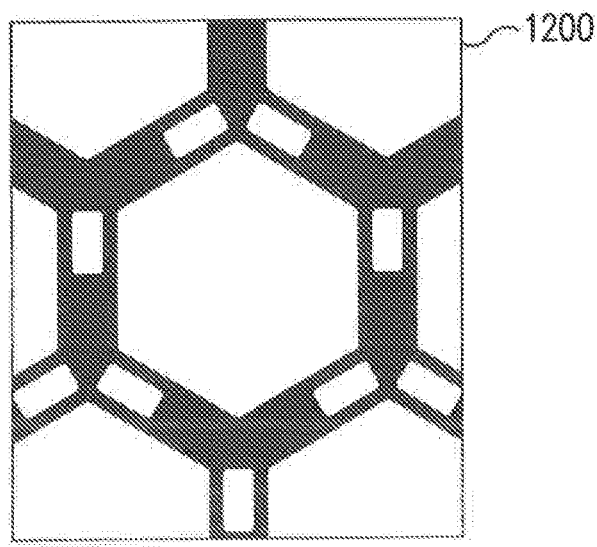
FIG. 12B illustrates a portion of a photomask used to manufacture the emissive layer of FIG. 12A, according to certain embodiments.
Figure 13A:
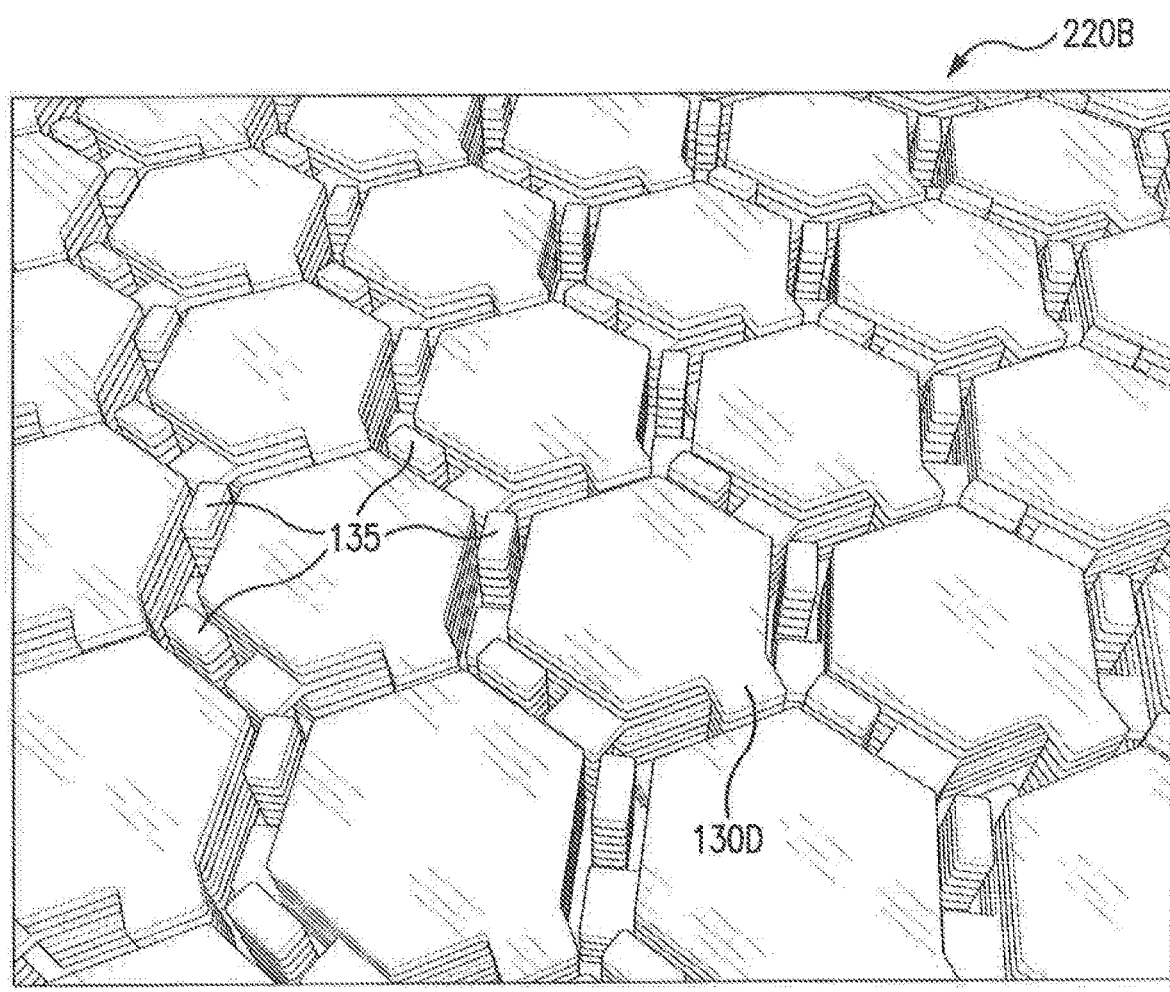
FIG. 13A illustrates an anode layer of the second subpixel of FIG. 1, according to certain embodiments.
Figure 13B:
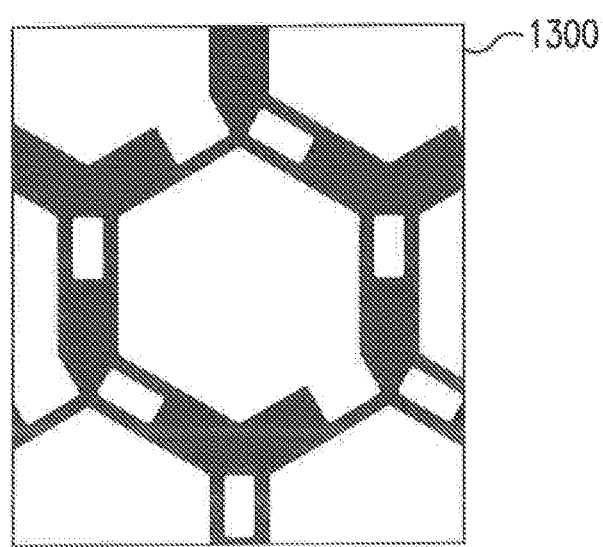
FIG. 13B illustrates a portion of a photomask used to manufacture the anode layer of FIG. 13A, according to certain embodiments.
Figure 14A:
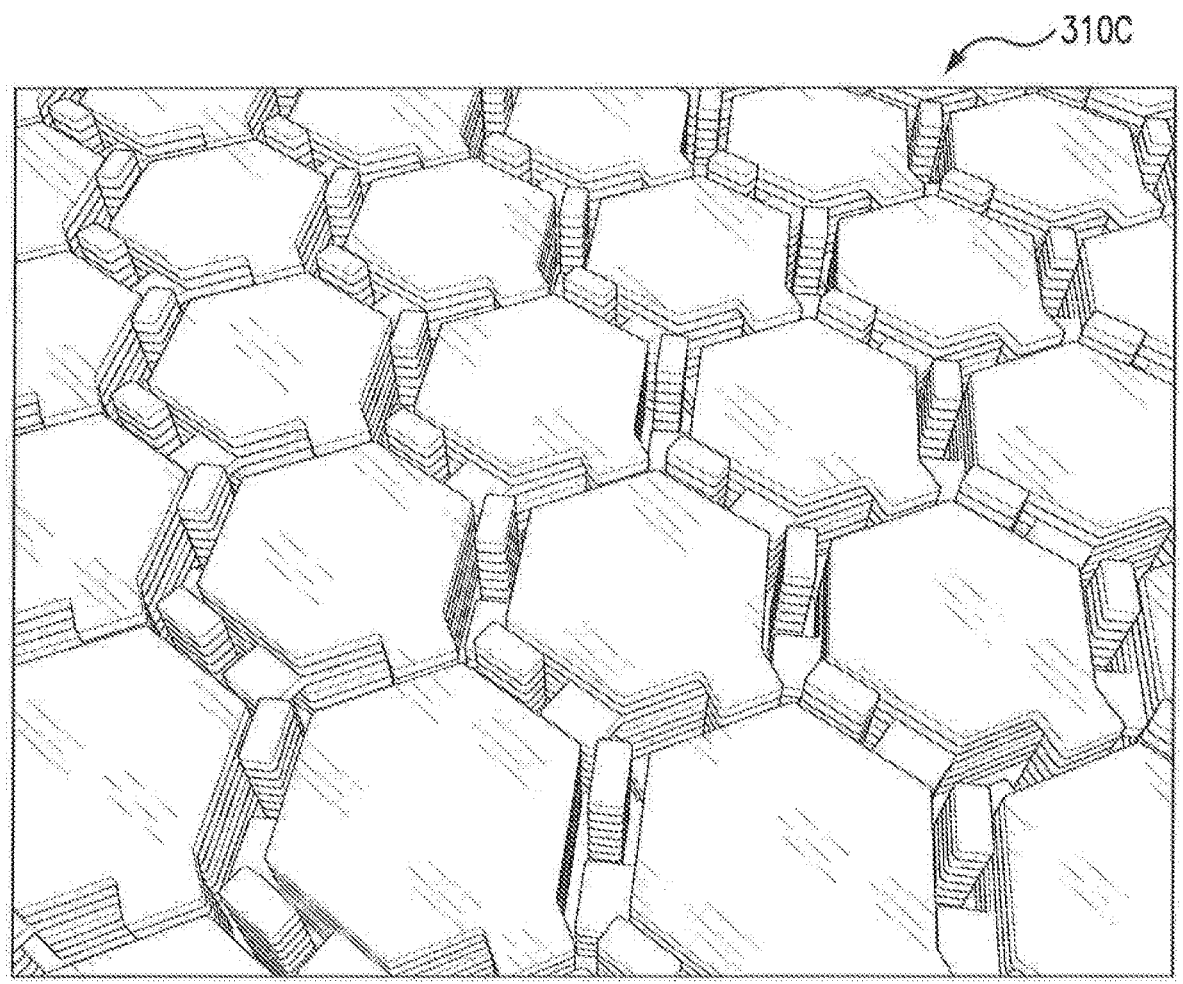
FIG. 14A illustrates a third insulating layer of the pixel of FIG. 1, according to certain embodiments.
Figure 14B:
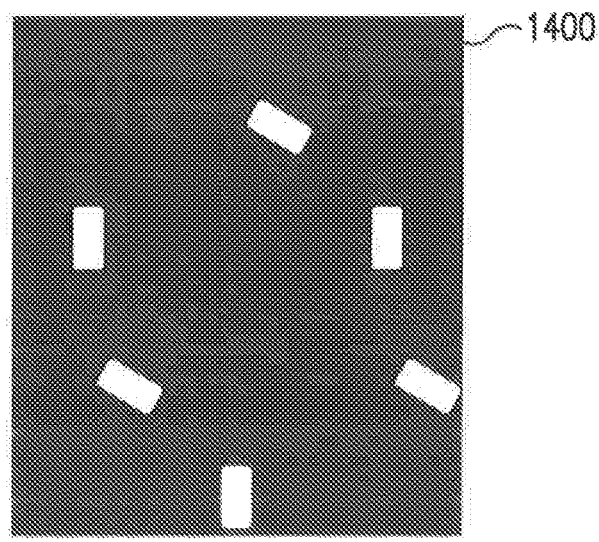
FIG. 14B illustrates a portion of a photomask used to manufacture the third insulating layer of FIG. 14A, according to certain embodiments.
Figure 15A:
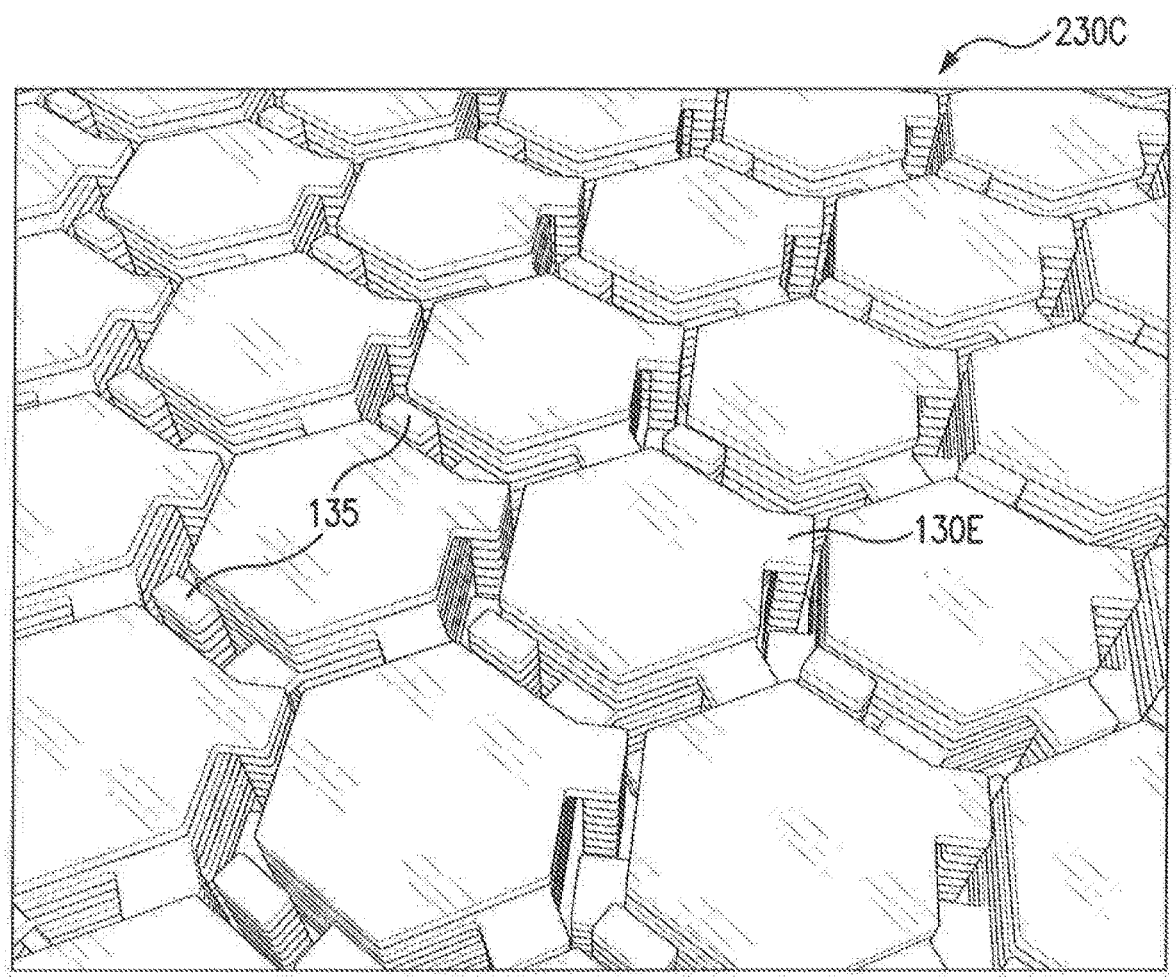
FIG. 15A illustrates a cathode layer of the third subpixel of FIG. 1, according to certain embodiments.
Figure 15B:
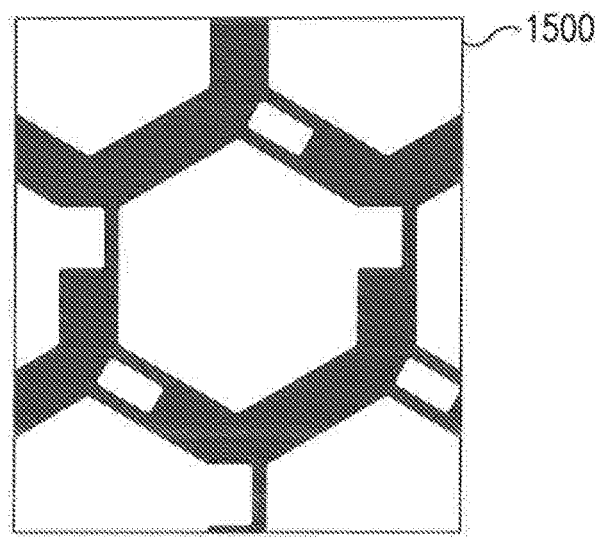
FIG. 15B illustrates a portion of a photomask used to manufacture the cathode layer of FIG. 15A, according to certain embodiments.
Figure 16A:
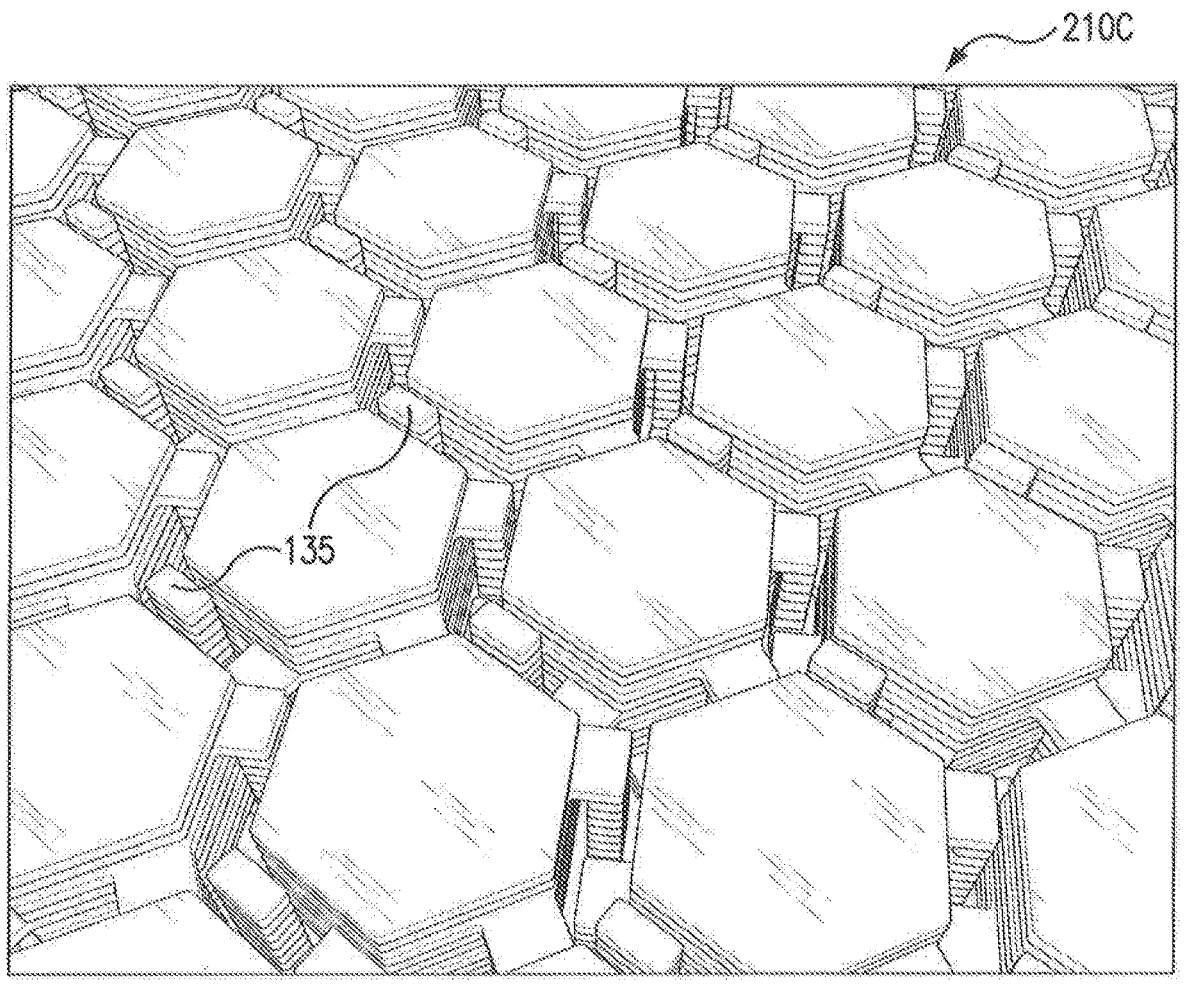
FIG. 16A illustrates an emissive layer of the third subpixel of FIG. 1, according to certain embodiments.
Figure 16B:
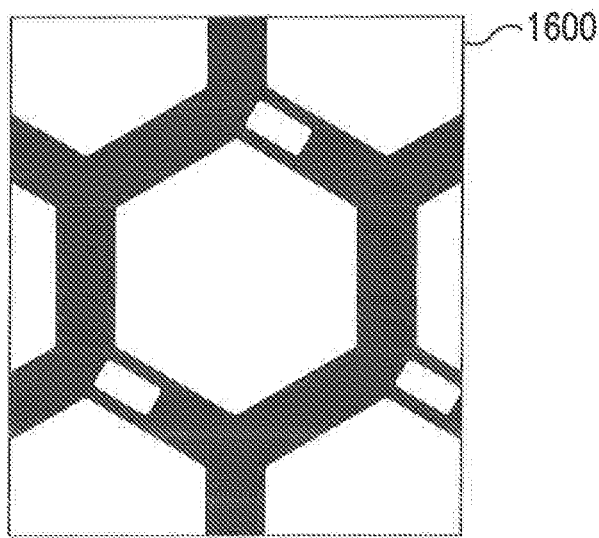
FIG. 16B illustrates a portion of a photomask used to manufacture the emissive layer of FIG. 16A, according to certain embodiments.
Figure 17A:
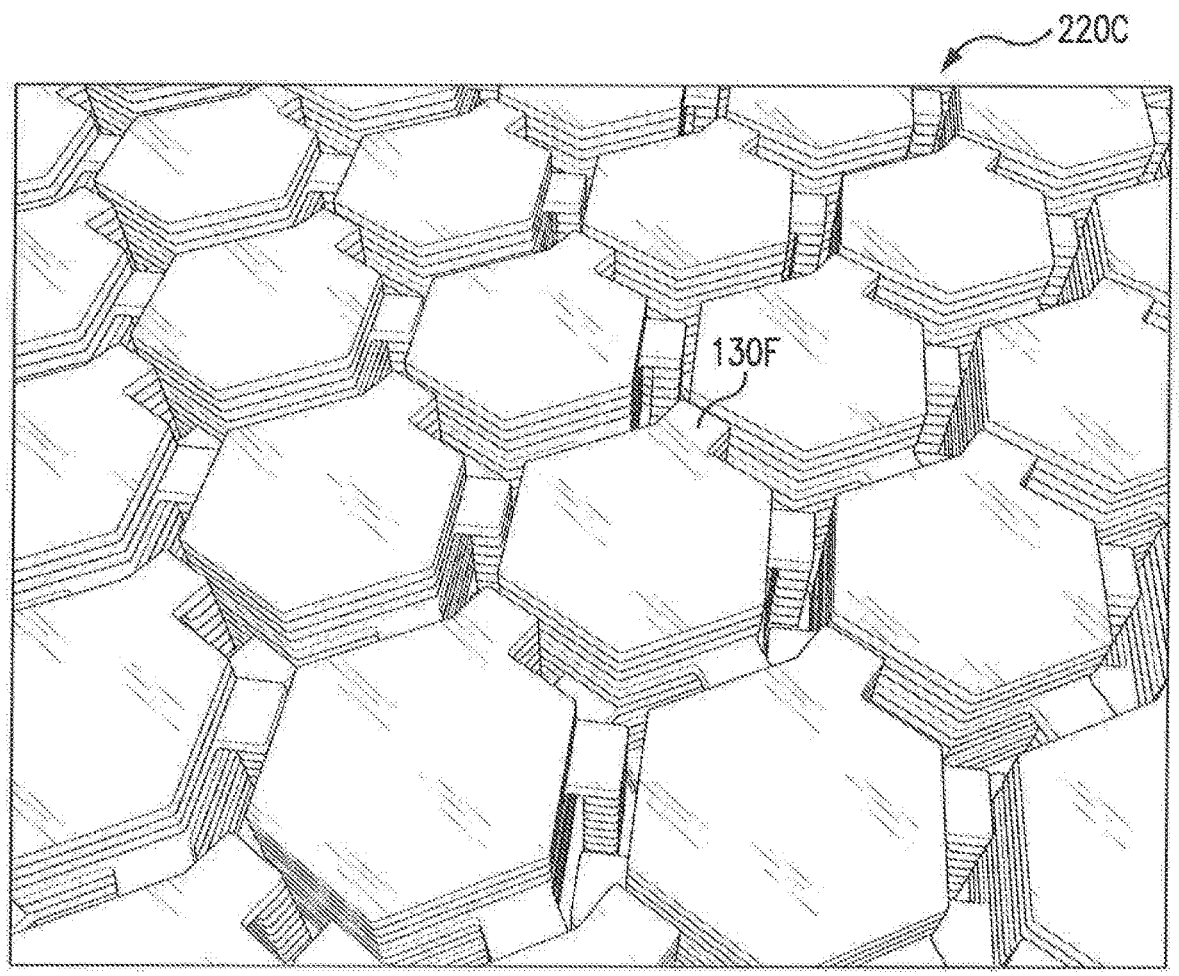
FIG. 17A illustrates an anode layer of the third subpixel of FIG. 1, according to certain embodiments.
Figure 17B:
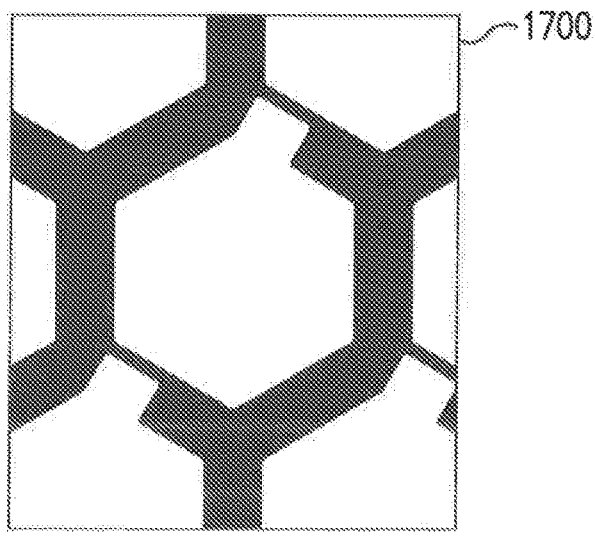
FIG. 17B illustrates a portion of a photomask used to manufacture the anode layer of FIG. 17A, according to certain embodiments.

At step 550, method 500 determines whether to repeat steps 510-540 based on whether additional subpixels are to be formed. Using the example embodiment of FIG. 1, for example, method 500 would repeat steps 510-540 two additional times in order to create second subpixel 110B on top of first subpixel 110A and then third subpixel 110C on top of second subpixel 110B. To create second subpixel 110B on top of first subpixel 110A, method 500 would repeat steps 510-540 to create the various layers illustrated in FIGS. 10A, 11A, 12A, and, 13A, respectively. Portions of photomasks 1000, 1100, 1200, and 1300 that may be utilized by these steps to create second subpixel 110B are illustrated in FIGS. 10B, 11B, 12B, and, 13B, respectively. To create third subpixel 110C on top of second subpixel 110B, method 500 would repeat steps 510-540 to create the various layers illustrated in FIGS. 14A, 15A, 16A, and, 17A, respectively. Portions of photomasks 1400, 1500, 1600, and 1700 that may be utilized by these steps to create third subpixel 110C are illustrated in FIGS. 14B, 15B, 16B, and, 17B, respectively.

In some embodiments, method 500 may include forming additional layers that are not specifically illustrated in FIG. 5. For example, additional layers such as insulating layers 310 may be formed by method 500 at any appropriate location. As another example, some embodiments may include one or more additional layers of graphene or other similar electrically-enhancing materials in order to improve efficiency and conductivity.

As described above, pixels with vertically stacked subpixels may be utilized as either display or sensor pixels. The previous figures illustrated embodiments of display pixels 100 that include emissive layers 210. The following FIGS. 18-20, however, illustrate embodiments of sensor pixels 1800 with vertically stacked subpixels 110 that include photodetector layers 1910 in place of emissive layers 210. FIG. 18 illustrates an assembled sensor pixel 1800 and FIGS. 19-20 illustrate different exploded views of sensor pixel 1800. In general, these figures depict the conductive portions of the illustrated layers. Other insulating areas (e.g., outside and between the subpixel stacks) have been removed for sake of visual clarity.

Sensor pixel 1800 may be utilized in any electronic devices such as cameras that are used to sense or capture light (e.g., photos and videos). Like display pixel 100, sensor pixel 1800 includes multiple subpixels 110 that are vertically stacked on top of one another. For example, some embodiments of pixel 1800 may include three subpixels 110: first subpixel 110A, second subpixel 110B that is stacked on top of first subpixel 110A, and third subpixel 110C that is stacked on top of second subpixel 110B. In a particular embodiment, first subpixel 110A is a red subpixel (i.e., first subpixel 110A detects red light), second subpixel 110B is a green subpixel (i.e., second subpixel 110B detects green light), and third subpixel 110C is a blue subpixel (i.e., third subpixel 110C detects blue light). However, other embodiments may include any other order of red, green, and blue subpixels 110. Furthermore, some embodiments may include more or few numbers of subpixels 110 than what is illustrated in FIGS. 18-20 and may include any other appropriate colors of subpixels (e.g., violet, etc.).

Like display pixel 100, sensor pixel 1800 may be coupled to backplane circuitry 120. In some embodiments, circuitry 120 includes layered transparent transistor/capacitor arrays to handle voltage switching and storage for each subpixel 110 of pixel 1800. Various layers of each subpixel 110 (e.g., anode layers 220 and cathode layers 230 as described above) may be electrically coupled to circuitry 120 via connector columns 130 and connection pads 140. For example, first subpixel 110A may be coupled to circuitry 120 via connector columns 130A and 130B and connection pads 140A and 140B, second subpixel 110B may be coupled to circuitry 120 via connector columns 130C and 130D and connection pads 140C and 140D, and third subpixel 110C may be coupled to circuitry 120 via connector columns 130E and 130F and connection pads 140E and 140F, as illustrated. As a result, each subpixel 110 may be individually addressed and controlled by circuitry 120.

As illustrated in detail in FIGS. 19-20, each subpixel 110 of sensor pixel 1800 may include at least three layers: a photodetector layer 1910, an anode layer 220, and a cathode layer 230. For example, subpixel 110A may include at least a cathode layer 230A, a photodetector layer 1910A on top of cathode layer 230A, and an anode layer 220A on top of photodetector layer 1910A. Likewise, subpixel 110B may include at least a cathode layer 230B, a photodetector layer 1910B on top of cathode layer 230B, and an anode layer 220B on top of photodetector layer 1910B. Similarly, subpixel 110C may include at least a cathode layer 230C, a photodetector layer 1910C on top of cathode layer 230C, and an anode layer 220C on top of photodetector layer 1910C. In other embodiments, subpixels 110 may include additional layers that are not illustrated in FIGS. 18-20. For example, some embodiments of subpixels 110 may include additional insulating layers 310 that are not specifically illustrated. As another example, some embodiments may include one or more additional layers of graphene or other similar electrically-enhancing materials in order to improve efficiency and conductivity.

As discussed above with respect to FIGS. 2-3, anode layers 220 and cathode layers 230 are formed, respectively, from any appropriate anode or cathode material. In general, anode layers 220 and cathode layers 230 are transparent so that light may pass through them and into photodetector layers 1910. Only narrow bands of light are captured by each photodetector layer 1910 for accurate color imaging.

Photodetector layers 1910 generally are formed from any appropriate material capable of detecting light while supporting transparency. For example, photodetector layers 1910 may be tuned color-specific electroluminescent or photoelectric QD layers such as QLED layers. In some embodiments, photodetector layers 1910 may be OLED layers. In some embodiments, photodetector layers 1910 may be precisely tuned for narrow band detection of specific wavelengths of light (e.g., red, green, and blue). By using electroluminescent QD photodetector layers 1910, certain embodiments provide 1) improved color gamut in the resulting imagery since precisely-tuned photoelectric quantum dot films are used to capture only the band of light necessary for a given subpixel, and 2) greatly improved shutter speeds over traditional CMOS image sensors due to very fast response times of quantum dot photoelectric materials.

In some embodiments, photodetector layers 1910 utilize any transparent photodetector material in combination with unique color filtering instead of QD photodetectors. For example, as depicted in FIG. 19, full spectrum light may first enter sensor pixel 1800 from the top (i.e., through third subpixel 110C). Third subpixel 110C may include a specific color filter as an additional "sub-layer" (e.g., within photodetector layer 1910) to allow only certain wavelengths of light to pass through. Second subpixel 110B may include a color filter of a different specific color to allow only other certain wavelengths of light to pass through to first subpixel 110A beneath it. By mathematically subtracting the readout signals from each of these subpixels 110, sensor pixel 1800 may be able to isolate specific colors from the upper two subpixels (e.g., 110C and 110B), thus outputting a full RGB signal.

In some embodiments, sensor pixels 1800 and subpixels 110 have an overall shape of a polygon when viewed from above. For example, pixels 1800 and subpixels 110 may be hexagon-shaped, octagon-shaped, or the shape of any other polygon. To achieve the desired shape, each layer of subpixel 110 may be formed in the desired shape. For example, each of anode layer 220, photodetector layer 1910, and cathode layer 230 may be formed in the shape of the desired polygon. As a result, each side of pixel 1800 may be adjacent to a side of another pixel 1800, similar to pixels 100 as illustrated in FIG. 4. For example, if pixel 1800 is in the shape of a hexagon, each pixel 1800 in an array of pixels such as array 400 is adjacent to six other pixels 1800. Furthermore, each side of each individual pixel 1800 is adjacent to a side of a respective one of the six other hexagon-shaped pixels 1800. In this way, the sensitive area of the overall display surface is maximized since only very narrow non-conductive boundaries are patterned between each pixel. This diminishes the percentage of non-emissive "dark" areas within an array of pixels 1800.

Like display pixels 100, embodiments of sensor pixels 1800 include multiple connector columns 130 that electrically connect the various layers of subpixels 110 to circuitry 120 via connection pads 140. For example, in some embodiments, pixel 1800 includes six connector columns 130: connector column 130A that couples cathode layer 230A of subpixel 110A to circuitry 120, connector column 130B that couples anode layer 220A of subpixel 110A to circuitry 120, connector column 130C that couples cathode layer 230B of subpixel 110B to circuitry 120, connector column 130D that couples anode layer 220B of subpixel 110B to circuitry 120, connector column 130E that couples cathode layer 230C of subpixel 110C to circuitry 120, and connector column 130F that couples anode layer 220C of subpixel 110C to circuitry 120.

FIG. 21 illustrates a method 2100 of manufacturing a sensor pixel with stacked subpixels. For example, method 2100 may be used to manufacture pixel 1800 having stacked subpixels 110, as described above. Method 2100, in general, utilizes steps 2110-2140 to create layers of a subpixel using lithography. The various layers created by these steps and the photomasks that may be utilized to create the various layers are illustrated in FIGS. 6A-17B, except that emissive layers 210 are replaced by photodetector layers 1910. As described in more detail below, steps 2110-2140 may be repeated one or more times to create stacked subpixels such as subpixels 110 of pixel 1800. For example, steps 2110-2140 may be performed a total of three times to create stacked subpixels 110A-110C, as described above.

Method 2100 may begin in step 2110 where a transparent insulating layer is created by depositing a layer of transparent insulating material and then patterning the layer of transparent insulating material using lithography. In some embodiments, the transparent insulating layer is insulating layer 310A, which is illustrated in FIG. 6A. In some embodiments, the layer of transparent insulating material is deposited on a substrate or backplane that includes circuitry 120, as described above. In some embodiments, the layer of transparent insulating material is patterned into the transparent insulating layer using photolithography. A portion of a photomask 600 that may be utilized by this step to pattern the layer of transparent insulating material into the transparent insulating layer is illustrated in FIG. 6B.

At step 2120, a transparent cathode layer of a subpixel is created by depositing a layer of transparent conductive material on the patterned transparent insulating layer of step 2110 and then patterning the transparent cathode layer using lithography such as photolithography. In some embodiments, the transparent cathode layer is cathode layer 230A, which is illustrated in FIG. 7A. A portion of a photomask 700 that may be utilized by this step to pattern the layer of transparent conductive material into the transparent cathode layer is illustrated in FIG. 7B. In some embodiments, patterning the transparent cathode layer includes forming a portion of the transparent cathode layer into a polygon shape, such as a hexagon or an octagon. For example, as illustrated in FIG. 7B, the transparent cathode layer of a single subpixel may have an overall shape of a hexagon when viewed from above and may include a portion of a connector column 130 (e.g., in the shape of a rectangle or a square) coupled to one side of the hexagon shape.

At step 2130, a photodetector layer of a subpixel is created by depositing a layer of photodetector material on the patterned transparent cathode layer of step 2120 and then patterning the photodetector layer using lithography such as photolithography. In some embodiments, the photodetector layer is photodetector layer 1910A, which is illustrated in FIG. 8A (except that emissive layer 210A is replaced by photodetector layer 1910A). A portion of a photomask 800 that may be utilized by this step to pattern the layer of photodetector material into the photodetector layer is illustrated in FIG. 8B. In some embodiments, patterning the photodetector layer includes forming a portion of the photodetector layer into a polygon shape, such as a hexagon or an octagon. For example, as illustrated in FIG. 8B, the photodetector layer of a single subpixel may have an overall shape of a hexagon when viewed from above. Unlike the transparent cathode layer of step 2120, the sides of the hexagon shape of the photodetector layer of this step may be devoid of any portions of connector columns 130.

At step 2140, a transparent anode layer of a subpixel is created by depositing a layer of transparent anode material on the patterned photodetector layer of step 2130 and then patterning the transparent anode layer using lithography such as photolithography. In some embodiments, the transparent anode layer is anode layer 220A, which is illustrated in FIG. 9A. A portion of a photomask 900 that may be utilized by this step to pattern the layer of transparent anode material into the transparent anode layer is illustrated in FIG. 9B. In some embodiments, patterning the transparent anode layer includes forming a portion of the transparent anode layer into a polygon shape, such as a hexagon or an octagon. For example, as illustrated in FIG. 9B, the transparent anode layer of a single subpixel may have an overall shape of a hexagon when viewed from above and may include a portion of a connector column 130 (e.g., in the shape of a rectangle or a square) coupled to one side of the hexagon shape.

At step 2150, method 2100 determines whether to repeat steps 2110-2140 based on whether additional subpixels are to be formed for pixel 1800. Using the example embodiment of FIG. 18, for example, method 2100 would repeat steps 2110-2140 two additional times in order to create second subpixel 110B on top of first subpixel 110A and then third subpixel 110C on top of second subpixel 110B. To create second subpixel 110B on top of first subpixel 110A, method 2100 would repeat steps 2110-2140 to create the various layers illustrated in FIGS. 10A, 11A, 12A, and, 13A, respectively. Portions of photomasks 1000, 1100, 1200, and 1300 that may be utilized by these steps to create second subpixel 110B are illustrated in FIGS. 10B, 11B, 12B, and, 13B, respectively. To create third subpixel 110C on top of second subpixel 110B, method 2100 would repeat steps 2110-2140 to create the various layers illustrated in FIGS. 14A, 121A, 16A, and, 17A, respectively. Portions of photomasks 1400, 12100, 1600, and 1700 that may be utilized by these steps to create third subpixel 110C are illustrated in FIGS. 14B, 121B, 16B, and, 17B, respectively.

In some embodiments, method 2100 may include forming additional layers that are not specifically illustrated in FIG. 21. For example, additional layers such as insulating layers 310 may be formed by method 2100 at any appropriate location. Furthermore, as previously noted, some steps of some embodiments of method 210 may include additional steps that are not specifically mentioned. For example, some layers (e.g., some insulating layers) may be a combination of both insulating and conductive films. Such layers may be manufactured using standard planar semiconductor techniques: depositing, masking, etching, and repeating as many times as necessary to produce the required pattern of conductive and non-conductive areas within the layer.

Figure 22:
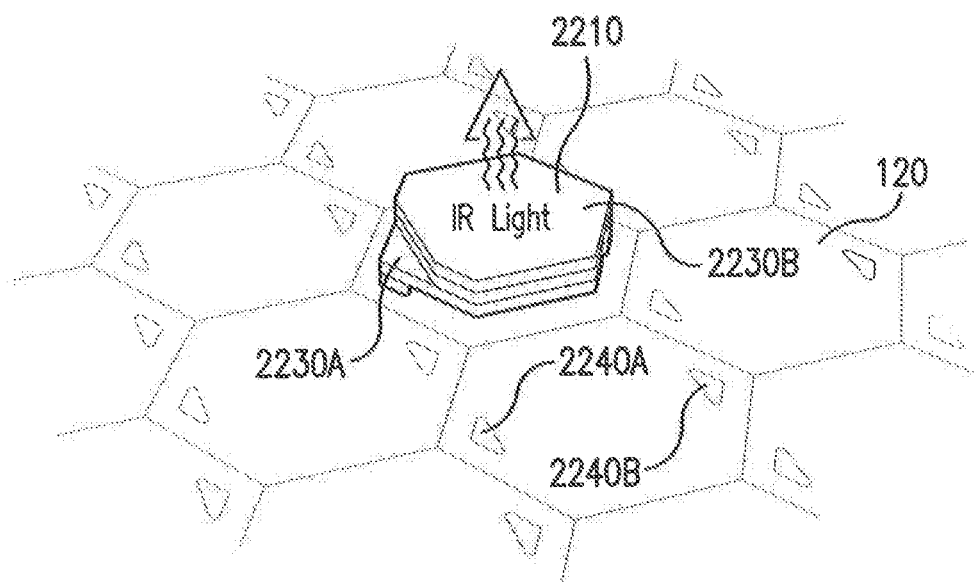
FIG. 22 illustrates a single IR emitter subpixel that may be utilized with the display pixel of FIG. 1 or the sensor pixel of FIG. 18, according to certain embodiments.
Figure 25:
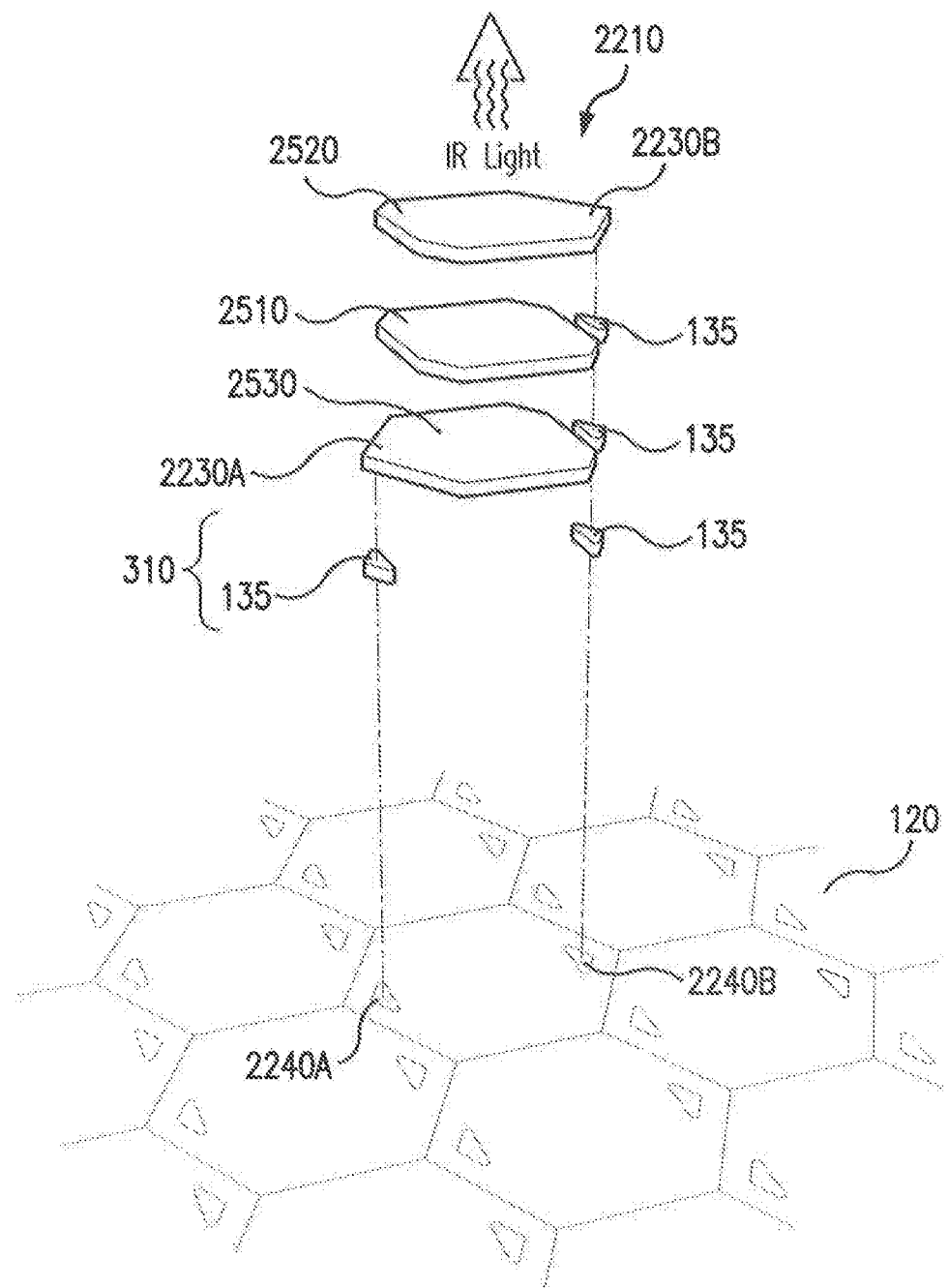
FIG. 25 illustrates an exploded view of the IR emitter subpixel of FIG. 22, according to certain embodiments.
Figure 26:
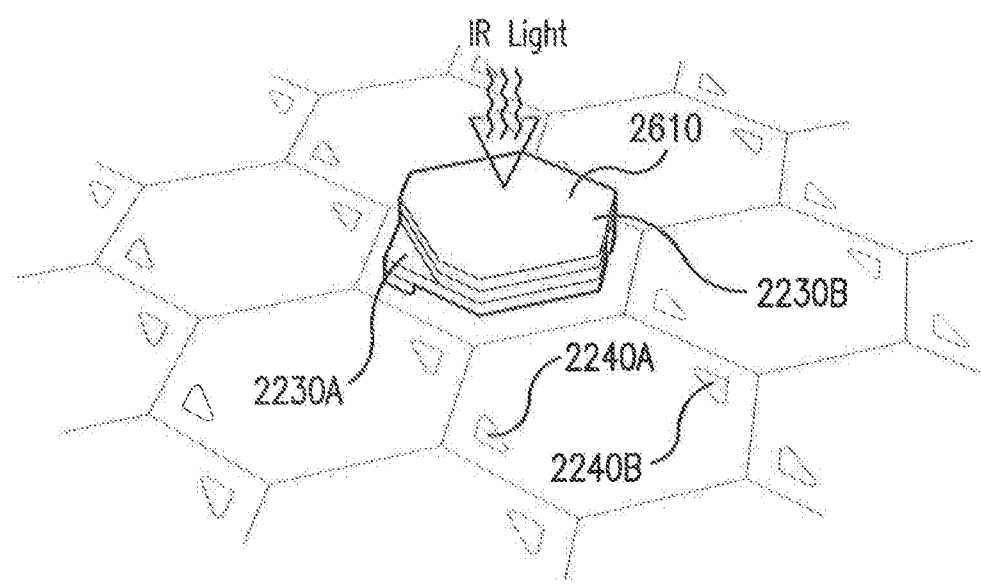
FIG. 26 illustrates a single IR detector subpixel that may be utilized with the display pixel of FIG. 1 or the sensor pixel of FIG. 18, according to certain embodiments.

FIGS. 22-25 illustrate various views of a single IR emitter subpixel 2210, and FIGS. 26-29 illustrate various views of a single IR detector subpixel 2610. IR emitter subpixels 2210 and IR detector subpixels 2610 may be utilized by some embodiments in combination with or in place of one or all subpixels 110 described above. FIGS. 22 and 26 respectively illustrate IR emitter subpixel 2210 and IR detector subpixel 2610 formed on circuitry 120, FIGS. 23 and 27 respectively illustrate IR emitter subpixel 2210 and IR detector subpixel 2610 being utilized with pixel 100, FIGS. 24 and 28 respectively illustrate rotated views of IR emitter subpixel 2210 and IR detector subpixel 2610, and FIGS. 25 and 29 respectively illustrate exploded views of IR emitter subpixel 2210 and IR detector subpixel 2610. In general, these figures depict the conductive portions of the illustrated layers. Other insulating areas (e.g., outside and between the subpixel stacks) have been removed for sake of visual clarity.

In general, electronic displays may utilize IR emitter subpixels 2210 and IR detector subpixels 2610 to emit and detect IR light in order to provide functionality such as eye tracking, eye gaze analysis, and tracking/detection of any other object that may reflect IR light. As one example, a head-mounted display (HMD) may utilize IR emitter subpixels 2210 along with IR detector subpixels 2610 in order to provide eye tracking of the user wearing the HMD. Current HMDs that utilize eye tracking typically have inward-facing IR LEDs and cameras mounted at various points on the frame of the HMD. This requires accommodations for wiring and circuitry, not to mention the added bulk associated with the electronics and optics of the components themselves. Thus, head-mounted eye tracking systems contribute to the typical unwieldy mass of HMDs that use the technology, further necessitating the need for additional support and reducing user comfort. Furthermore, the range of view of typical eye-tracking sensors is also problematic, requiring the sensors to have a direct line of sight view of the user's pupils at all times. This limits the locations which these sensors can be mounted to regions within the user's visual field, obstructing the view to various degrees depending on where and how the hardware is mounted. However, embodiments of the disclosure address these and other problems with existing devices such as HMDs by utilizing coplanar IR emitter subpixels 2210 and IR detector subpixels 2610 that are embedded directly within an electronic display. As a result, the overall structure of a device such as a HMD may be simplified and lightened since visible hardware such as inward-facing IR LEDs and cameras can be eliminated. Furthermore, eliminating visible tracking hardware from a user's field of vision also improves clarity of the visible scene, as there are no obstructions caused by the hardware placement.

Figure 23:
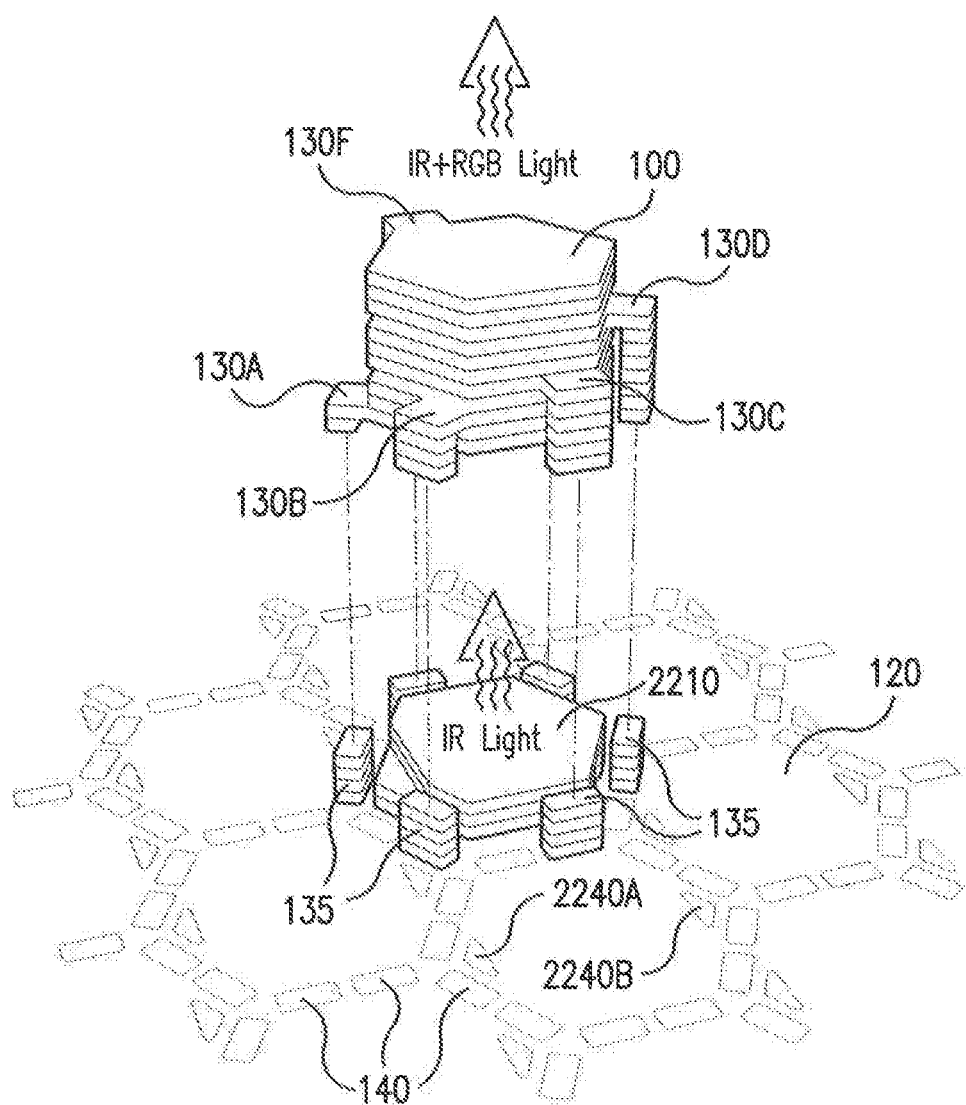
FIG. 23 illustrates the IR emitter subpixel of FIG. 22 used in combination with the display pixel of FIG. 1, according to certain embodiments.
Figure 24:
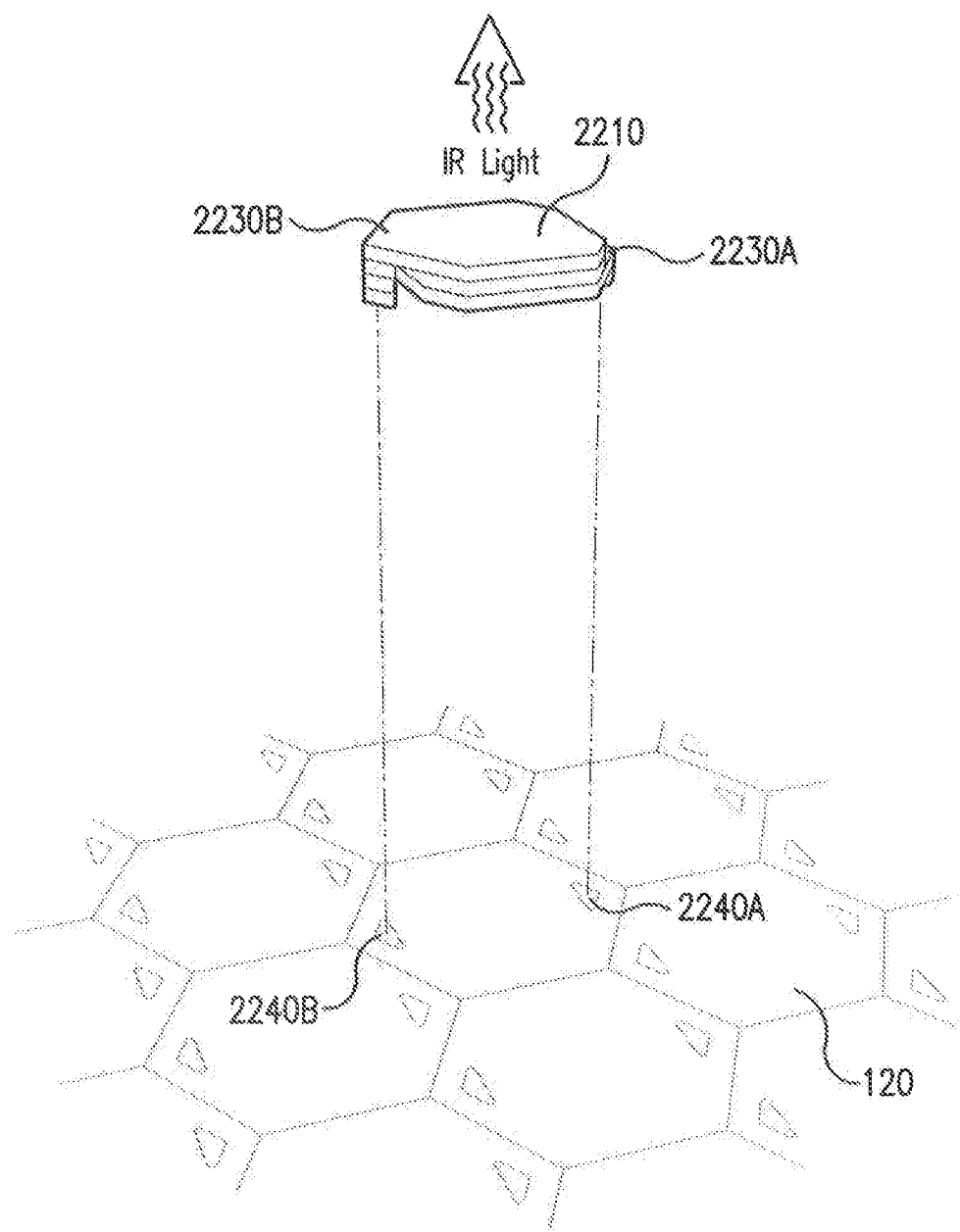
FIG. 24 illustrates a rotated view of the IR emitter subpixel of FIG. 22, according to certain embodiments.
Figure 27:
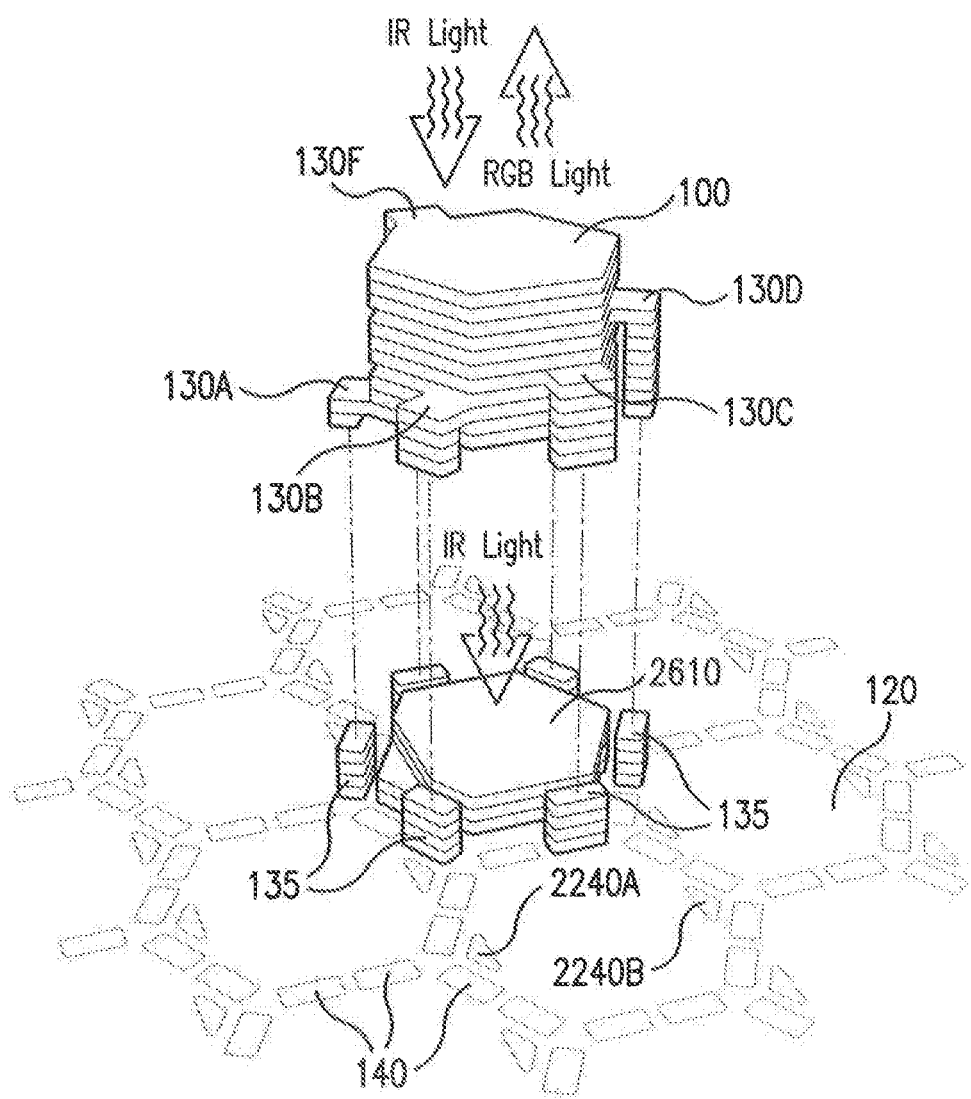
FIG. 27 illustrates the IR detector subpixel of FIG. 26 used in combination with the display pixel of FIG. 1, according to certain embodiments.
Figure 28:
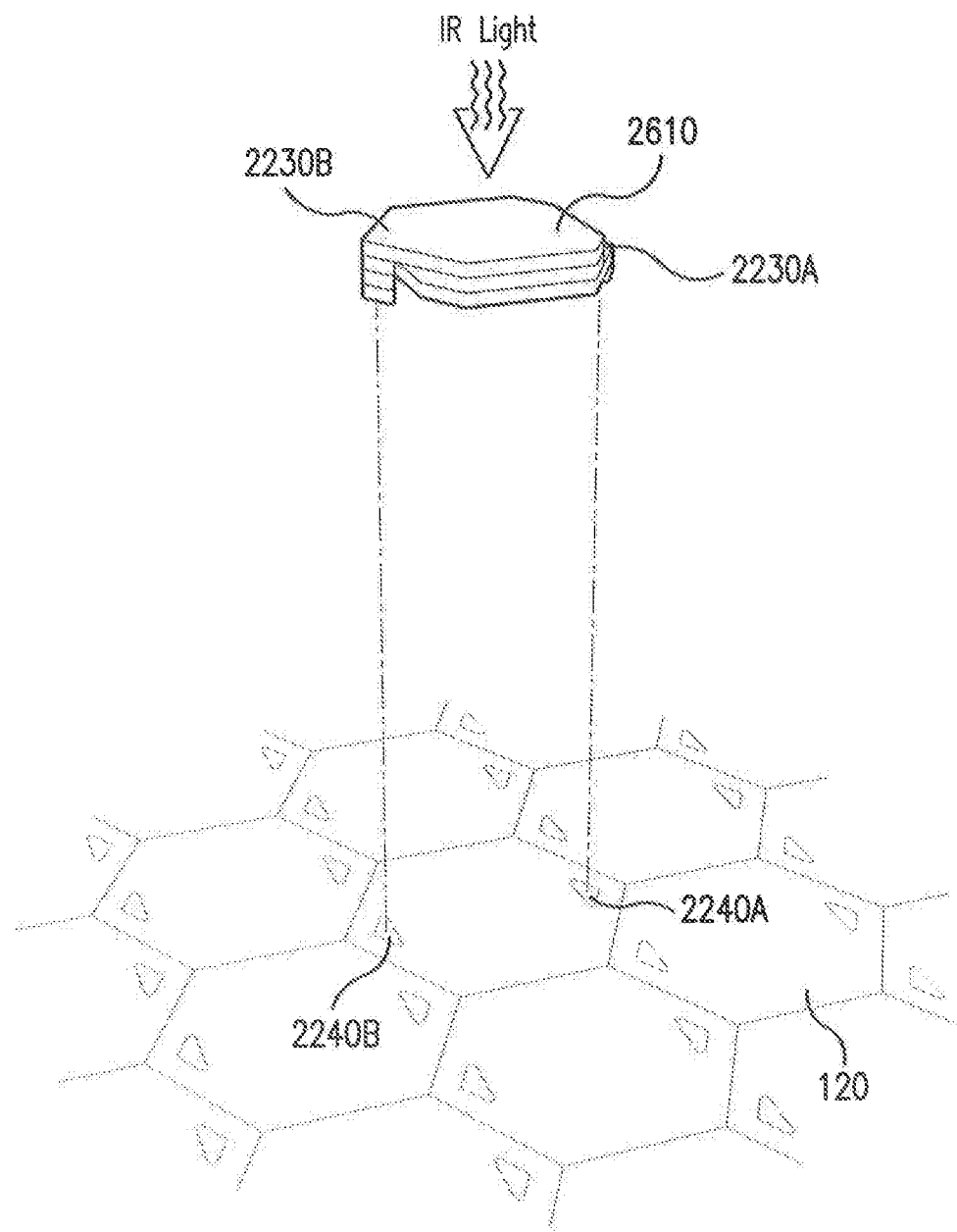
FIG. 28 illustrates a rotated view of the IR detector subpixel of FIG. 26, according to certain embodiments.

In some embodiments, IR emitter subpixel 2210 is formed on and coupled to backplane circuitry 120 as illustrated in FIG. 22. Similarly, IR detector subpixel 2610 may in some embodiments be formed on and coupled to backplane circuitry 120 as illustrated in FIG. 26. In such embodiments, one or more subpixels 110 may be formed on top of IR emitter subpixel 2210 and IR detector subpixel 2610, as illustrated in FIGS. 23 and 27. In other embodiments, IR emitter subpixels 2210 and IR detector subpixels 2610 may be formed on top of pixels 100 or pixels 1800 (i.e., at the top of the stack of subpixels 110 of pixel 100 or pixel 1800). In some embodiments, IR emitter subpixels 2210 and IR detector subpixels 2610 may take the place of any subpixels 110 of pixels 100 or pixels 1800 (i.e., one or more subpixels 110 may be both above and below IR emitter subpixel 2210 and IR detector subpixel 2610). In some embodiments, there are no subpixels 110 above or below IR emitter subpixel 2210 and IR detector subpixel 2610.

IR emitter subpixel 2210 and IR detector subpixel 2610 may each be electrically coupled to circuitry 120 via two or more connector columns 2230. For example, each IR emitter subpixel 2210 and each IR detector subpixel 2610 may be electrically coupled to circuitry 120 via two connector columns 2230: connector column 2230A and connector column 2230B. As a specific example, IR emitter subpixel 2210 may be coupled to circuitry 120 via connector columns 2230A and 2230B and connection pads 2240A and 2240B, as illustrated.

Figure 29:
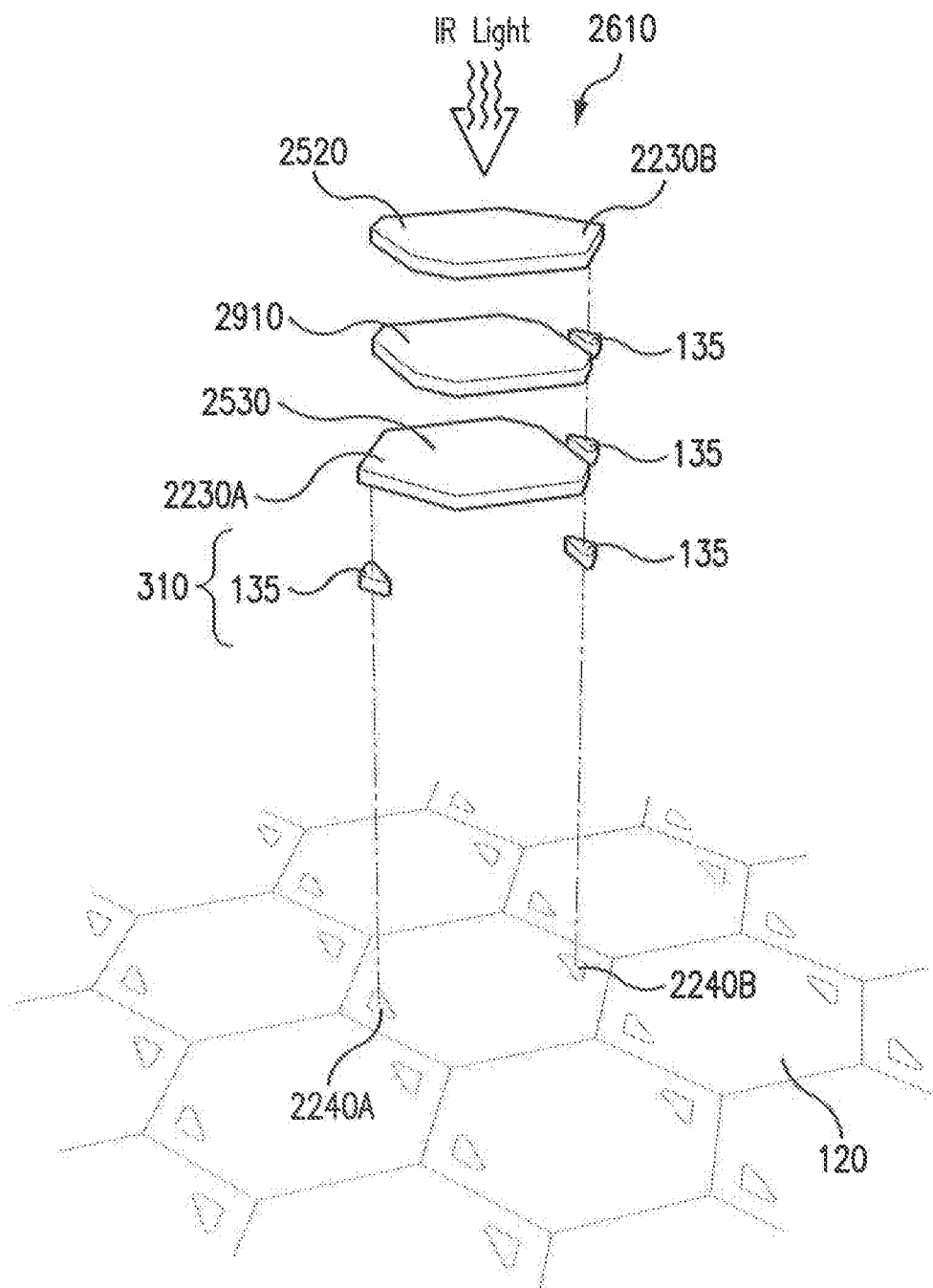
FIG. 29 illustrates an exploded view of the IR detector subpixel of FIG. 26, according to certain embodiments.

In general, connector columns 2230 may be similar in function to connector columns 130 and may be connected only to a single layer of IR subpixels 2210 and 2610 (i.e., a single anode layer 2520 or cathode layer 2530), thereby permitting circuitry 120 to uniquely address each anode layer 2520 and cathode layer 2530 of IR subpixels 2210 and 2610. For example, connector column 2230B may be coupled only to anode layer 2520, as illustrated. Connector columns 2230 are formed by one or more connector column portions 135, as illustrated in FIGS. 25 and 29. As described above, each connector column portion 135 is an island of material that is electrically isolated from the layer on which it is formed, but permits an electrical connection between the various illustrated layers of connector columns 2230. In general, the connector columns 2230 of a particular IR subpixel each have unique heights. In the illustrated embodiments, for example, connector column 2230B is the full height of IR emitter subpixel 2210, while connector column 2230A is only as tall as cathode layer 2530 of IR emitter subpixel 2210. Connector columns 2230 may be any appropriate size or shape. For example, connector columns 2230 may have a cross-sectional shape of a square, rectangle, circle, triangle, trapezoid, or any other appropriate shape. In the illustrated embodiments, connector columns 2230 have a cross-sectional shape of a triangle. In some embodiments, connection pads 2240 have a corresponding shape to connector columns 2230. For example, if connector columns 2230 have a cross-sectional shape of a triangle, connection pads 2240 may also be in the shape of a triangle.

Various layers of each IR emitter subpixel 2210 and IR detector subpixel 2610 (e.g., anode layers 2520 and cathode layers 2530 as described below) may be electrically coupled to circuitry 120 via connector columns 2230 (e.g., 2230A and 2230B) and connection pads 2240 (e.g., 2240A and 2240B). For example, IR emitter subpixel 2210 may be coupled to circuitry 120 via connector columns 2230A and 2230B and connection pads 2240A and 2240B. As a result, each subpixel 110 may be individually addressed and controlled by circuitry 120.

As illustrated in detail in FIGS. 25 and 29, each IR emitter subpixel 2210 and each IR detector subpixel 2610 may include at least three layers: an anode layer 2520, a cathode layer 2530, and an IR layer (e.g., an IR emitter layer 2510 or an IR detector layer 2910). For example, IR emitter subpixel 2210 may include at least a cathode layer 2530, an IR emissive layer 2510 on top of cathode layer 2530, and an anode layer 2520 on top of IR emissive layer 2510. Likewise, IR detector subpixel 2610 may include at least a cathode layer 2530, an IR detector layer 2910 on top of cathode layer 2530, and an anode layer 2520 on top of IR detector layer 2910. In other embodiments, IR emitter subpixels 2210 and IR detector subpixels 2610 may include additional layers that are not illustrated in FIGS. 25 and 29. For example, some embodiments of IR emitter subpixels 2210 and IR detector subpixels 2610 may include additional insulating layers 310 that are not specifically illustrated. As a specific example, some embodiments of IR emissive layers 2510 may include multiple sub-layers of OLED emission architectures or electroluminescent quantum dot architectures.

Like anode layers 220 and cathode layers 230, anode layers 2520 and cathode layers 2530 are formed, respectively, from any appropriate anode or cathode material. For example, anode layers 2520 and cathode layers 2530 may include simple conductive polymers (or similar materials) used as transparent electrodes. In general, one or both of anode layers 2520 and cathode layers 2530 may be transparent to IR or near-IR wavelengths so that IR light may pass unimpeded to and from IR emissive layers 2510 and IR detector layers 2910. For example, if a layer such as anode layer 2520 is above IR layers 2510 and 2910, all or a portion of the anode layer 2520 may be transparent to one or more wavelengths of IR or near-IR light, but opaque to the visible spectrum. On the other hand, if a layer such as cathode layer 2530 is below IR layer 2510 and 2910, it may not need to be transparent to IR or visible light (i.e., it may be opaque to IR and the visible spectrum), especially if no other subpixels 110 are located above the IR subpixel. However, if the IR subpixel is located above or within a stack of RGB subpixels 110, both anode layers 2520 and cathode layers 2530 may be transparent to visible light, and at least one may be additionally transparent to IR or near-IR light (e.g., the layer above the IR layer in the IR subpixel). In some embodiments, anode layers 220 and cathode layers 230 may be positioned on the edges of IR emitter subpixel 2210 and IR detector subpixel 2610 (i.e., IR light entering subpixel 2210 and IR detector subpixel 2610 does not pass through anode layers 220 and cathode layers 230). In such embodiments, anode layers 220 and cathode layers 230 do not need to be transparent to IR light.

IR emissive layers 2510 generally are formed from any appropriate material capable of emitting IR light while supporting transparency. In some embodiments, IR emissive layers 2510 may include both electroluminescent capabilities (e.g., a diode converting electric current into light) and photoluminescent capabilities (for down-converting incoming higher-energy light to lower-energy wavelengths). For example, IR emissive layers 2510 may be electroluminescent quantum dot (QD) layers such as quantum-dot-based light-emitting diode (QLED) layers. In some embodiments, IR emissive layers 2510 may be organic light-emitting diode (OLED) layers. In general, IR emissive layers 2510 may be precisely tuned for narrow band emission of specific wavelengths of IR light. By using electroluminescent QD IR emissive layers 2510, certain embodiments provide 1) more efficient use of power than other methods such as liquid crystal displays (LCD), and 2) significantly higher contrast ratios than other technologies such as LCD can offer. And because each IR emitter subpixel 2210 is controlled directly by voltage, faster response times are possible than with technologies such as LCD.

IR detector layers 2910 generally are formed from any appropriate material capable of detecting IR light while supporting transparency. For example, IR detector layers 2910 may be tuned color-specific electroluminescent QD layers such as QLED layers. In some embodiments, IR detector layers 2910 may be OLED layers. In some embodiments, IR detector layers 2910 may be precisely tuned for narrow band detection of specific wavelengths of IR light.

In some embodiments, IR emitter subpixels 2210 and IR detector subpixels 2610 have an overall shape of a polygon when viewed from above. For example, IR emitter subpixels 2210 and IR detector subpixels 2610 may be hexagon-shaped, octagon-shaped, or the shape of any other polygon such as a triangle, quadrangle, pentagon, heptagon, and the like. In some embodiments, the top-down shapes of IR emitter subpixels 2210 and IR detector subpixels 2610 may correspond to the top-down shapes of pixels 100 or 1800. For example, if pixel 100 has a top-down shape of a hexagon, the top-down shapes of IR emitter subpixels 2210 and IR detector subpixels 2610 may also be hexagons.

Figure 37A:
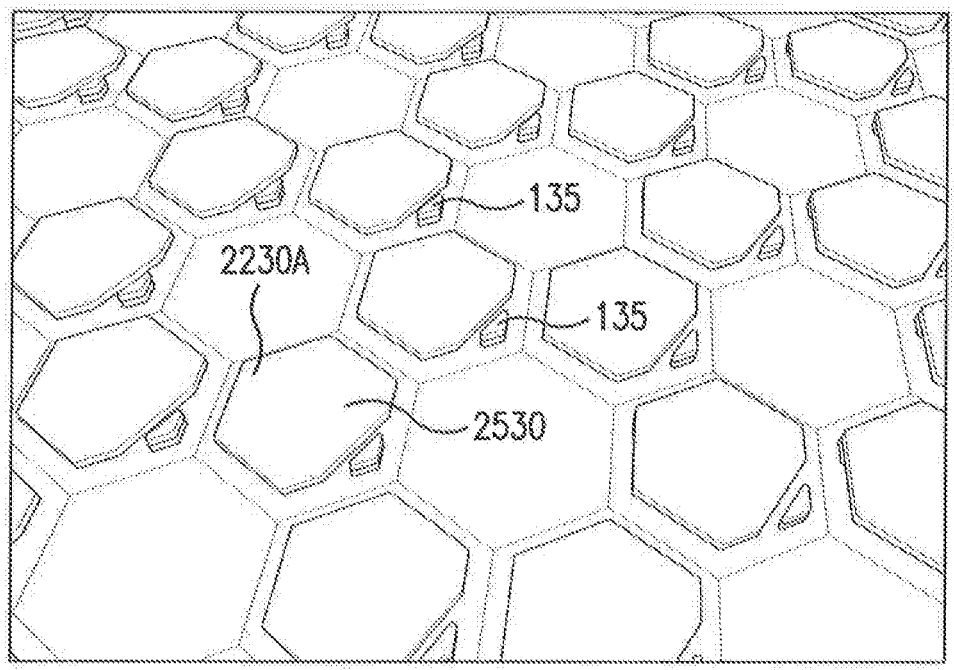
FIGS. 37A and 38A illustrate cathode layers of IR subpixels, according to certain embodiments.
Figure 39A:
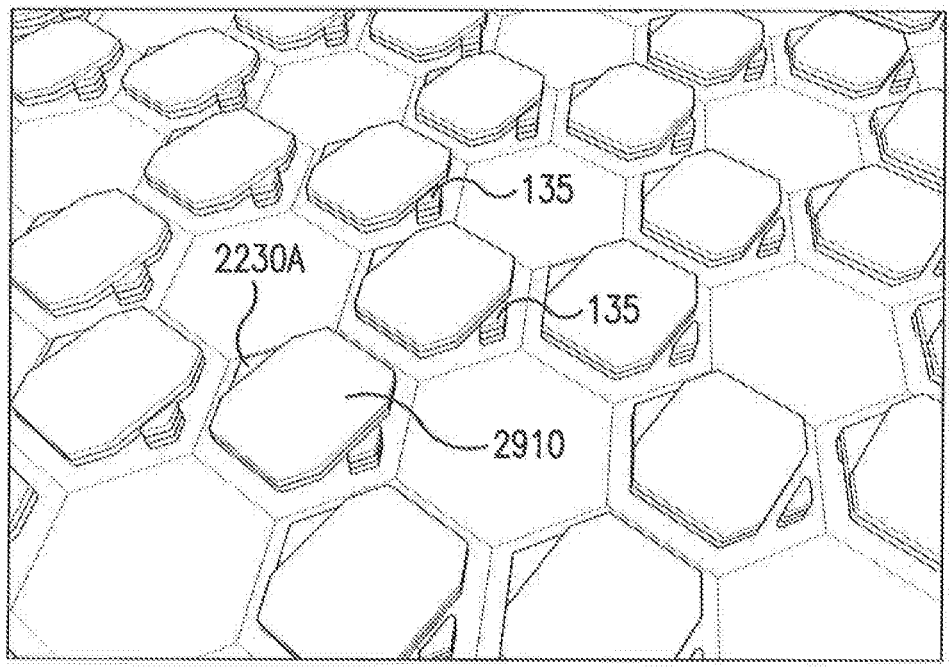
FIGS. 39A and 40A illustrate an IR layer of an IR subpixel, according to certain embodiments.
Figure 40A:
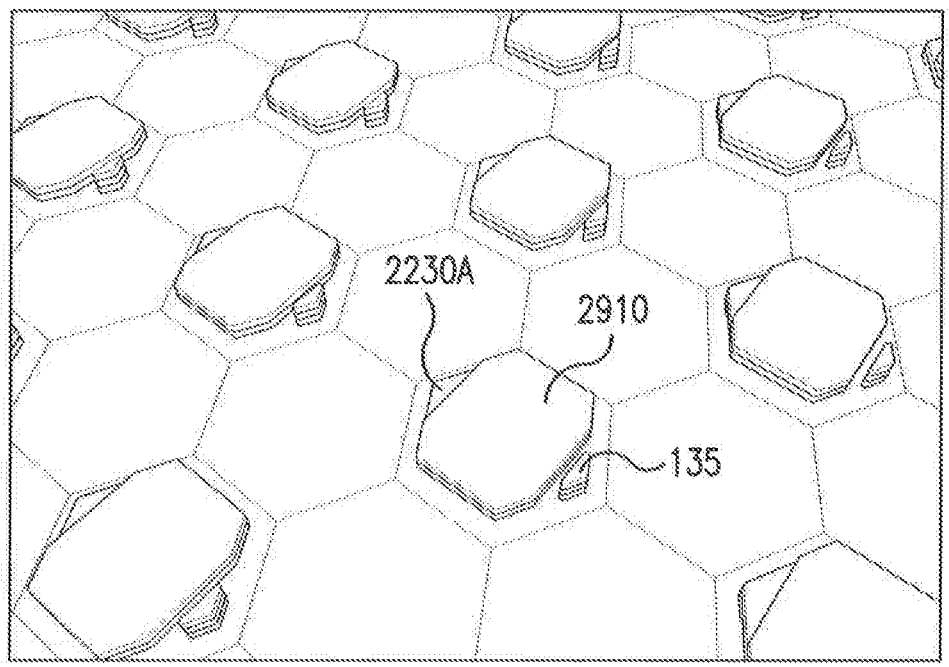
Figure 40B:
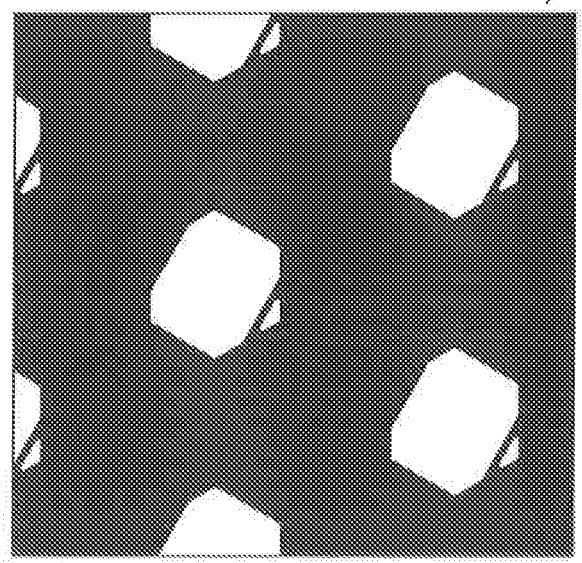
FIG. 40B illustrates a portion of a photomask used to manufacture the IR layer of FIG. 40A, according to certain embodiments.
Figure 41A:
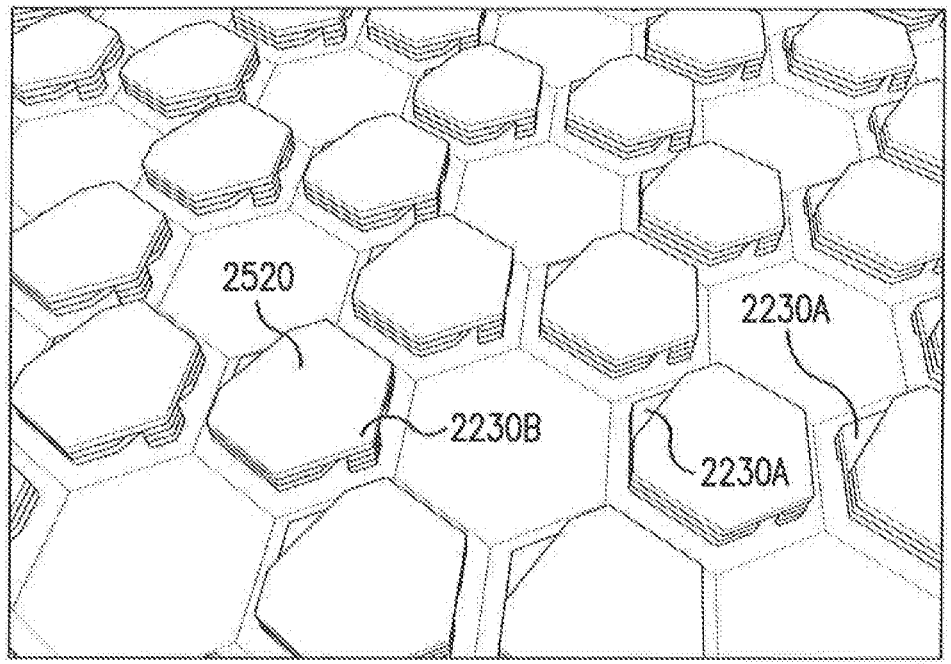
FIGS. 41A and 42A illustrate anode layers of IR subpixels, according to certain embodiments.

In some embodiments, each individual layer of IR emitter subpixel 2210 and IR detector subpixel 2610 has a different top-down shape than the overall top-down shape of IR subpixels 2210 and 2610 in order to accommodate connector columns 2230. In other words, instead of having connector columns 130 on the outside of the overall polygon shape as described above for embodiments of subpixels 110, some embodiments of IR subpixels 2210 and 2610 have cutouts or notches in various layers for connector columns 2230. This is illustrated best in FIGS. 37A-42B. Taking an IR subpixel 2210 or 2610 with an overall top-down shape of a hexagon as an example, each anode layer 2520 and cathode layer 2530 of an individual IR subpixel may have a notch cut out of one side of the hexagon for connector columns 2230, thereby resulting in a main top-down shape of a heptagon (i.e., a seven-sided polygon) as illustrated in FIGS. 37A and 41A. More specifically, cathode layer 2530, which may be a bottom layer in some embodiments, may have a shape as illustrated in FIG. 37A that includes a side of the polygon (e.g., a hexagon) that has been notched in order to form connector column portion 135. In this case, the connector column portion 135 of cathode layer 2530 forms a part of connector column 2230B and enables anode layer 2520 to be electrically coupled to circuitry 120. Similarly, anode layer 2520, which may be a top layer of IR subpixels 2210 and 2610 in some embodiments, may have a shape as illustrated in FIG. 41A that includes a side of the polygon (e.g., a hexagon) that has been removed in order to prevent anode layer 2520 from being coupled to connector column 2230A. As illustrated in these figures, the main shape of anode layer 2520 (i.e., the portion of anode layer 2520 minus connector column portion 135) may be a mirror image of the main shape of cathode layer 2530.

In both anode layer 2520 and cathode layer 2530, the portion of the polygon that is opposite its notched side enables the particular layer to be electrically coupled to circuitry 120 via connector columns 2230. For example, as illustrated in FIG. 37A, the side of the polygon shape of cathode layer 2530 that is opposite its notched side is the portion of cathode layer 2530 that couples it to connector column 2230A in some embodiments. Similarly, as illustrated in FIG. 41A, the side of the polygon shape of anode layer 2520 that is opposite its notched side is the portion of anode layer 2520 that couples it to connector column 2230B in some embodiments. As illustrated in the figures, connector column portions 135 may be utilized on the various layers of IR subpixels 2210 and 2610 in order to couple anode layers 2520 and cathode layers 2530 to circuitry 120.

Figure 39B:
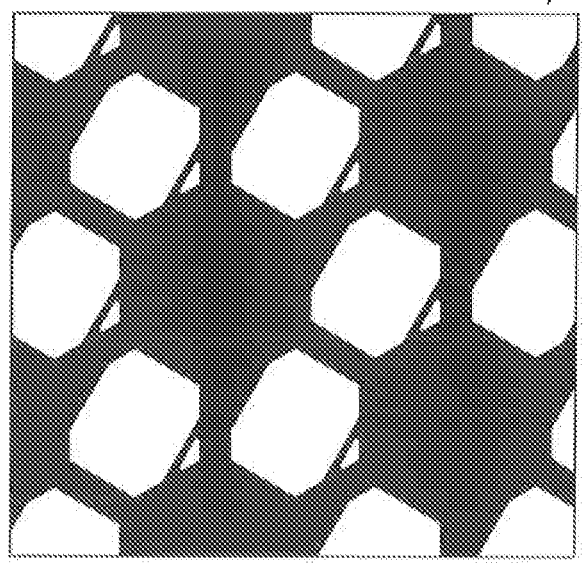
FIG. 39B illustrates a portion of a photomask used to manufacture the IR layer of FIG. 39A, according to certain embodiments.

Similar to anode layers 2520 and cathode layers 2530, each IR layer of IR subpixels 2210 and 2610 (i.e., IR emissive layer 2510 and IR detector layer 2910) has a different top-down shape than the overall top-down shape of IR subpixels 2210 and 2610 in order to accommodate connector columns 2230. For example, some embodiments of IR emissive layer 2510 and IR detector layer 2910 have cutouts or notches on two sides to accommodate both connector columns 2230A and 2230B. This is illustrated best in FIGS. 39A-41B. Taking an IR subpixel 2210 or 2610 with an overall top-down shape of a hexagon as an example, each IR emissive layer 2510 and IR detector layer 2910 of an individual IR subpixel may have a notch cut out of two opposing sides of the hexagon for connector columns 2230A and 2230B, thereby resulting in a top-down main shape of an octagon (i.e., an eight-sided polygon) as illustrated in FIGS. 39BA and 40B. As a specific example, IR detector layer 2910, which may be a middle layer in some embodiments, may have a shape as illustrated in FIG. 39B that includes two opposing sides of the polygon (e.g., a hexagon) that have been notched, and a single connector column portion 135 has been formed beside one of the notches. In this case, the connector column portion 135 of IR detector layer 2910 forms a part of connector column 2230B and enables anode layer 2520 to be electrically coupled to circuitry 120. In some embodiments, connector column portions 135 of IR emissive layer 2510 and IR detector layer 2910 are formed from any appropriate conductive material, and are not formed from the emissive or detector materials of IR emissive layer 2510 and IR detector layer 2910.

Embodiments of IR subpixels 2210 and 2610 may include one or more insulating layers 310, as illustrated in FIGS. 25 and 29. For example, some embodiments of IR subpixels 2210 and 2610 may include a first insulating layer 310 between circuitry 120 and cathode layer 2530, as illustrated in these figures. In embodiments where IR subpixels 2210 and 2610 are either below or above other subpixels 110, such embodiments may include additional insulating layers 310 between subpixels 110 and the IR subpixels 2210 and 2610. Insulating layers 310 may be any appropriate material that electrically isolates adjacent layers of subpixels.

Figure 30:
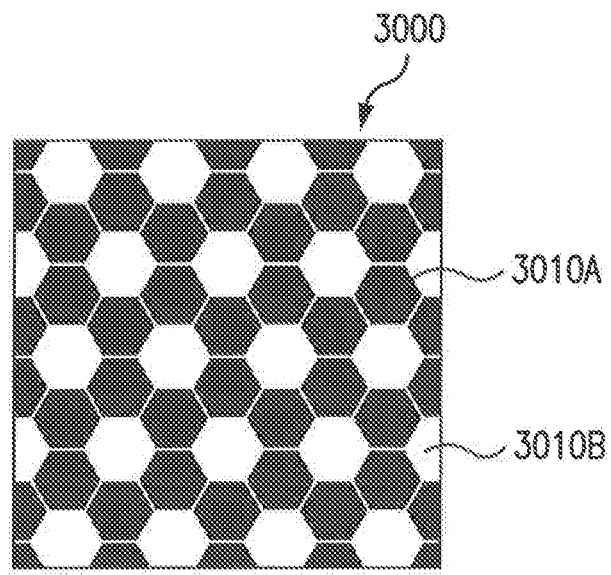
FIGS. 30-33 illustrate arrays of pixel locations of electronic displays, according to certain embodiments.
Figure 31:
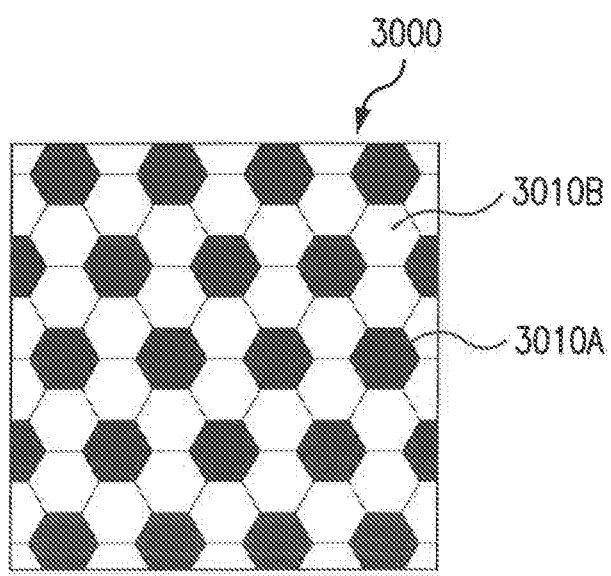
Figure 32:
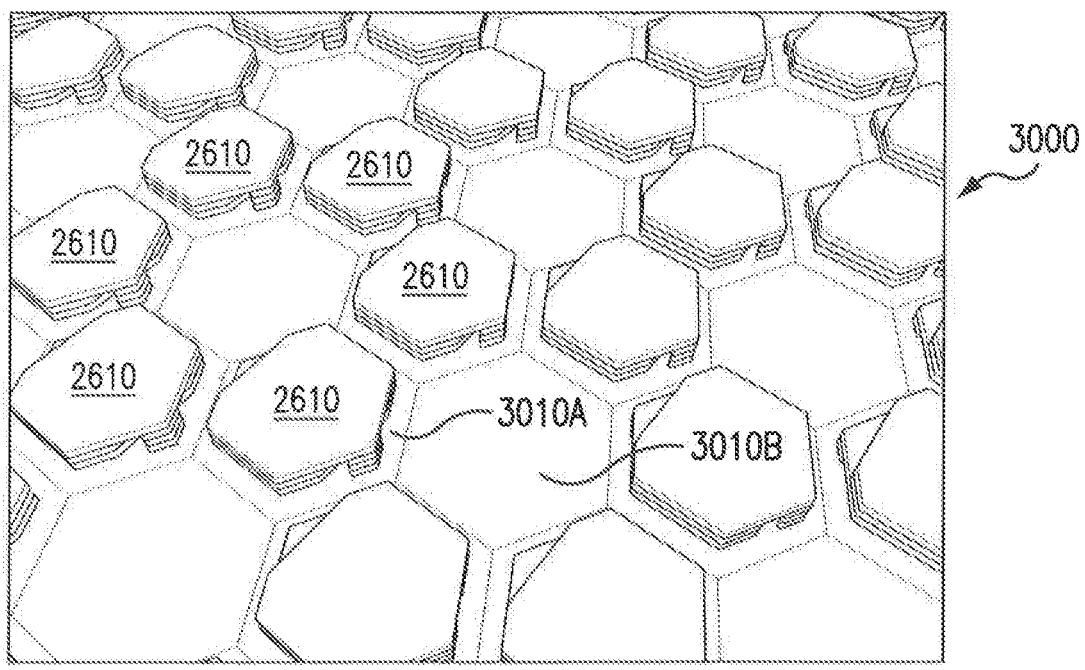
Figure 33:
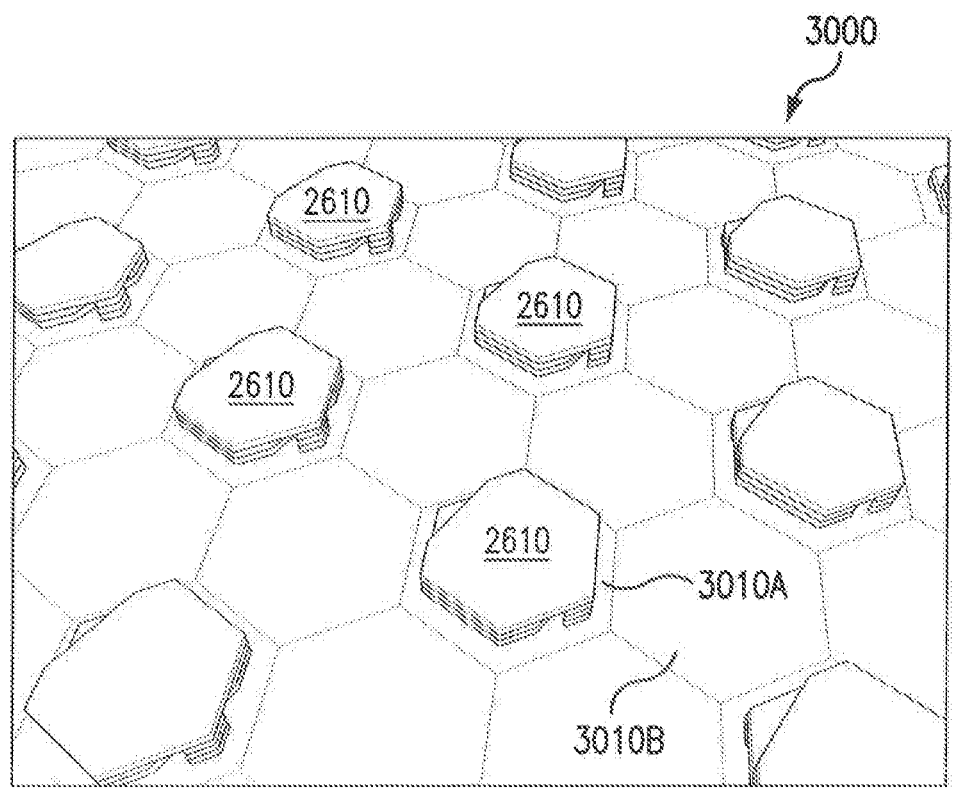

FIGS. 30-33 illustrate various embodiments of an electronic display 3000 having a patterned array of pixel locations 3010. FIG. 30 illustrates a top-down view of one embodiment of electronic display 3000, and FIG. 32 illustrates a perspective view of the electronic display 3000 of FIG. 30. Similarly, FIG. 31 illustrates a top-down view of another embodiment of electronic display 3000, and FIG. 34 illustrates a perspective view of the electronic display 3000 of FIG. 31.

Pixel locations 3010 of electronic display 3000 may be occupied by the various pixels and subpixels described herein. In specific embodiments, pixel locations 3010 may each include either an IR emitter subpixel 2210 or an IR detector subpixel 2610. Any appropriate pattern of IR emitter subpixels 2210 and IR detector subpixels 2610 may be utilized by electronic display 3000. In the example embodiments illustrated in FIGS. 30-33, pixel locations 3010A (i.e., pixel locations 3010 that are shaded in black) may each be occupied by an IR detector subpixel 2610, and pixel locations 3010B (i.e., pixel locations 3010 that are shaded in white) may each be occupied by an IR emitter subpixel 2210 (note that IR emitter subpixels 2210 are not illustrated in pixel locations 3010B in FIGS. 32-33 for clarity). More specifically, in the embodiment illustrated in FIG. 30, each IR emitter subpixel 2210 in pixel locations 3010B is surrounded by six IR detector subpixels 2610 in pixel locations 3010A. Conversely, in the embodiment illustrated in FIG. 31, each IR detector subpixel 2610 in pixel locations 3010A is surrounded by six IR emitter subpixel 2210 in pixel locations 3010B. While specific patterns of IR emitter subpixels 2210 and IR detector subpixels 2610 are illustrated in FIGS. 30-33, any other pattern of IR emitter subpixels 2210 and IR detector subpixels 2610 may be utilized by electronic display 3000 (e.g., horizontal alternating stripes, vertical alternating stripes, etc.).

In some embodiments, IR emitter subpixels 2210 and IR detector subpixels 2610 may be at the corners of electronic display 3000 (i.e., not within pixel locations 3010). For example, some displays may include arrays of electronic displays 3000, and IR subpixels 2210 and 2610 may be located at the intersections of the electronic displays 3000. As a specific example, if electronic displays 3000 are in the shape of a rectangle, IR subpixels 2210 and 2610 may be located at the corners where four electronic displays 3000 meet.

FIG. 34 illustrates a method 3400 of manufacturing an IR subpixel, according to certain embodiments. For example, method 3400 may be used to manufacture IR emitter subpixel 2210 or IR detector subpixel 2610, as described above. Method 3400, in general, utilizes steps 3410-3440 to create layers of an IR subpixel using lithography. The various layers created by these steps and the photomasks that may be utilized to create the various layers are illustrated in FIGS. 35A-42B, wherein the insulating material has been removed from the layers to allow a better view of the structure of conductive elements. FIGS. 35A, 37A, 39A, and 41A correspond to the example pattern illustrated in FIG. 30, and FIGS. 36A, 28A, 40A, and 42A correspond to the example pattern illustrated in FIG. 31.

Figure 35A:
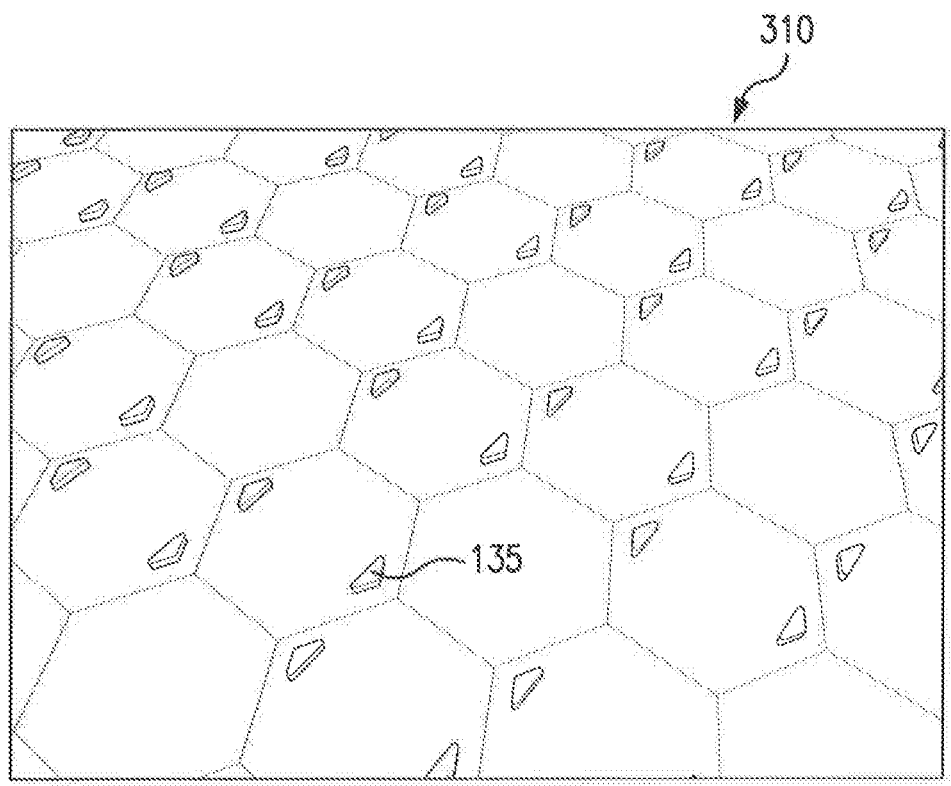
FIGS. 35A and 36A illustrate first insulating layers of IR subpixels, according to certain embodiments.
Figure 35B:
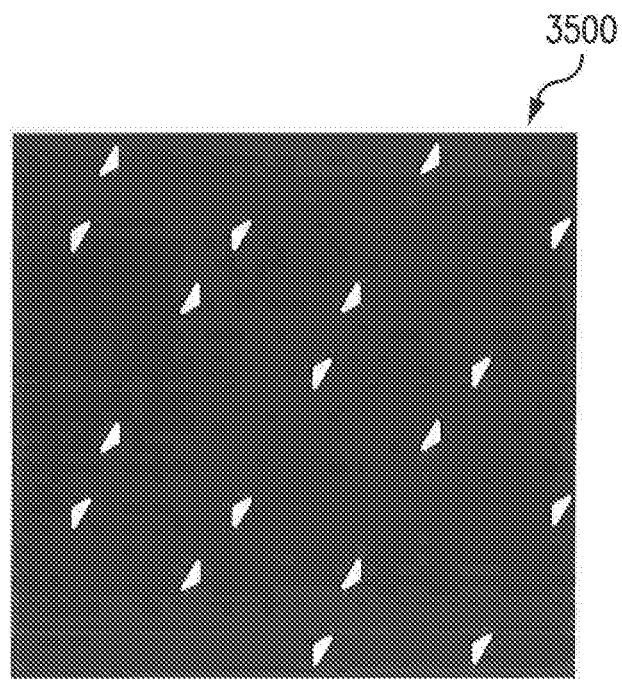
FIG. 35B illustrates a portion of a photomask used to manufacture the first insulating layer of FIG. 35A, according to certain embodiments.
Figure 36A:
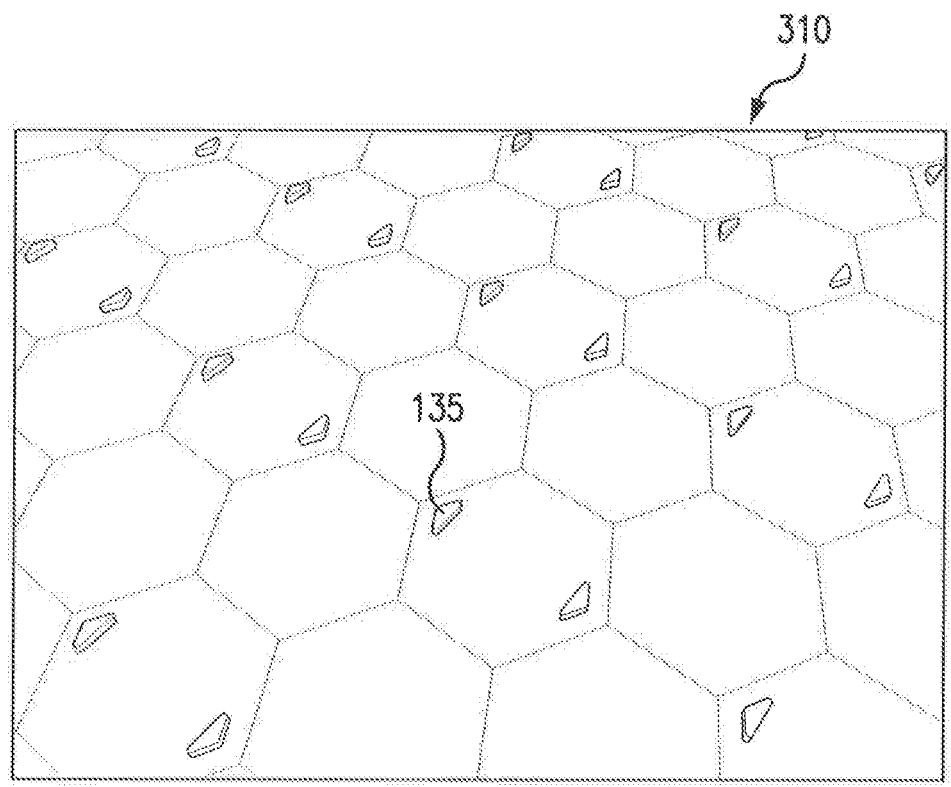
Figure 36B:
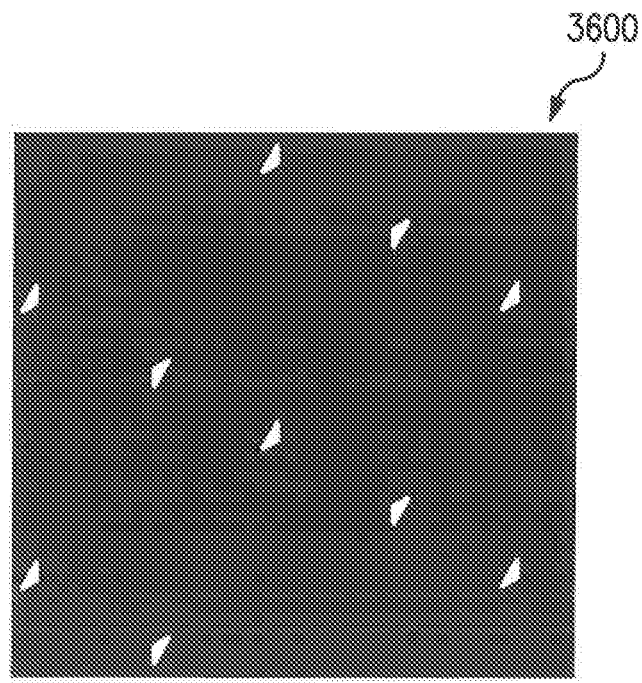
FIG. 36B illustrates a portion of a photomask used to manufacture the first insulating layer of FIG. 36A, according to certain embodiments.

Method 3400 may begin in step 3410 where an insulating layer is created by depositing a layer of insulating material and then patterning the layer of insulating material using lithography. In some embodiments, the insulating layer is insulating layer 310 that is illustrated in FIGS. 35A and 36A. In some embodiments, the insulating layer is a transparent insulating layer (e.g., transparent to visible, IR, or near-IR light). In some embodiments, the layer of insulating material is deposited on a substrate or backplane that includes circuitry 120, as described above. In some embodiments, the layer of insulating material is patterned into the insulating layer using photolithography. A portion of a photomask 3500 that may be utilized by this step to pattern the layer of insulating material into the insulating layer of FIG. 35A is illustrated in FIG. 35B. Likewise, a portion of a photomask 3600 that may be utilized by this step to pattern the layer of insulating material into the insulating layer of FIG. 36A is illustrated in FIG. 36B.

Figure 37B:
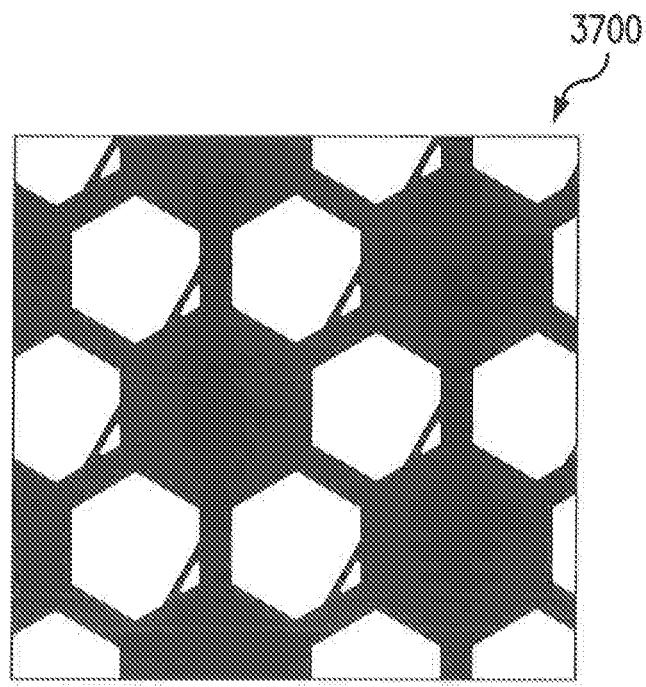
FIG. 37B illustrates a portion of a photomask used to manufacture the cathode layer of FIG. 37A, according to certain embodiments.
Figure 38A:
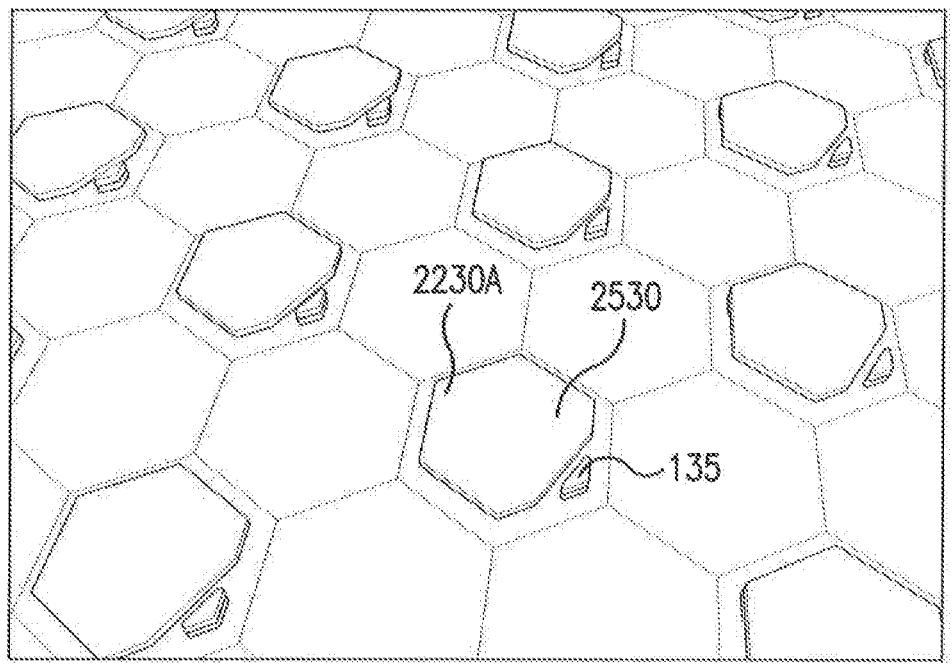
Figure 38B:
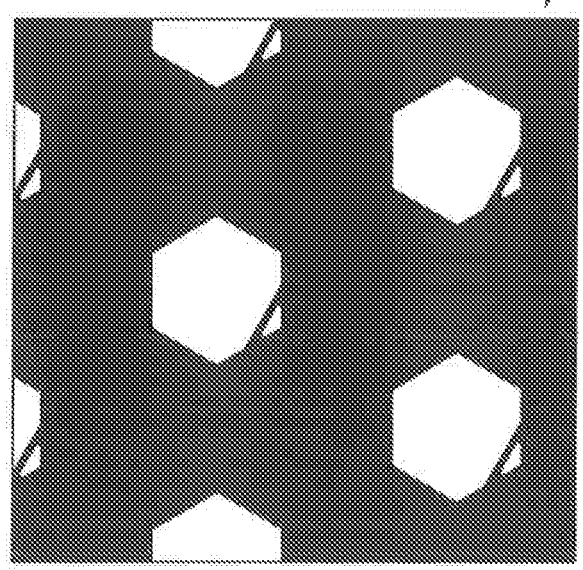
FIG. 38B illustrates a portion of a photomask used to manufacture the cathode layer of FIG. 38A, according to certain embodiments.

At step 3420, a cathode layer of an IR subpixel is created by depositing a layer of conductive material on the patterned insulating layer of step 3410 and then patterning the cathode layer using lithography such as photolithography. In some embodiments, the cathode layer is cathode layer 2530 that is illustrated in FIGS. 37A and 38A. In some embodiments, the cathode layer is a transparent cathode layer (e.g., transparent to visible, IR, or near-IR light). A portion of a photomask 3700 that may be utilized by this step to pattern the layer of conductive material into the cathode layer of FIG. 37A is illustrated in FIG. 37B. Likewise, a portion of a photomask 3800 that may be utilized by this step to pattern the layer of conductive material into the cathode layer of FIG. 38A is illustrated in FIG. 38B. In some embodiments, patterning the cathode layer includes forming a portion of the cathode layer into a polygon shape, such as a hexagon, heptagon, or an octagon. For example, as illustrated in FIG. 37B, the cathode layer of a single IR subpixel may have an overall shape of a hexagon when viewed from above and may include one side of the hexagon that has been partitioned to form a connector column portion 135 (e.g., in the shape of a triangle). As a result, the cathode layer of a single IR subpixel in some embodiments may include a main portion that includes at least seven sides and a disconnected connector column portion 135 in the shape of a tringle. While specific shapes of the cathode layer of a single IR subpixel have been illustrated, any other appropriate shapes may be used.

At step 3430, an IR layer of an IR subpixel is created by depositing a layer of IR emissive material or IR detecting material on the cathode layer of step 3420 and then patterning the IR layer using lithography such as photolithography. More specifically, if the IR subpixel being created by method 3400 is IR detector subpixel 2610, IR detecting material is deposited in this step to create IR detector layer 2910. On the other hand, if the IR subpixel being created by method 3400 is IR emitter subpixel 2210, IR emitting material is deposited in this step to create IR emissive layer 2510. In some embodiments, the IR layer is the IR layer illustrated in FIGS. 39A and 40A. A portion of a photomask 3900 that may be utilized by this step to pattern the layer of IR material into the IR layer of FIG. 39A is illustrated in FIG. 39B. Similarly, a portion of a photomask 4000 that may be utilized by this step to pattern the layer of IR material into the IR layer of FIG. 40A is illustrated in FIG. 40B. In some embodiments, patterning the IR layer includes forming a portion of the IR layer into a polygon shape, such as a hexagon or an octagon. For example, as illustrated in FIG. 39B, the IR layer of a single subpixel of some embodiments may have a main shape of an octagon with a connector column portion 135 proximate to one side of the octagon when viewed from above. While specific shapes of the IR layer of a single IR subpixel have been illustrated, any other appropriate shapes may be used.

Figure 41B:
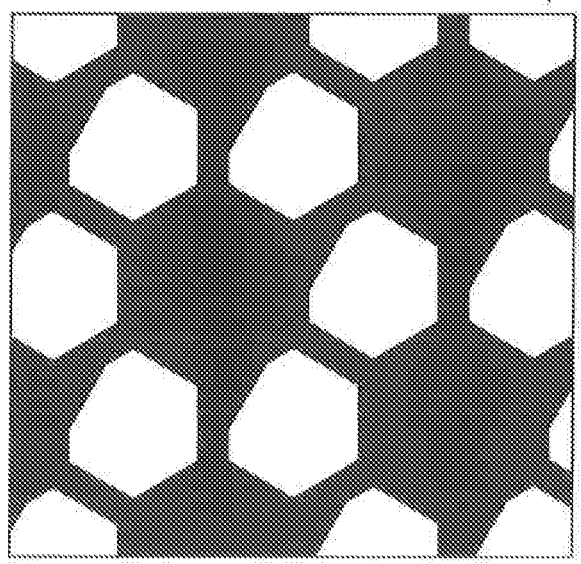
FIG. 41B illustrates a portion of a photomask used to manufacture the anode layer of FIG. 41A, according to certain embodiments.
Figure 42A:
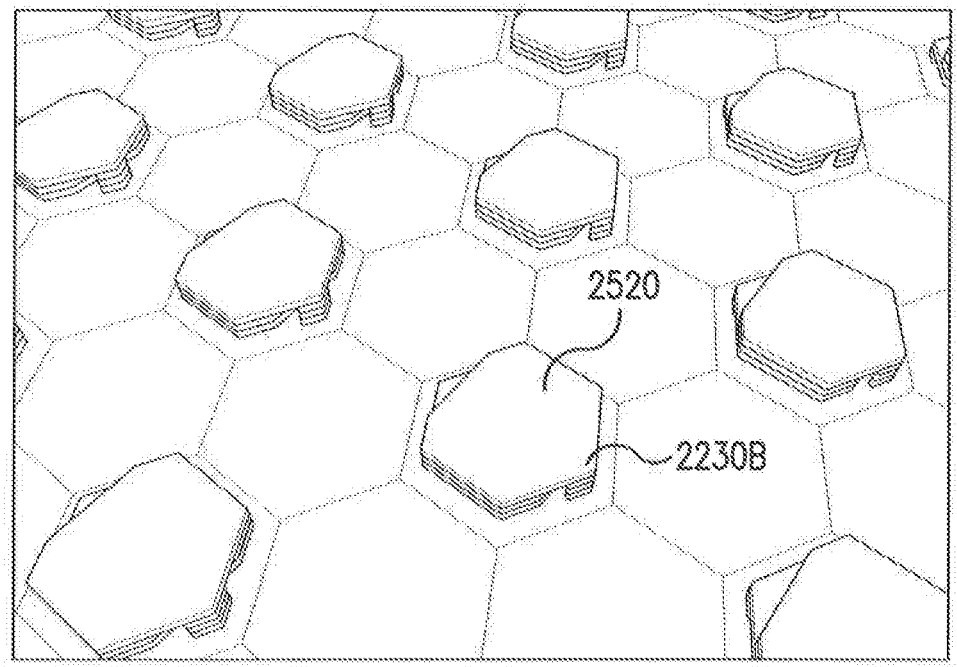
Figure 42B:
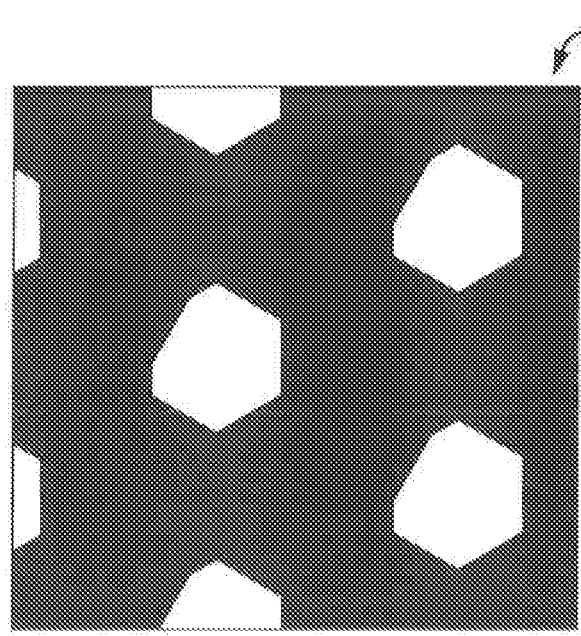
FIG. 42B illustrates a portion of a photomask used to manufacture the anode layer of FIG. 42A, according to certain embodiments.

At step 3440, an anode layer of an IR subpixel is created by depositing a layer of anode material on the patterned IR layer of step 3430 and then patterning the anode layer using lithography such as photolithography. In some embodiments, the anode layer is anode layer 2520 that is illustrated in FIGS. 41A and 42A. In some embodiments, the anode layer is a transparent anode layer (e.g., transparent to visible, IR, or near-IR light). A portion of a photomask 4100 that may be utilized by this step to pattern the layer of anode material into the anode layer of FIG. 41A is illustrated in FIG. 41B. Likewise, a portion of a photomask 4200 that may be utilized by this step to pattern the layer of anode material into the anode layer of FIG. 42A is illustrated in FIG. 42B. In some embodiments, patterning the anode layer includes forming a portion of the anode layer into a polygon shape, such as a hexagon, heptagon, or an octagon. For example, as illustrated in FIG. 41B, the anode layer of a single IR subpixel may have an overall shape of a hexagon when viewed from above and may include one side of the hexagon that has been partitioned to form a connector column portion 135 (e.g., in the shape of a triangle). As a result, the anode layer of a single IR subpixel in some embodiments may include a main portion that includes at least seven sides and a disconnected connector column portion 135 in the shape of a tringle. While specific shapes of the cathode layer of a single IR subpixel have been illustrated, any other appropriate shapes may be used.

In some embodiments, method 3400 may include forming additional layers that are not specifically illustrated in FIG. 34. For example, additional layers such as insulating layers 310 may be formed by method 3400 at any appropriate location. As another example, some embodiments may include one or more additional layers of graphene or other similar electrically-enhancing materials in order to improve efficiency and conductivity. As yet another example, some embodiments may include forming or adding a micro-lens layer above the topmost layer of the IR subpixel to further direct IR light emission and detection.

In some embodiments, method 3400 may be modified to form the IR layer of the IR subpixel of step 3420 on an anode layer instead of a cathode layer. More specifically, an anode layer of the IR subpixel may be formed in step 3420, the IR layer of the IR subpixel may be formed on the anode layer in step 3430, and a cathode layer may be formed on the IR layer in step 3440.

Particular embodiments may repeat one or more steps of the method of FIG. 34, where appropriate. Although this disclosure describes and illustrates particular steps of the method of FIG. 34 as occurring in a particular order, this disclosure contemplates any suitable steps of the method of FIG. 34 occurring in any suitable order. Moreover, although this disclosure describes and illustrates an example method for forming an IR subpixel including the particular steps of the method of FIG. 34, this disclosure contemplates any suitable method for forming an IR subpixel including any suitable steps, which may include all, some, or none of the steps of the method of FIG. 34, where appropriate. Furthermore, although this disclosure describes and illustrates particular components, devices, or systems carrying out particular steps of the method of FIG. 34, this disclosure contemplates any suitable combination of any suitable components, devices, or systems carrying out any suitable steps of the method of FIG. 34.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

Herein, the phrase "on top" when used to describe subpixels 110, 2210, and 2610 and their various layers (e.g., layers 210, 220, and 230) refers to a viewing direction for display pixels 100 and a light entry direction for sensor pixels 1800. As an example, subpixel 110B of display pixel 100 is described as being stacked "on top" of subpixel 110A. As illustrated in FIGS. 2-3, "on top" means that subpixel 110B is on the side of subpixel 110A that is towards the location that the combined light that is emitted from display pixel 100 may be viewed. Stated another way, subpixel 110B is on the opposite side of subpixel 110A from circuitry 120. As another example, subpixel 110C of sensor pixel 1800 is described as being stacked "on top" of subpixel 110B. As illustrated in FIGS. 19-20, "on top" means that subpixel 110C is on the side of subpixel 110B that is towards the location that the full spectrum light enters sensor pixel 1800.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

Although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method of manufacturing an IR subpixel for an electronic display, the method comprising:
creating an insulating layer by depositing a layer of insulating material and then patterning the layer of insulating material using lithography;
creating a cathode layer of the IR subpixel by depositing a layer of conductive material on the patterned insulating layer and then patterning the cathode layer using lithography, wherein patterning the cathode layer comprises forming a portion of the cathode layer into a polygon shape;
creating an IR layer of the IR subpixel by depositing a layer of IR emissive or IR detecting material on the patterned cathode layer and then patterning the IR layer using lithography, wherein patterning the IR layer comprises forming a portion of the IR layer into the polygon shape; and creating an anode layer of the IR subpixel by depositing a layer of anode material on the patterned IR layer and then patterning the anode layer using lithography, wherein patterning the anode layer comprises forming a portion of the anode layer into the polygon shape.

2. The method of manufacturing an IR subpixel for an electronic display of claim 1, wherein the lithography comprises photolithography.

3. The method of manufacturing an IR subpixel for an electronic display of claim 1, wherein the polygon shape comprises a hexagon, an octagon, a triangle, or a quadrangle.

4. The method of manufacturing an IR subpixel for an electronic display of claim 1, wherein the IR emissive or IR detecting material comprises a quantum dot photoelectric material, an organic light-emitting diode (OLED) material, or a quantum-dot-based light-emitting diode (QLED) material.

5. The method of manufacturing an IR subpixel for an electronic display of claim 1, wherein:

patterning the cathode layer further comprises forming a portion of a first connection column proximate to one side of the polygon shape of the cathode layer; and patterning the anode layer further comprises forming a portion of a second connection column proximate to one side of the polygon shape of the anode layer.

6. A method of manufacturing, the method comprising:

depositing a layer of conductive material on a layer of insulating material to create a cathode layer;

patterning the cathode layer to create a patterned cathode layer, wherein patterning the cathode layer comprises forming a portion of the cathode layer into a polygon shape;

depositing a layer of IR emissive material on the patterned cathode layer to create an IR layer of an IR subpixel;

patterning the IR layer to create a patterned IR layer, wherein patterning the IR layer comprises forming a portion of the IR layer into the polygon shape;

depositing a layer of anode material on the patterned IR layer to create an anode layer of the IR subpixel;

patterning the anode layer to create a patterned anode layer, wherein patterning the anode layer comprises forming a portion of the anode layer into the polygon shape.

7. The method of manufacturing of claim 6, wherein patterning the cathode layer, the IR layer, and the anode layer comprises using photolithography.

8. The method of manufacturing of claim 6, wherein the polygon shape comprises a hexagon, an octagon, a triangle, or a quadrangle.

9. The method of manufacturing of claim 6, wherein the IR emissive material comprises a quantum dot photoelectric material, an organic light-emitting diode (OLED) material, or a quantum-dot-based light-emitting diode (QLED) material.

10. The method of manufacturing of claim 6, wherein:

patterning the cathode layer further comprises forming a portion of a first connection column proximate to one side of the polygon shape of the cathode layer; and patterning the anode layer further comprises forming a portion of a second connection column proximate to one side of the polygon shape of the anode layer.

11. A method of manufacturing, the method comprising:

depositing a layer of conductive material on a layer of insulating material to create a cathode layer;

patterning the cathode layer to create a patterned cathode layer, wherein patterning the cathode layer comprises forming a portion of the cathode layer into a polygon shape;

depositing a layer of IR detecting material on the patterned cathode layer to create an IR layer of an IR subpixel;

patterning the IR layer to create a patterned IR layer, wherein patterning the IR layer comprises forming a portion of the IR layer into the polygon shape;

depositing a layer of anode material on the patterned IR layer to create an anode layer of the IR subpixel;

patterning the anode layer to create a patterned anode layer, wherein patterning the anode layer comprises forming a portion of the anode layer into the polygon shape.

12. The method of manufacturing of claim 11, wherein patterning the cathode layer, the IR layer, and the anode layer comprises using photolithography.

13. The method of manufacturing of claim 11, wherein the polygon shape comprises a hexagon, an octagon, a triangle, or a quadrangle.

14. The method of manufacturing of claim 11, wherein the IR detecting material comprises a quantum dot photoelectric material, an organic light-emitting diode (OLED) material, or a quantum-dot-based light-emitting diode (QLED) material.

15. The method of manufacturing of claim 11, wherein:

patterning the cathode layer further comprises forming a portion of a first connection column proximate to one side of the polygon shape of the cathode layer; and patterning the anode layer further comprises forming a portion of a second connection column proximate to one side of the polygon shape of the anode layer.

* * * * *